(12) United States Patent
Noboru et al.

(10) Patent No.: US 7,155,188 B2
(45) Date of Patent: Dec. 26, 2006

(54) INTEGRATED CIRCUIT AND RECEIVING DEVICE

(75) Inventors: Mitsuhiro Noboru, Nara (JP); Hiroshi Isoda, Nara (JP); Shinji Amano, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 408 days.

(21) Appl. No.: 10/255,956

(22) Filed: Sep. 27, 2002

(65) Prior Publication Data

US 2003/0060177 A1    Mar. 27, 2003

(30) Foreign Application Priority Data

Sep. 27, 2001   (JP)   ............... 2001-298201

(51) Int. Cl.
 *H04B 1/06*  (2006.01)
 *H04B 7/12*  (2006.01)
 *H04B 7/00*  (2006.01)
 *H04B 1/28*  (2006.01)

(52) U.S. Cl. .............. 455/255; 455/260; 455/141; 455/277.1; 455/333; 331/18; 331/1 R; 331/2

(58) Field of Classification Search ............ 455/260, 455/261, 255, 269, 277.1, 310, 311, 318, 455/323, 333, 374, 115.2, 115.1, 130, 141, 455/136, 144.1
See application file for complete search history.

(56) References Cited

U.S. PATENT DOCUMENTS

| 4,524,389 | A | * | 6/1985 | Isobe et al. ............... 348/725 |
| 5,036,216 | A | * | 7/1991 | Hohmann et al. ......... 327/157 |
| 5,389,898 | A | * | 2/1995 | Taketoshi et al. .............. 331/2 |
| 5,686,864 | A |   | 11/1997 | Martin et al. |
| 6,512,801 | B1 | * | 1/2003 | Ninomiya .................. 375/316 |
| 2002/0001361 | A1 | * | 1/2002 | Ueno et al. ................. 375/376 |

FOREIGN PATENT DOCUMENTS

| EP | 0 825 714 A | 2/1998 |
| EP | 1 115 206 A | 7/2001 |
| GB | 2 339 351 A | 1/2000 |
| JP | 08-149000 | 6/1996 |
| JP | 11-340862 | 12/1999 |
| JP | 11-514511 | 12/1999 |
| JP | 3250796/2000 | 11/2001 |
| WO | WO 01/58018 A | 8/2001 |

OTHER PUBLICATIONS

"A Fully Integrated Broadband Direct-Conversion Receiver for DBS Applications" (ISSCC 2000/Session 8/Wireless RX/TX/ Paper TA 8.2, Feb. 8, 2000, pp. 104, 105, 140, 141 and 417).

* cited by examiner

*Primary Examiner*—Nguyen T. Vo
*Assistant Examiner*—Thuan T. Nguyen
(74) *Attorney, Agent, or Firm*—Birch, Stewart, Kolasch & Birch, LLP

(57) ABSTRACT

Dispersing directions of oscillation frequency variable ranges of all voltage controlled oscillators provided in an integrated circuit are uniformed, and not only a range covering a frequency regardless of whether a dispersion occurs or not, but also a range covering the frequency only in a case where the dispersion occurs is used as the frequency variable range of the voltage controlled oscillator, and the frequency variable ranges of the voltage controlled oscillators are set so as to be successive with respect to each other, so that a small number of voltage controlled oscillators can cover a wide frequency variable range. Thus, the integrated circuit having voltage controlled oscillators therein is miniaturized.

19 Claims, 46 Drawing Sheets

FIG. 30

| BAND | f1 | f2 | f2' | f3 | f4 | f5 | f5' | f6 | f7 |
|---|---|---|---|---|---|---|---|---|---|
| VCO(n+1) | ○ | ○ | ○ | × | × | × | × | × | × |
| VCOn | × | ○ | ○ | ○ | ○ | ○ | ○ | × | × |
| VCO(n-1) | × | × | × | × | × | ○ | ○ | ○ | ○ |
| | VCO(n+1) | VCO(n+1) | VCO(n+1) | VCOn | VCOn | VCOn | VCOn | VCO(n-1) | VCO(n-1) |

FIG. 44

| FREQUENCY VARIABLE RANGE | Block | PLL AND VCO SETTING | | | | | | | | | | |
|---|---|---|---|---|---|---|---|---|---|---|---|---|
| | | FREQUENCY DIVISION | BA2 | BA1 | BA0 | VCO1 | VCO2 | VCO3 | VCO4 | VCO5 | VCO6 | VCO7 |
| 950~975 MHz | VCO5 | 1/4 | 1 | 0 | 1 | 1 | 1 | 1 | 1 | 0 | 1 | 1 |
| 975~1065 MHz | VCO6 | 1/4 | 1 | 1 | 0 | 1 | 1 | 1 | 1 | 1 | 0 | 1 |
| 1065~1170 MHz | VCO7 | 1/4 | 1 | 1 | 1 | 1 | 1 | 1 | 1 | 1 | 1 | 0 |
| 1170~1300 MHz | VCO1 | 1/2 | 0 | 0 | 0 | 0 | 1 | 1 | 1 | 1 | 1 | 1 |
| 1300~1450 MHz | VCO2 | 1/2 | 0 | 1 | 1 | 1 | 0 | 1 | 1 | 1 | 1 | 1 |
| 1450~1600 MHz | VCO3 | 1/2 | 0 | 1 | 0 | 1 | 1 | 0 | 1 | 1 | 1 | 1 |
| 1600~1750 MHz | VCO4 | 1/2 | 1 | 0 | 1 | 1 | 1 | 1 | 0 | 1 | 1 | 1 |
| 1750~1950 MHz | VCO5 | 1/2 | 1 | 0 | 0 | 1 | 1 | 1 | 1 | 0 | 1 | 1 |
| 1950~2130 MHz | VCO6 | 1/2 | 1 | 1 | 1 | 1 | 1 | 1 | 1 | 1 | 0 | 1 |
| 2130~2150 MHz | VCO7 | 1/2 | 1 | 1 | 1 | 1 | 1 | 1 | 1 | 1 | 1 | 0 |

FIG. 45

| UP | DOWN | BAND1 | BAND2 | BAND3 | BAND4 | BAND5 | BAND6 | BAND7 | BAND8 | BAND9 | BAND10 |
|---|---|---|---|---|---|---|---|---|---|---|---|
| 0 | 0 | VCO5 | VCO6 | VCO7 | VCO1 | VCO2 | VCO3 | VCO4 | VCO5 | VCO6 | VCO7 |
| 1 | 0 | VCO6 | VCO7 | VCO1 | VCO2 | VCO3 | VCO4 | VCO5 | VCO6 | VCO7 | VCO7 |
| 0 | 1 | VCO5 | VCO5 | VCO6 | VCO7 | VCO1 | VCO2 | VCO3 | VCO4 | VCO5 | VCO6 |

INTEGRATED CIRCUIT AND RECEIVING DEVICE

This nonprovisional application claims priority under 35 U.S.C. 119(a) on Patent Application No. 2001-298201 filed in Japan on Sep. 27, 2001, which is herein incorporated by reference.

FIELD OF THE INVENTION

The present invention relates to an integrated circuit in which an oscillation circuit for oscillating at a successively wide frequency range is provided, and to a receiving device, using the same, that is used particularly as a satellite broadcast receiving device, a ground wave television broadcast receiving device, and a cable television (CATV) broadcast receiving device.

BACKGROUND OF THE INVENTION

In television broadcast such as satellite broadcast, ground wave broadcast, cable television (CATV), a wide frequency range is used. For example, an input frequency of a satellite broadcast tuner (indoor receiving device) ranges from 950 MHz to 2150 MHz, and an input frequency used in the cable television broadcast ranges from 52 MHz to 864 MHz. In the ground wave television broadcast, a frequency band similar to the cable television broadcast is used. This is based on the following reasons: a wide frequency is required in sending a television signal which has large information, and many programs are transmitted by using many channels so that a viewer can make a selection from many channels.

In a receiving device for receiving broadcast by using the wide frequency range, a circuit block (tuner, front end) which processes an antenna signal input converts a frequency used in the broadcast to a specific frequency (intermediate frequency)(in CATV, there is a case where conversion is performed twice). The received signal that has been converted into the intermediate frequency is subjected to a signal process such as amplification, filter, and modulation, so that images and voice signals are obtained. Upon converting the received signal, a local oscillation signal is required in a receiver.

In a front end of the receiver, a circuit block called a mixer performs frequency conversion. In the mixer, product of an input signal $A\sin \omega_{RF}$ by a local oscillating signal $B\sin \omega_{LO}$ is outputted. An output Y of the mixer is as follows.

$$Y = kAB\sin \omega_{RF} \sin \omega_{RO}$$
$$= kAB\{0.5\sin(\omega_{RF} + \omega_{LO}) + 0.5\sin(\omega_{RF} - \omega_{LO})\}$$

Here, k is a proportionally constant.

This expression shows that: it is possible to obtain a frequency component of a difference between the input signal frequency and the local oscillation frequency in accordance with the output of the mixer, so that it is possible to perform the frequency conversion.

In a case of a digital satellite broadcast, a zero frequency is used as the intermediate frequency (direct conversion mode). The local oscillation frequency in this case is required to range from 950 MHz to 2150 MHz as in a receiving frequency. Further, frequency conversion is performed at two oscillation frequencies having 90 degree phase difference so that original information is retained even though the local oscillation frequency is converted to a zero frequency. Then, the two outputs signals are used (they are called "base band signals").

In the cable television broadcast, a preferable distortion characteristic is required because broadcast is performed by using extremely large number of channels. Therefore, it is general to use a mode in which the frequency conversion is performed twice (direct conversion mode). At the first frequency conversion, a receiving frequency is converted to an intermediate frequency higher than the receiving frequency. Supposing that the intermediate frequency is 1000 MHz, a local oscillation frequency required in this case ranges from 1052 MHz to 1864 MHz.

A local oscillation circuit for generating the local oscillation frequency is required not only to provide a wider oscillation frequency range, but also to stabilize the frequency with respect to variation of a temperature or a power source voltage. Further, in a case of receiving the digital broadcast, it is necessary that a phase noise is preferable.

In order to satisfy these conditions, it is general to use an LC oscillation circuit containing a resonant circuit constituted of an inductor (L) and a capacitor (C). It is general to use a diode (vari cap diode, Variable Capacity, VC), whose capacitance is varied by a voltage between terminals, so as to vary the frequency. Thus, it is possible to obtain the oscillation circuit whose frequency is varied by a voltage. This is called "VCO" (Voltage Controlled Oscillator) in general.

Supposing that the inductance of the resonant circuit is L (H) and the capacitance of the resonant circuit is C (F), the oscillation frequency (resonant frequency) shown as oscillation frequency fo (Hz) of the LC oscillation circuit is determined in accordance with the following expression.

$$fo = 1/\{2\pi\sqrt{(LC)}\}$$

Further, supposing that (a) an oscillation frequency in a case where capacitance C is Cmax (maximum value of C) is "fomin" and (b) an oscillation frequency in a case where capacitance C is Cmin (minimum value of C) is "fomax", it is possible to obtain a relationship expressed as follows.

$$fo\text{max}/fo\text{min} = \sqrt{(C\text{max}/C\text{min})}$$

That is, as a variable range of the frequency, a ratio between the maximum frequency and the minimum frequency (capacitance variation ratio) is identical with a square root of a ratio between the maximum value and the minimum value of the resonant circuit. As the ratio between the maximum frequency and the minimum frequency is larger, it becomes more difficult to realize such circuit. From the view point of the aforementioned example, the following setting is required: in a digital satellite broadcast tuner, 2150/950=2.26, and in a cable television tuner, 1864/1052=1.77.

In a conventional technique, a vari cap diode whose capacitance variation ratio is large is used so as to obtain these frequency variable ranges. Further, a voltage up to 30V is applied to the vari cap diode so as to obtain the capacitance variation ratio. In a case where a required variable range cannot be obtained, the inductor of the resonant circuit is switched, or a plurality of VCOs are provided so as to be switched.

As to precision in processing an integrated circuit, miniaturization has been promoted year by year, and a frequency characteristic of a transistor continues to advance. The frequency characteristic of the transistor is shown as a cut off frequency fT. The ft is required to be not less than 10 times as large as a frequency actually used. The ft of a transistor manufactured in accordance with recent bipolar, BiCMOS, RFCMOS processes is over 20 GHz. This characteristic is sufficient to manufacture a receiver front end of a television broadcast such as the satellite broadcast in accordance with these IC processes. Thus, development is promoted with respect to a receiver front end for a television broadcast, such as the satellite broadcast, bringing about a large market, so as to realize the receiver front end by using an IC. Particularly in a case of using an IC in which high frequency portions are entirely integrated, a relatively large front end module which is covered by a conventional metal case is replaced with the IC, so that this contributes to miniaturization and cost reduction of a broadcast receiver.

In realizing such high frequency IC, it is important to realize a VCO having a wide frequency range at a low cost as much as possible. This is because there occur the following problems.

(a) The capacitance variation ratio of a vari cap element which can be realized by using the IC is small.
(b) Q of an inductor which can be realized by using the IC is low.
(c) An area of the inductor which can be realized by using the IC is relatively large, so that this influences a price.
(d) There occurs a dispersion in the frequency due to dispersion in the IC process.

SUMMARY OF THE INVENTION

The object of the present invention is to provide an integrated circuit and a receiving device such that: an entire body can miniaturized by providing VCOs in an IC, and even if a dispersion in the frequency is brought about by a dispersion in an IC process, a small number of VCOs can cover a wide frequency range, and this realizes miniaturization of the integrated circuit and the receiving device.

In order to achieve the foregoing object, the integrated circuit of the present invention is such that: by providing all voltage controlled oscillators in the integrated circuit in accordance with a same process, frequency variable ranges of the voltage controlled oscillators disperse in a same direction, and both a range covering a frequency regardless of whether dispersion occurs or not and a range covering the frequency only in a case where the dispersion occurs are used as the frequency variable ranges of the voltage controlled oscillators, and the frequency variable ranges of the voltage controlled oscillators are set so as to be successive with respect to each other.

(a) According to the arrangement, the VCOs are provided in the IC. Therefore, it is possible to miniaturize the entire body having the IC and VCOs.

(b) Further, all the VCOs are provided in the IC by using the same process. As a result, considering a process dispersion brought about in forming respective VCO elements as a parameter in advance, an element to be manufactured (VCO) is designed while simulating a characteristic of the VCO, so that it is possible to control characteristics of all the VCOs in a substantially uniformed manner.

Thus, it is possible to uniform dispersing directions of the frequency variable ranges of the VCOs provided in the IC.

Here, in accordance with the advantage that it is possible to uniform dispersing directions of the frequency variable ranges of the VCOs provided in the IC, not a range unchangingly covering a certain frequency even if the dispersion occurs, but both a range covering a frequency regardless of whether the dispersion occurs or not and a range covering the frequency only in a case where the dispersion occurs are used.

Note that, this means that: if an end of a range is to be used, all the ranges are used.

In this case, the frequency variable ranges of the VCOs are set so as to be successive with respect to each other. If the frequency variable range of the VCO that covers a lower frequency variable range disperses in the lower frequency side and the frequency variable range of the VCO that covers a higher frequency variable range disperses in the higher frequency side, a large number of VCOs are required so as to maintain the succession. In the present arrangement, the dispersing directions (direction in which the frequency becomes higher or lower) of the frequency variable ranges of all the VCOs are uniformed as described above, so that a large number of VCOs are not required in maintaining the succession.

Note that, the frequency variable ranges are successively set as follows: for example, when the VCOs are provided in the IC, values of a variable capacitance element and an inductor are diversely selected while using techniques such as simulation, so as to confirm that obtained frequency variable ranges are successive with respect to each other.

Therefore, even if the dispersion in the frequency is brought about by a dispersion in the IC process, a small number of VCOs can cover a wide frequency variable range. As a result, it is possible to further miniaturize the integrated circuit.

The VCO provided in the present arrangement can be used to generate a local oscillation signal required when a signal such as broadcast radio wave is received so as to convert a frequency of the received signal into a specific frequency (intermediate frequency).

Further, other than this, it is possible to widely use the VCO in a case where an oscillation frequency of a wide frequency range is desired.

Further, the receiving device of the present invention has the integrated circuit therein, and a voltage controlled oscillator provided in the integrated circuit is used so as to generate a local oscillation signal required in converting a frequency of a received signal into a specific intermediate frequency.

Thus, it is possible to realize a high frequency IC of a low price.

For example, as to the receiving device of the present invention, a PLL and the VCO can be provided in a satellite broadcast receiving direct conversion reception integrated circuit.

For a fuller understanding of the nature and advantages of the invention, reference should be made to the ensuing detailed description taken in conjunction with the accompanying drawings.

BRIEF DESCRIPTION OF THE DRAWINGS

FIG. 30 is a diagram showing how the VCO is selected.

FIG. 44 is a diagram showing how the VCO is selected.

FIG. 45 is a diagram showing how the VCO is selected.

DESCRIPTION OF THE EMBODIMENTS

[Embodiment 1]

Figure 5:
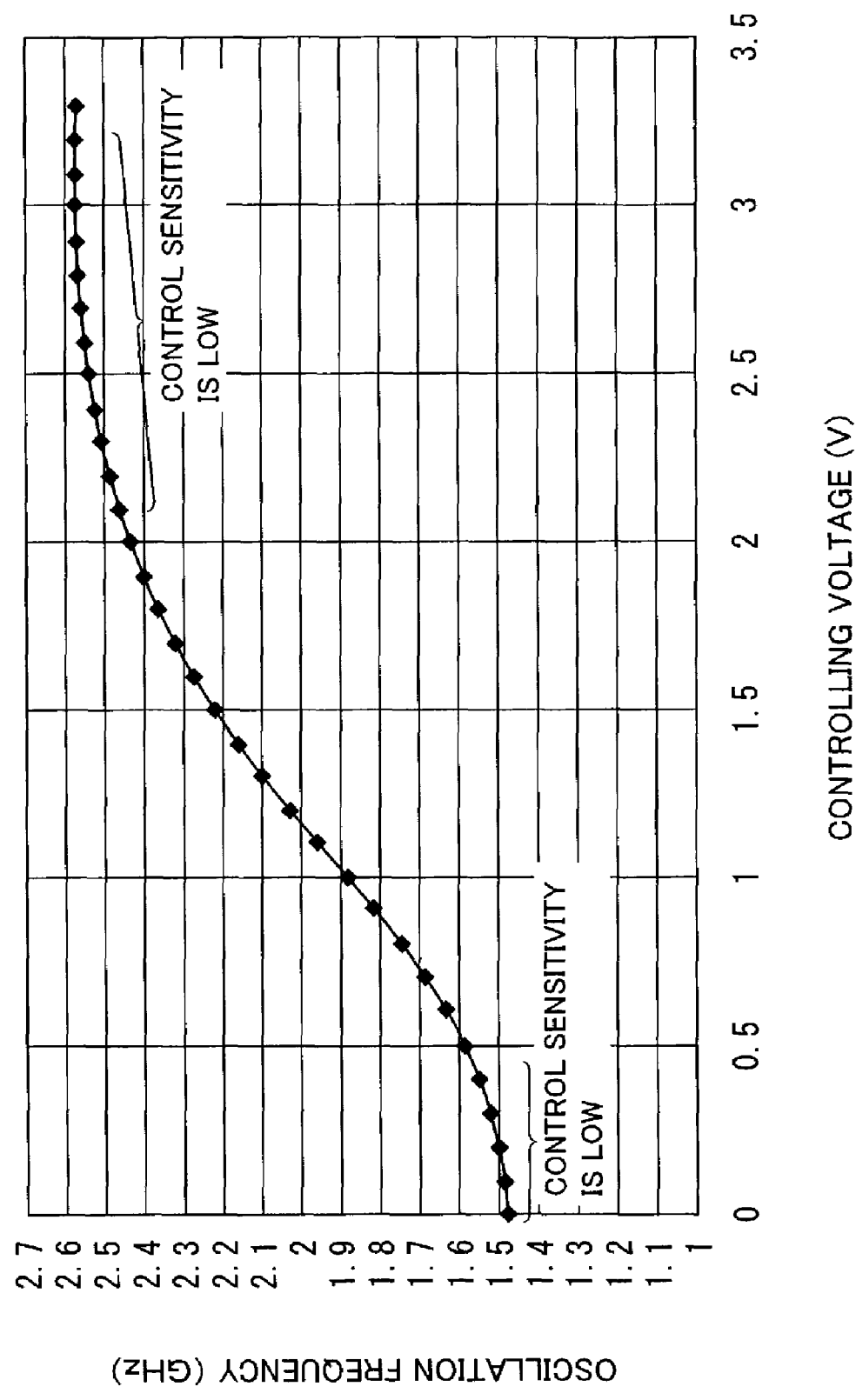
FIG. 5 is a graph showing a relationship between a frequency controlling voltage and an oscillation frequency of the VCO.
Figure 14:
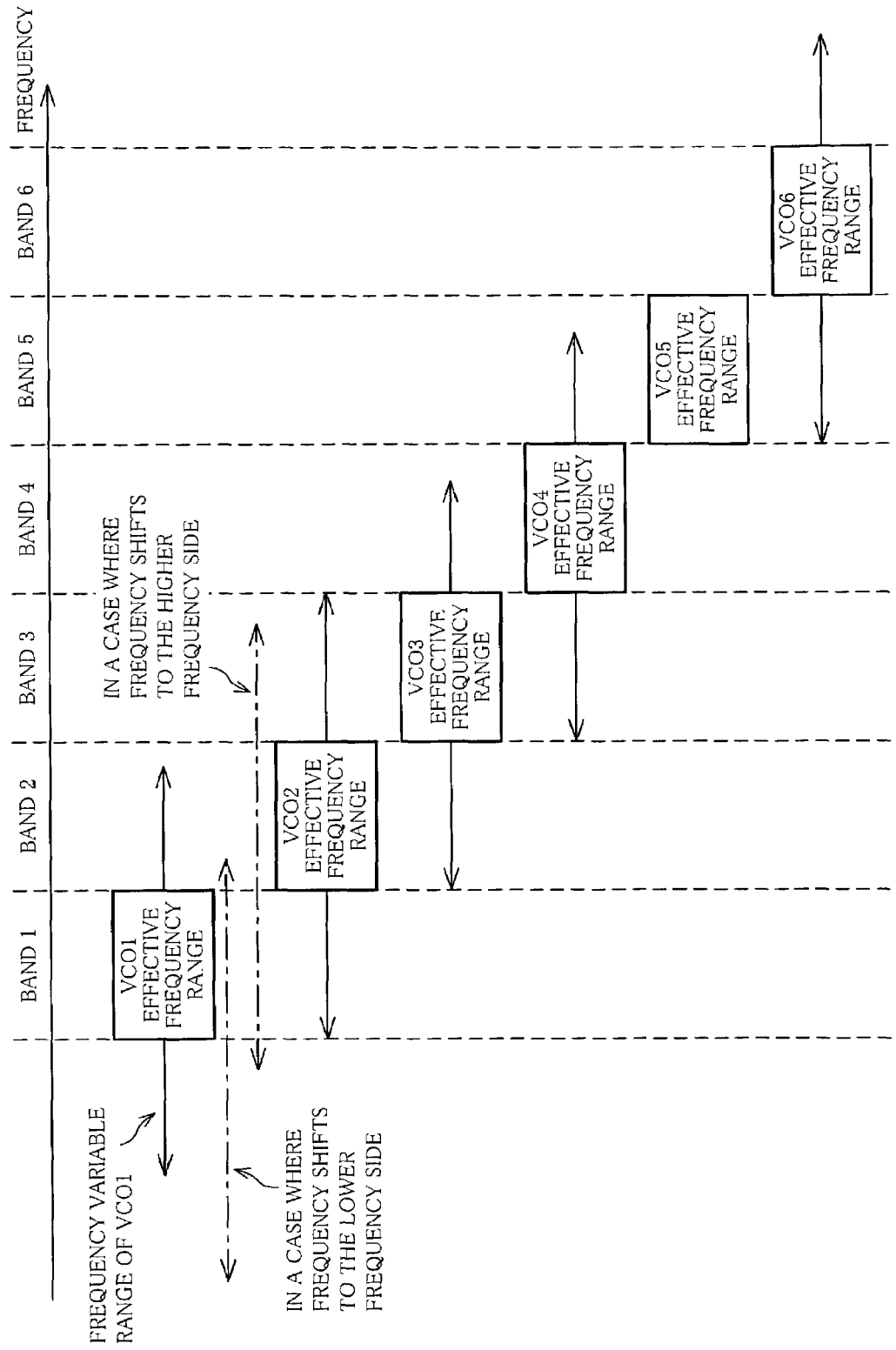
FIG. 14 is a diagram showing band division and a VCO oscillation frequency variable range.

First, as an example compared with an arrangement according to the present embodiment, description is given on a case of using only a range that covers a frequency variable range even when a dispersion occurs in the frequency variable range, under a condition under which six VCOs (voltage controlled oscillator) are provided in a single integrated circuit. FIG. 14 shows a relationship between frequencies. Further, FIG. 5 shows an example of a characteristic of the VCO, and FIG. 15 shows a block diagram thereof.

Figure 15:
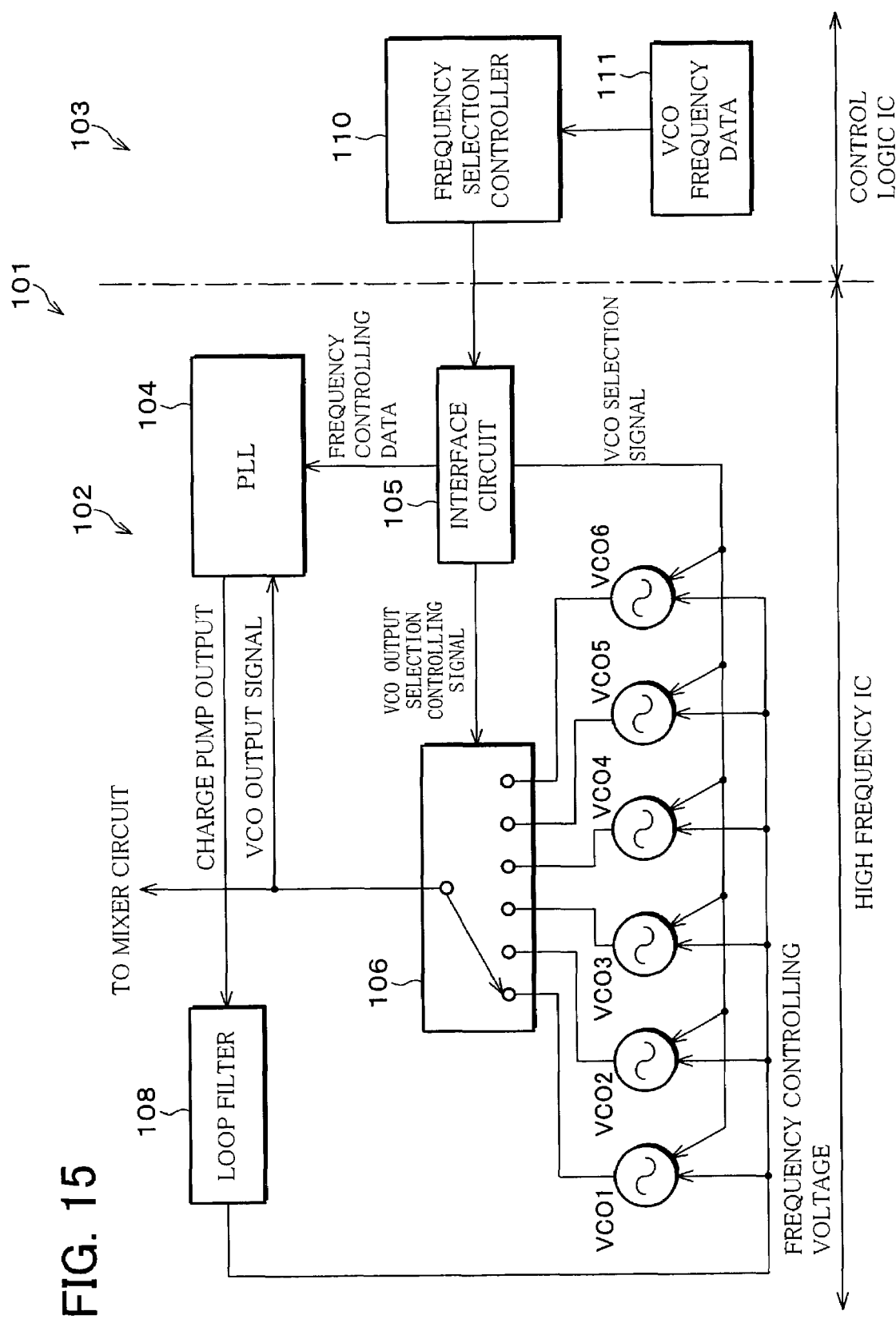
FIG. 15 is a block diagram schematically showing an example of how the PLL synthesizer is arranged.

As shown in FIG. 15, a PLL synthesizer 101 which functions as an integrated circuit is constituted of a high frequency IC 102 and a control logic IC 103. The PLL synthesizer 101 includes a PLL 104 and a loop filter 108. The PLL synthesizer 101 further includes not only a group of VCOs shown in FIG. 14, but also an interface circuit 105 that provides (a) a VCO selection signal for selecting a single VCO out of the group, (b) a VCO output selection controlling signal for selecting outputs of the respective VCOs, and (c) an appropriate frequency controlling information to the PLL 104. The PLL synthesizer 101 further includes a VCO output selector 106 for selecting a VCO output according to the VCO output selection controlling signal. These circuits and other circuits required in a receiver are provided in the high frequency IC 102.

The high frequency IC 102 is controlled by another control logic IC 103 via the interface circuit 105. The control logic IC 103 contains information (VCO frequency information 111) concerning which VCO covers which frequency variable range. In a case of operating the PLL 104 of the high frequency IC 102 at a certain frequency, a frequency selection controller 110 determines which VCO is to be used in accordance with the information, and the VCO selection signal etc. is varied via the interface circuit 105, so that a required VCO is operated. Thereafter, the frequency controlling information is set in a program able frequency divider (not shown) of the PLL 104, so that setting of the frequency is completed.

Figure 3:
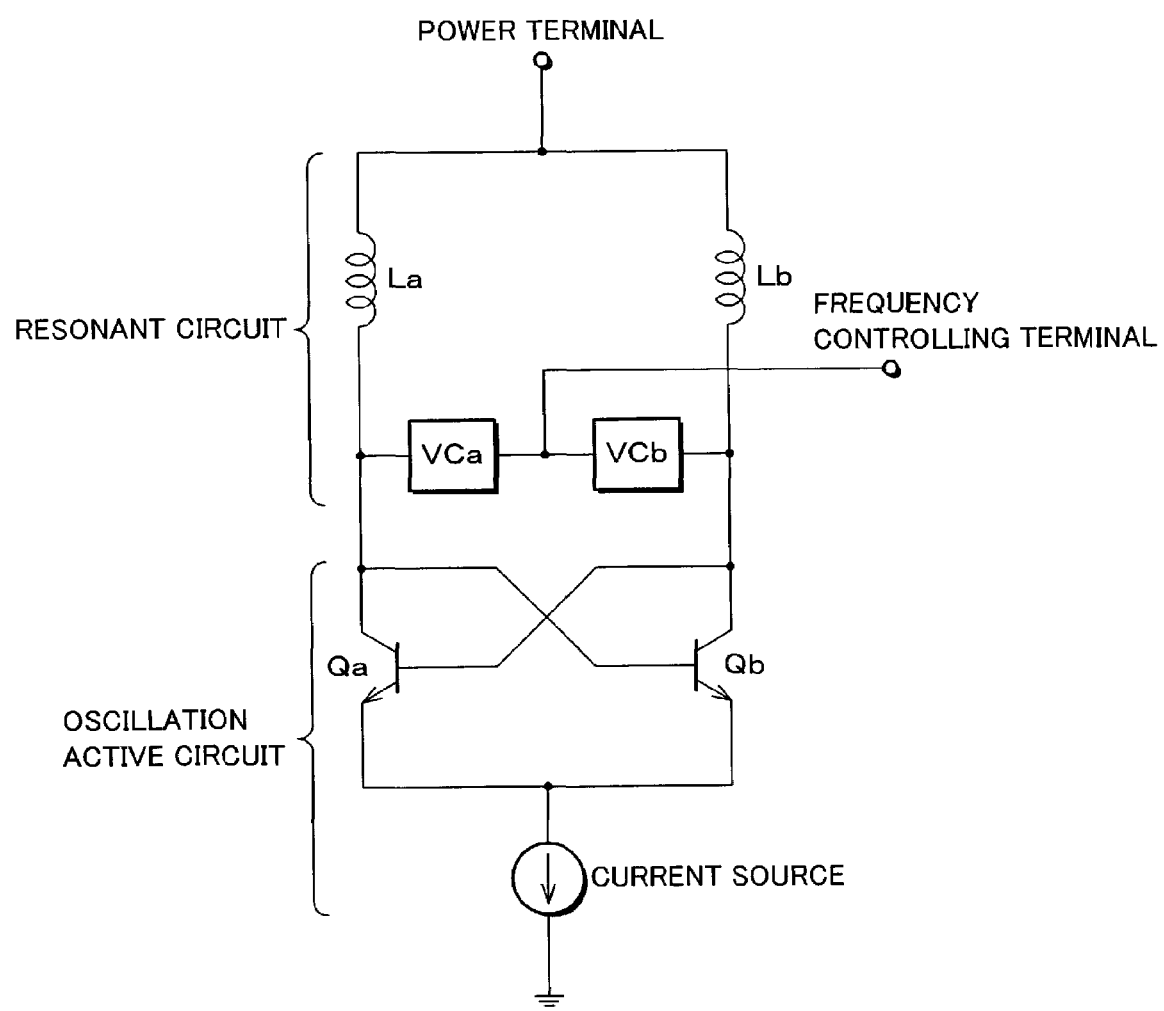
FIG. 3 is a circuit diagram showing an example of how the VCO is arranged.

FIG. 3 is a circuit diagram of the VCO provided in the integrated circuit. The VCO is made up of (a) a resonant circuit constituted of inductors La and Lb, variable capacitance elements Vca and VCb, and (b) an active circuit (negative resistant circuit) constituted of transistors Qa and Qb. The VCO resonates at a resonant frequency of a resonant circuit containing various kinds of parasitic elements. As the variable capacitance element, a diode (variable capacitance diode) or a gate capacitor of MOSFET (MOS varactor mode) is representatively used. When a voltage applied to a frequency controlling terminal (frequency controlling voltage, also referred to merely as a controlling voltage) is varied, a voltage applied to the variable capacitance element varies. Although the active circuit is constituted of a bipolar transistor in FIG. 3, it is possible to arrange the oscillation circuit by using MOSFET in a similar manner. FIG. 5 is an example of relationship between a pair of voltages and the oscillation frequency that are applied to the frequency controlling terminal of the VCO shown in FIG. 3. In this example, when the voltages are high, the frequency is high.

Here, the oscillation frequency variable range of the VCO varies due to a dispersion in an IC process, fluctuation in a temperature and a power source voltage. FIG. 14 shows this state brought about in a VCO1. Therefore, taking the dispersion into consideration, it is necessary to deduct the dispersion and the fluctuation in the frequency from an actual variable range so as to obtain an available frequency range.

Further, in the vicinity of the upper limit or the lower limit of the variable frequency, frequency controlling sensitivity of the VCO (ratio between (a) the variation of the frequency and (b) the variation of the controlling voltage) becomes small, so that loop gain of the PLL synthesizer used in combination is reduced. Thus, a loop band width is reduced and a lock time becomes longer, so that this is not appropriate to use. Therefore, the available frequency variable range is further narrowed (see FIG. 5).

A range remaining after the deduction is the available frequency variable range. The VCO1 that covers a band 1 must cover the frequency of the band 1 even though a dispersion occurs in the frequency. FIG. 14 shows this as the available frequency variable range.

When the group of VCOs as shown in FIG. 14 are used, a substantial frequency variable range is largely narrowed compared with a variable range of the frequency that the VCO itself has. As a result, a large number of VCOs are required. In an extreme case, there is a possibility that no available frequency variable range exists when using such VCO that the dispersion is large and the variable range is narrow.

Even if the available frequency variable range is secured, there occur the following problems: when a large number of VCOs are used so as to resist a process dispersion of the high frequency IC, a chip area becomes large, so that this is not economical. That is, a price of the IC becomes high. Further, when the number of VCOs is decreased, yield of the high frequency IC drops, so that the price of the IC becomes high.

In the foregoing example, the dispersion occurs in the frequency, so that the frequency that is substantially usable is narrowed. Next, description is given on a method for realizing a low-cost IC that effectively uses variable ranges of the VCOs, and resists the dispersion, and has a smaller chip area.

Here, it is important that a plurality of VCOs cover successive frequencies. Then, the plurality of VCOs are provided in a single integrated circuit, so that there occur few frequency dispersions that are different from each other. Thus, it is possible to design the VCOs so that there occur dispersions in the same direction.

More specifically, as to the dispersions of the VCOs in the actual integrated circuit, there are (a) a cause that the dispersions occur in the same direction and (b) a cause that the dispersions occur in an inverse direction. Here, the integrated circuit is designed so that the latter cause is avoided, so that the former cause is emphasized.

The frequency of the VCO is determined by a resonant frequency of a tank circuit (resonant circuit)(see FIG. 3). The tank circuit includes an inductor L (La and Lb in FIG. 3) and a variable capacitance element C (Vca and VCb in FIG. 3), the resonant frequency is determined by element constants of them.

Generally, the inductor can be realized as follows: a conductor such as alminium is deposited, and some portions are removed by a chemical process as required, so that a geometrical pattern (a circular or ceratoid line in a spiral manner) is drawn on the wiring layer on which an arbitrary pattern can be drawn.

While, the variable capacitance element can be realized as follows: an applied frequency controlling voltage is varied by using a joint capacitor of PN joint, a gate and a source/drain capacitor of a MOS transistor.

An example of a forming step of a MOS type variable capacitance element is as follows. Note that, FIG. 7(a) through FIG. 7(k) are views seen from above the capacitance element shown in FIG. 6(a) through FIG. 6(k).

Figure 6:
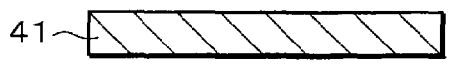
FIG. 6(a) through FIG. 6(k) are drawings each of which shows a manufacturing step of a MOS type variable element constituting the VCO.
Figure 6:
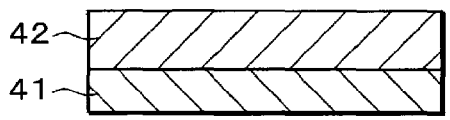
Figure 6:
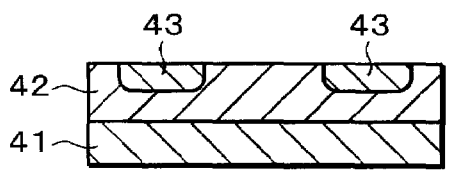
Figure 6:
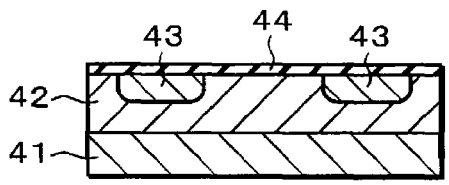
Figure 6:
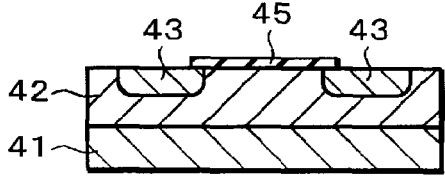
Figure 6:
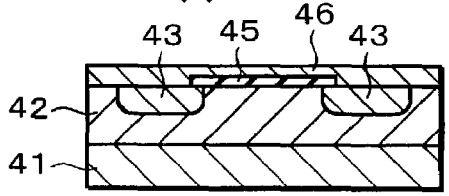
Figure 6:
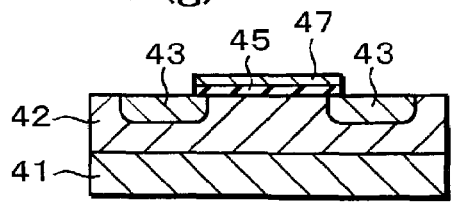
Figure 6:
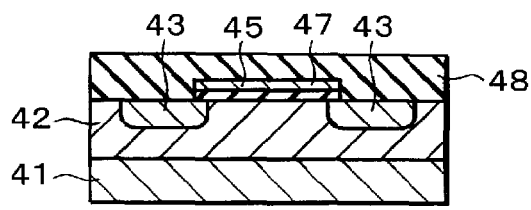
Figure 6:
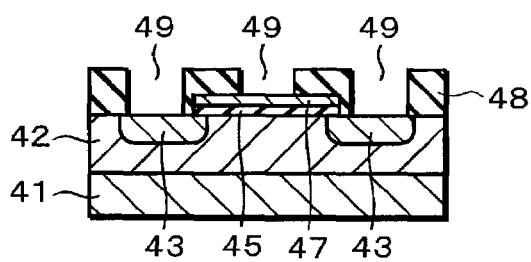
Figure 6:
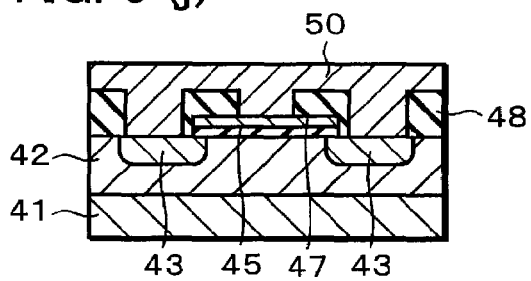
Figure 6:
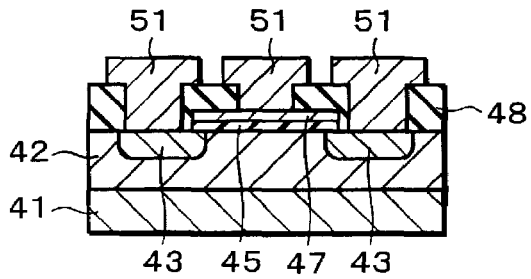
Figure 7:
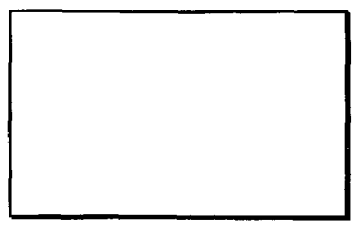
FIG. 7(a) through FIG. 7(k) are drawings each of which shows a manufacturing step of a MOS type variable element constituting the VCO.
Figure 7:
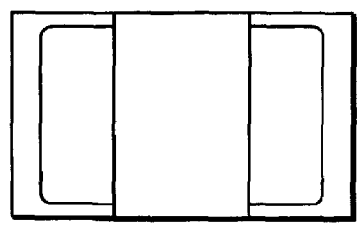
Figure 7:
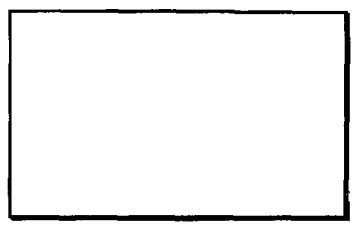
Figure 7:
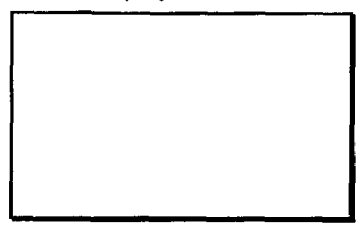
Figure 7:
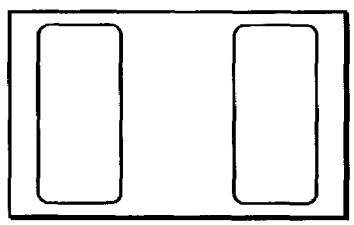
Figure 7:
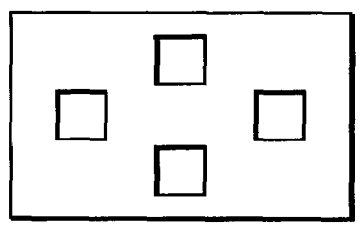
Figure 7:
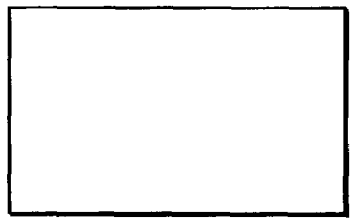
Figure 7:
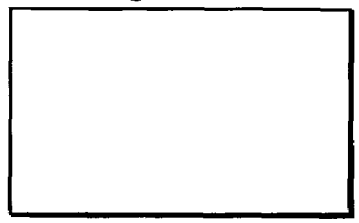
Figure 7:
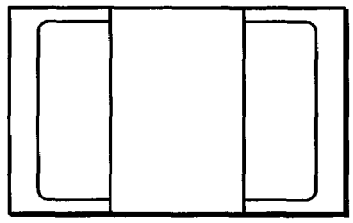
Figure 7:
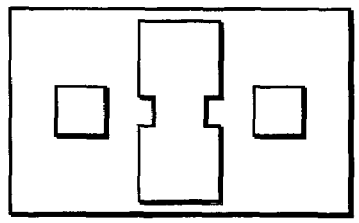
Figure 7:
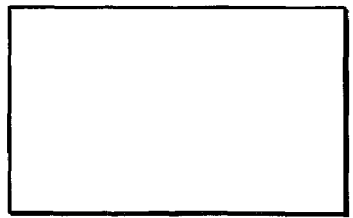

As shown in FIG. 6(a), a p type silicon substrate 41 is formed, and as shown in FIG. 6(b), an n type layer 42 is formed on the p type silicon substrate 41, and as shown in FIG. 6(c), a p type layer 43 is provided in an upper portion of the n type layer 42, and as shown in FIG. 6(d), an insulating film 44 is formed on an entire surface thereof, and as shown in FIG. 6(e), patterning is performed with respect to the insulating film 44 so as to form a gate insulating film 45. As shown in FIG. 6(f), a conductive film 46 is formed on an entire surface thereof, and as shown in FIG. 6(g), patterning is performed with respect to the conductive film 46 so as to form a gate electrode 47. As shown in FIG. 6(h), an interlayer insulating film 48 is formed on an entire surface thereof, and as shown in FIG. 6(i), a via 49 is provided in the interlayer insulating film 48, and as shown in FIG. 6(j), a metallic layer 50 is formed on an entire surface thereof so as to fill the via 49, and as shown in FIG. 6(k), patterning is performed with respect to the metallic layer 50 so as to form a wiring layer 51. Thus, the MOS type variable capacitance element is formed.

An example of a forming step of the inductor is as follows. Note that, FIG. 9(a) through FIG. 9(m) are views seen from above the inductor shown in FIG. 8(a) through FIG. 8(m).

Figure 8:
FIG. 8(a) through FIG. 8(m) are drawings each of which shows a manufacturing step of an inductor constituting the VCO.
Figure 8:
Figure 8:
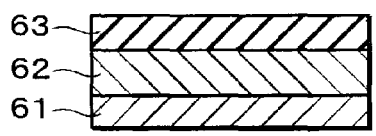
Figure 8:
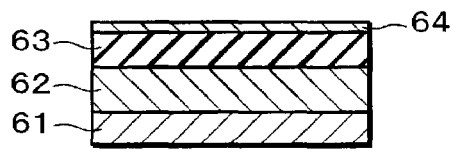
Figure 8:
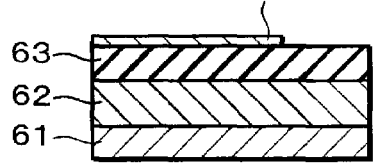
Figure 8:
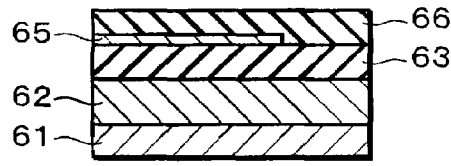
Figure 8:
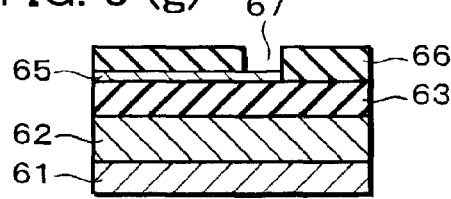
Figure 8:
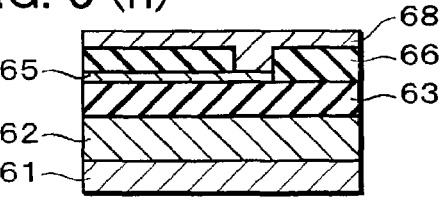
Figure 8:
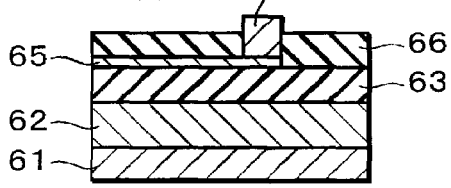
Figure 8:
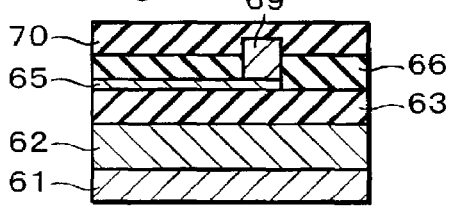
Figure 8:
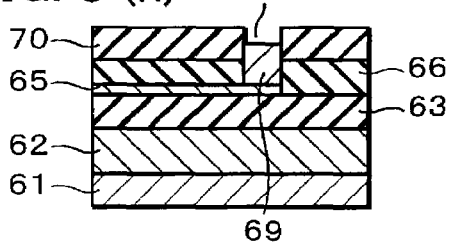
Figure 8:
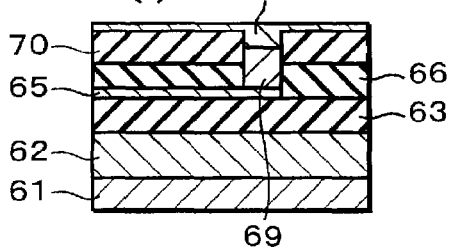
Figure 8:
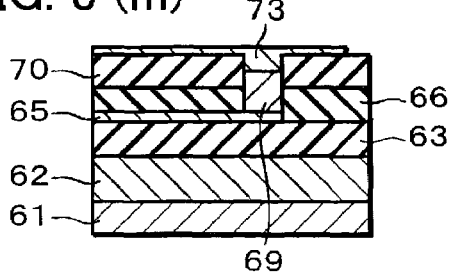
Figure 9:
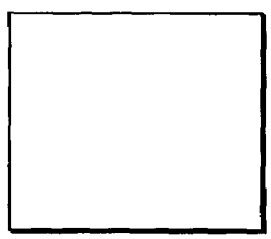
FIG. 9(a) through FIG. 9(m) are drawings each of which shows a manufacturing step of an inductor constituting the VCO.
Figure 9:
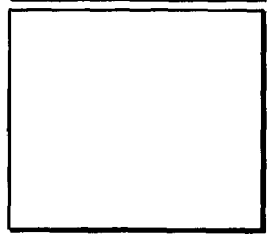
Figure 9:
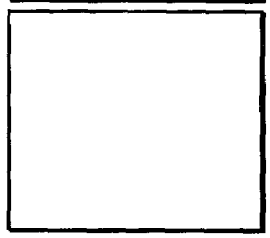
Figure 9:
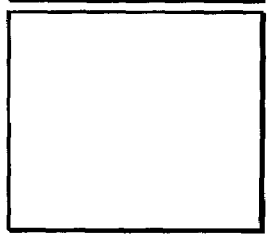
Figure 9:
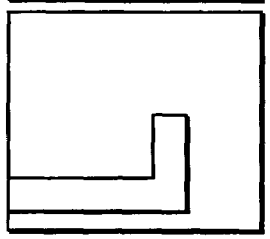
Figure 9:
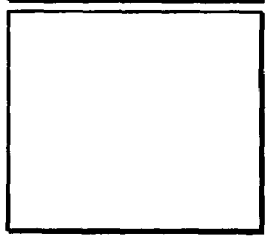
Figure 9:
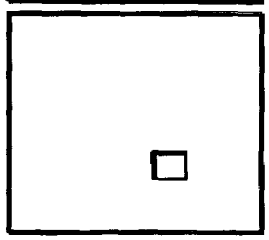
Figure 9:
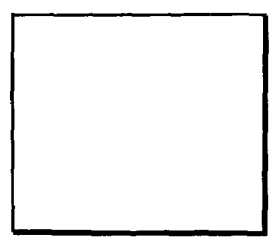
Figure 9:
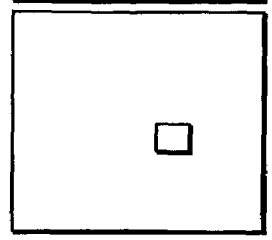
Figure 9:
Figure 9:
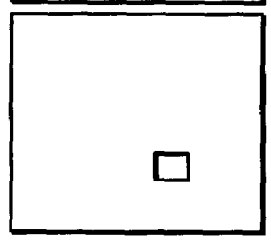
Figure 9:
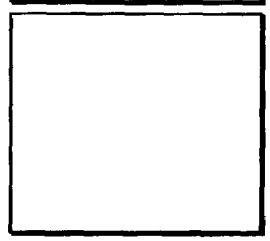
Figure 9:
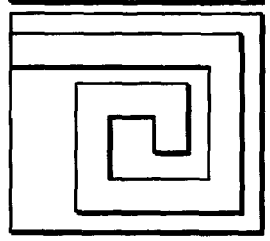

As shown in FIG. 8(a), a p type silicon substrate 61 is formed, and as shown in FIG. 8(b), an n type layer 62 is formed on the p type silicon substrate 61, and as shown in FIG. 8(c), an insulating film 63 is formed on an entire surface thereof, and as shown in FIG. 8(d), a first metallic layer 64 is formed on an entire surface thereof, and as shown in FIG. 8(e), patterning is performed with respect to the first metallic layer 64 so as to form a first wiring layer 65. As shown in FIG. 8(f), an insulating film 66 is formed on an entire surface thereof, and as shown in FIG. 8(g), a via 67 is provided in the insulating film 66, and as shown in FIG. 8(h), a second metallic layer 68 is formed on an entire surface thereof so as to fill the via 67, and as shown in FIG. 8(i), patterning is performed with respect to the second metallic layer 68 so as to form a second wiring layer 69. As shown in FIG. 8(j), an insulating film 70 is formed on an entire surface thereof, and as shown in FIG. 8(k), a via 71 is provided in the insulating film 70, and as shown in FIG. 8(l), a third metallic layer 72 is formed on an entire surface thereof so as to fill the via 71, and as shown in FIG. 8(m), patterning is performed with respect to the third metallic layer 72 so as to form an inductor section 73. In this manner, the inductor is formed.

Incidentally, an inductance value is determined mainly in accordance with a line width and a turn number (number of times wound) of a pattern, and a capacitance value of the variable capacitance element is determined mainly in accordance with not only an area of the PN joint and a physical size of a gate width etc., but also density etc. of impurities contained in the element.

These values vary due to a dispersion brought about in the manufacturing step of the integrated circuit. The dispersion brought about in a single integrated circuit formed on a wafer is caused by (a) an absolute dispersion in which element constants of the integrated circuit on the wafer are uniformly dispersed and (b) relative dispersion in which the element constants at different portions are separately dispersed even in a single integrated circuit.

In a case of the oscillation circuit of the present invention, when the capacitance value and the inductance value of the tank circuit are increased, the oscillation frequency varies in a lower direction. When the respective values are decreased, the oscillation frequency varies in a higher direction.

The variation of the element constants brought about by the absolute dispersion influences the whole integrated circuit uniformly. Thus, in a case where the same oscillation circuit mode brings about different oscillation frequencies according to the element constants as in the present invention, the element constants vary in the same direction, so that also the oscillation frequency characteristic varies in the same direction.

Meanwhile, the relative dispersion is such that directions in which the element constants vary are different from each other for the respective elements even in the same integrated circuit, so that the oscillation frequency of the oscillation circuit varies in an inverse direction. However, a fluctuation width of the relative dispersion is smaller, such as approximately 10 percent, compared with a fluctuation width of the absolute dispersion. Then, in a case where a successively wide band VCO is realized by using a plurality of VCO circuits as in the present invention, it is possible to obtain the following advantage: the upper limit and the lower limit of the oscillation frequency are set in advance by performing simulation etc. so as to make fixed oscillation frequency ranges overlap each other even when the oscillation frequencies of VCOs adjacent to each other vary in directions different from each other due to the relative dispersion, so that it is possible to maintain the succession of the oscillation frequency even when the dispersion is brought about in the manufacturing step.

In the foregoing simulation performed upon designing the VCOs, the inductance value and the capacitance value are adjusted so that the fluctuation of the oscillation frequency brought about by the dispersion does not cause the succession to be lost, so that the succession of the oscillation frequency is realized. The simulation can be performed with a computer etc. by inputting the dispersions of the elements as a parameter for example.

Actually, a prototype is manufactured after designing the VCOs, and the element fluctuation caused by the dispersion brought about in the manufacturing step is measured, and the inductance value and the capacitance value are compensated, so that it is possible to secure the succession of the oscillation frequency.

Figure 1:
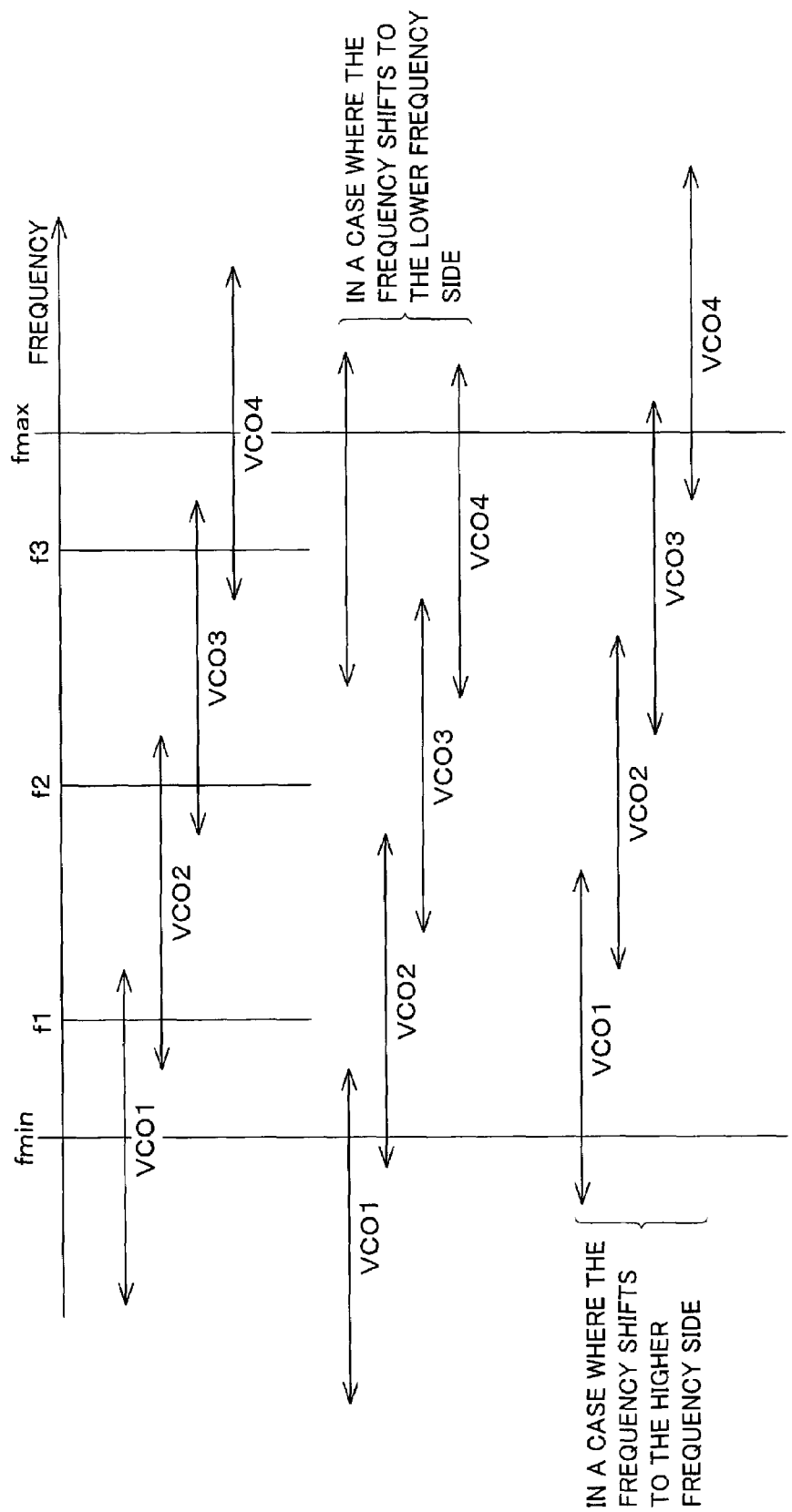
FIG. 1 is a diagram showing an oscillation frequency variable range of a VCO in a case where the VCO is changed according to a dispersion.

In the arrangement designed in this manner, the frequency variable ranges of the VCOs are set so that each VCO does not cover a specific frequency but successively covers the frequency variable ranges each of which includes deviance brought about by the dispersion as shown in FIG. 1, and the VCOs are provided in the integrated circuit. That is, all the VCOs are provided in the integrated circuit by using the same process, so that the dispersions of the frequency variable ranges of all the VCOs are brought about in the same direction. As the frequency variable range of each VCO, both (a) a range covering the frequency regardless of whether the dispersion occurs or not and (b) a range covering the frequency only in a case the dispersion occurs are prepared, and the frequency variable ranges are set so that the frequency variable ranges of the VCOs are in succession. Then, in a case where a certain frequency is selected, an appropriate VCO can be selected according to the dispersion of the frequency.

As shown in FIG. 1, the frequency is adjusted so that a required frequency variable range can be covered by a plurality of VCOs, so that the frequency variable range can be covered by four VCOs even in a case where six VCOs would be required in FIG. 14. The required frequency variable range is from fmin to fmax. In a case where the dispersion does not cause the frequency to shift, a VCO1 is selected from fmin to f1, and a VCO2 is selected from f1 to f2, and a VCO3 is selected from f2 to f3, and a VCO4 is selected from f3 to fmax. Note that, it is necessary to vary f1, f2, and f3 according to the dispersion in the frequency of the VCOs.

The frequency variable ranges and the frequency dispersions of the VCOs are set to be the same as in the arrangement example in which six VCOs shown in FIG. 14 and FIG. 15 are required.

Figure 2:
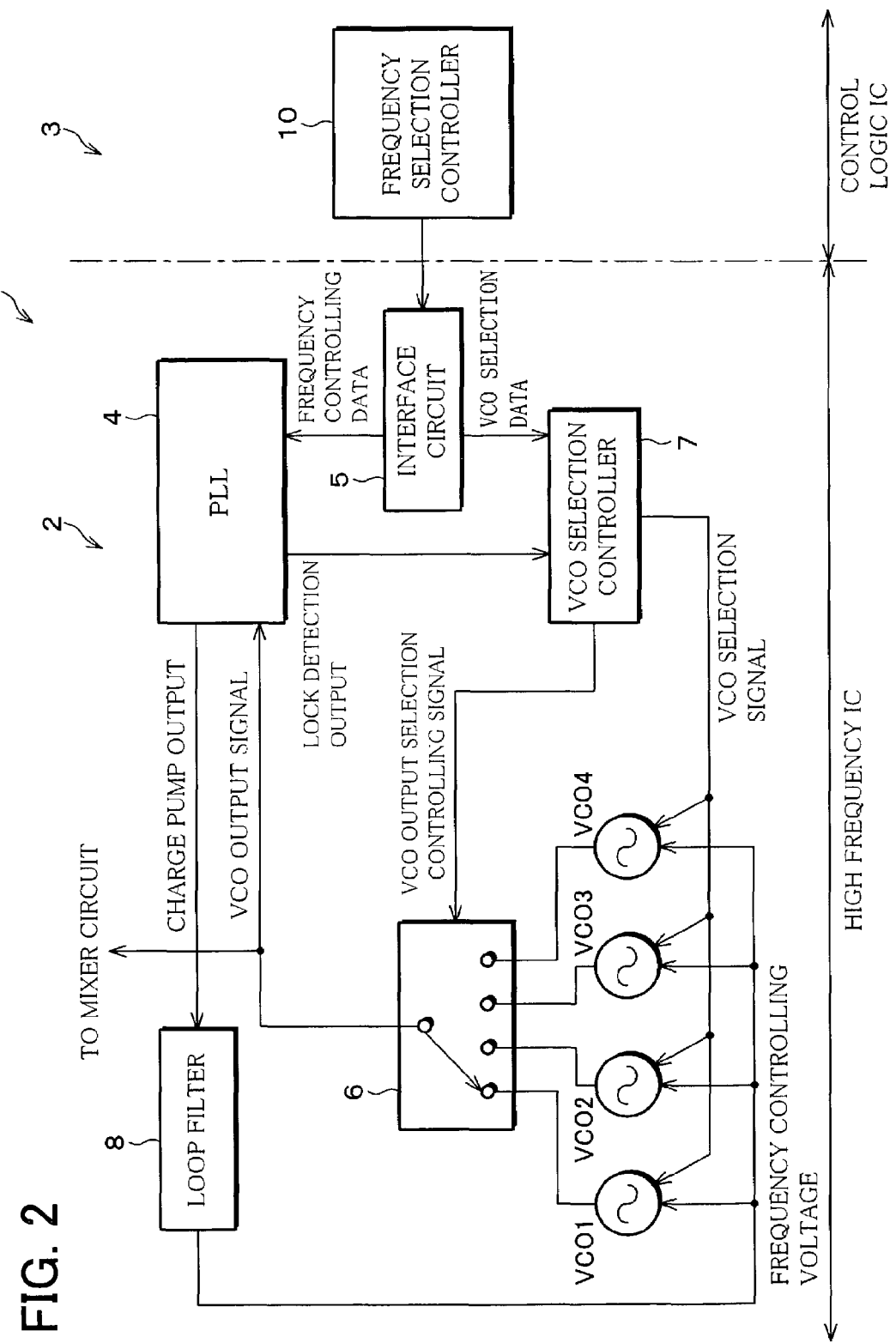
FIG. 2 is a block diagram schematically showing an example of how a PLL synthesizer is arranged.

In this case, as shown in FIG. 1, it is possible to cover the required frequency by using four VCOs. FIG. 2 is a block diagram showing the PLL synthesizer of the arrangement example.

As shown in FIG. 2, the PLL synthesizer 1 which functions as the integrated circuit is constituted of a high frequency IC2 and a control logic IC3. The PLL synthesizer 1 includes a PLL4 and a loop filter 8. Further, the PLL synthesizer 1 includes a group of VCOs shown in FIG. 1, and receives a lock detection output from a PLL4. The PLL synthesizer 1 includes: a VCO selection controller 7 which outputs a VCO selection signal for selecting one VCO from the group of VCOs and a VCO selection controlling signal for selecting outputs of the VCOs; and an interface circuit 5 which provides frequency controlling information to the PLL4 and outputs VCO selection information to the VCO selection controller 7. Further, the PLL synthesizer 1 includes a VCO output selector 6 for selecting the VCO output according to the VCO output selection controlling signal. Not only these circuits but also other circuits required in the receiver are provided in the high frequency IC2.

The high frequency IC2 is controlled by another control logic IC3 via the interface circuit 5. The control logic IC3 contains information (VCO frequency information) concerning which VCO covers which frequency variable range. In a case of operating the PLL 4 of the high frequency IC2 at a certain frequency, a frequency selection controller 10 determines which VCO is to be used in accordance with the information, and the VCO selection signal etc. is varied via the interface circuit 5, so that a required VCO is operated.

Thereafter, the frequency controlling information is set in a program able frequency divider (not shown) of the PLL4, so that setting of the frequency is completed.

Figure 4:
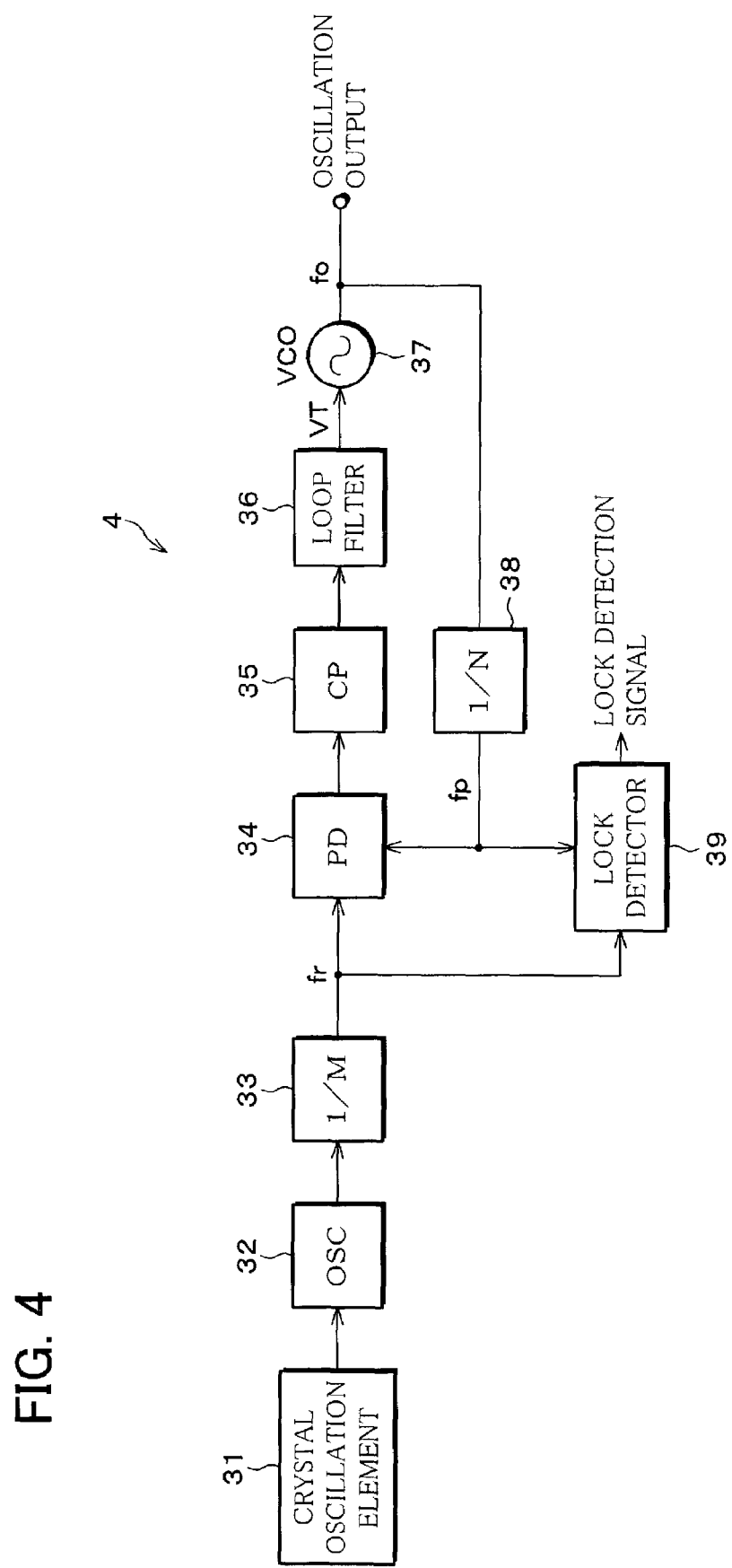
FIG. 4 is a block diagram schematically showing an example of how a PLL is arranged.

As shown in FIG. 4, the PLL (Phase Lock Loop) 4 includes an oscillator 32, a 1/M frequency divider (reference counter) 33, a phase detector (PD) 34, a charge pump (CP) 35, a loop filter 36, a voltage controlled oscillator (VCO) 37, a 1/N frequency divider (program able counter) 38, and a lock detector 39.

A crystal oscillation element 31 is externally provided on the high frequency IC2, and it is possible to obtain a highly stabilized reference oscillation frequency by connecting the crystal oscillation element 31 to the oscillator 32. Note that, instead of connecting the crystal oscillator 31 to the oscillator 32, a reference frequency signal having the same stability may be inputted. For example, as to another control logic IC3, in a case where a reference frequency signal brought about by a similar crystal oscillator is required, it is also possible to perform the following process: the crystal oscillation element 31 is connected to the oscillator of the control logic IC3, and the reference frequency signal obtained from the oscillator is taken out so as to be inputted to the oscillator 32 of the high frequency IC2.

The lock detector 39 outputs a lock detection signal in a case of detecting that a phase difference between the frequency fr and the frequency fp is not more than a specific value. The 1/N frequency divider 38 is a program able frequency divider which can obtain an arbitrary frequency dividing ratio, and the 1/N frequency divider 38 drops the oscillation frequency of the voltage controlled oscillator 37 to the same frequency as the reference oscillation frequency. The 1/M frequency divider 33 is a reference counter of a control register of the PLL, and can vary a comparative frequency (reference frequency) of the PLL by changing its setting value.

The PLL4 uses the reference frequency, that is highly stabilized by the crystal oscillation element 31, as the comparative frequency, and compares the oscillation frequency of the voltage controlled oscillator 37 with the comparative frequency, and identifies corresponding phases with each other, so that the oscillation frequency of the voltage controlled oscillator 37 has the same accuracy as in the crystal oscillation element 31.

Since the reference oscillation frequency obtained from the crystal oscillation element 31 is fixed, it is necessary to match the oscillation frequency of the voltage controlled oscillator 37 with the reference oscillation frequency. Then, the PLL includes the 1/N frequency divider 38 which is a program able frequency divider which can obtain an arbitrary frequency dividing ratio as described above, and the 1/N frequency divider 38 drops the oscillation frequency of the voltage controlled oscillator 37 to the same frequency as the reference oscillation frequency. For example, in a case where the comparative frequency is 1 MHz and the receiver frequency is 950 MHz, the frequency dividing ratio of the 1/N frequency divider 38 is 1/950. Since the frequency dividing ratio can be only an integer number, a frequency variable step in this case is 1 MHz, so that reception at a 1 MHz interval is enabled.

In order to make the frequency variable step smaller, it is necessary to drop the comparative frequency. That is, although it is possible to vary the frequency fp by using the 1/N frequency divider 38, this means that the frequency fp varies for each comparative frequency determined in accordance with setting of the 1/M frequency divider. Here, when a frequency dividing ratio M of the 1/M frequency divider 33 is changed, it is possible to vary the comparative frequency of the PLL. For example, in a case where the frequency oscillated by the crystal oscillator 31 is 4 MHz, when 1/M is varied to 1/4, 1/8, 1/16, . . . , it is possible to vary the comparative frequency to 1 MHz, 500 MHz, 250 MHz, . . . . When the value is made smaller, it is possible to make a variation width (variation step) of the frequency fp smaller, that is, it is possible to improve frequency resolution. That is, the frequency resolution means a frequency variable step (interval of receiving channels) in setting the oscillation frequency to a desired oscillation frequency (actually corresponding to the receiving channel).

However, when the comparative frequency is dropped, the frequency dividing ratio of the 1/N frequency divider 38 becomes larger and a time taken to compare the phases with each other is increased, so that a response time of the PLL becomes slow. Thus, in order to reduce a time taken to compensate the frequency, the comparative frequency is increased as much as possible, so that it is possible to shorten the processing time.

Then, in the present embodiment, even if the VCOs which are identical to each other in the frequency variable range and in a characteristic of the frequency dispersion etc. are used, it is possible to realize an appropriate overlap of the oscillation frequencies and to reduce the number of VCOs from six to four due to the adjustment of the oscillation frequency variable range (setting of the inductance value and the capacitance value of the tank circuit).

That is, in the arrangement of FIG. 14, which VCO covers which range is determined for each range, so that it is necessary that a specific VCO oscillates within the oscillation frequency variable range in a determined range. On the other hand, in the arrangement of FIG. 1, the design causes the oscillation frequencies of adjacent VCOs to overlap each other without fail. Thus, even if the frequency deviates from a range covered by one VCO in the upper limit or the lower limit of the range that has been set in advance, the frequency is in a range covered by upper and lower VCOs (any one of two VCOs whose frequency variable ranges adjacent to each other), so that it is possible to maintain the succession of the oscillation frequency.

Figure 10:
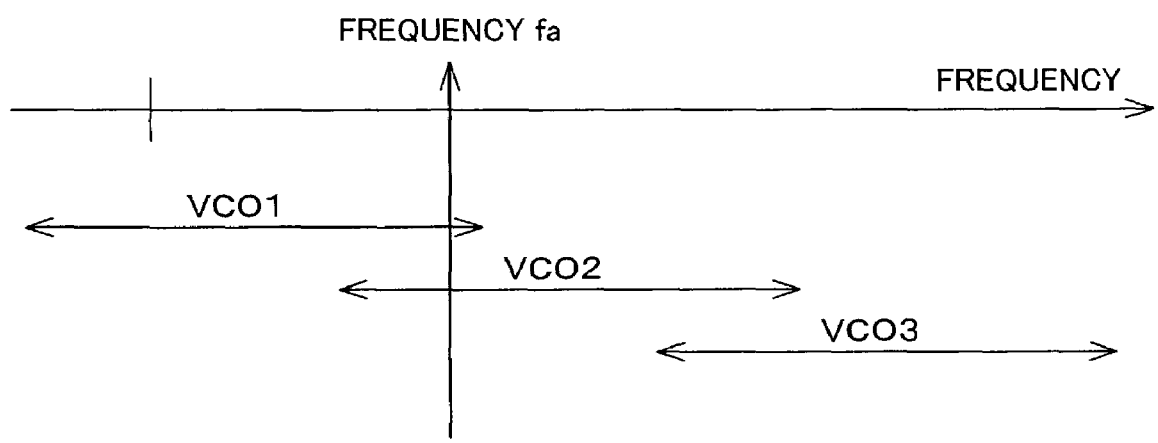
FIG. 10 is a diagram showing a relationship between a frequency fa and an oscillation frequency variable range in a case where the frequency fa is outputted.

Description is given on how to confirm whether or not the VCO is the most appropriate for the frequency that is to be set in the PLL each time the frequency is selected. It is assumed that the PLL synthesizer outputs a frequency fa. In this case, the most appropriate VCO is selected from VCOs that might be appropriate. FIG. 10 shows this operation.

Typically, when an output frequency of the PLL is determined, a VCOn regarded to be most suitable for the output frequency (n is a number, n=1, 2, 3, . . . ) is determined, and dispersion occurs in the frequency due to the IC process dispersion, so that any one of a VCO(n−1) and a VCO(n+1) may be appropriate. However, in designing the VOCs, a constant of the tank circuit is determined so that the oscillation frequency of the VCO overlaps another oscillation frequency of an adjacent VCO, so that it is possible to avoid unfavorable dispersion. Thus, it is necessary to select the most appropriate VCO from three VCOs. In a case of FIG. 10, there is a high possibility that the VCO2 is appropriate, and in a case where the dispersion occurs, there is also a possibility that the VCO1 and the VCO3 are appropriate.

Whether the VCO is appropriate or not is judged in accordance with (a) whether or not fa is within (is contained in) the frequency variable range and (b) whether or not there is appropriate coverage with respect to an end of the variable range. In a case where the coverage is insufficient, the controlling sensitivity (MHz/V) of the VCO is too low, so that this influences a lock up time of the PLL. In an extreme case, there is a possibility that: the oscillation frequency variable range of the VCO is varied by fluctuation of a temperature etc. after selecting the frequency, so that the lock shifts. Whether or not there is the appropriate coverage is confirmed each time the PLL synthesizer sets the frequency.

As a method for judging whether the selected VCO is appropriate or not, it is possible to use the lock output of the PLL. The PLL synthesizer has a digital output by which it is possible to confirm whether the phase synchronizing loop locks the frequency or not. When frequency controlling information corresponding to the frequency fa is set in the PLL and the lock output indicates that the frequency is locked, this shows that a selecting frequency fa is included in the frequency variable range of the corresponding VCO.

Figure 11:
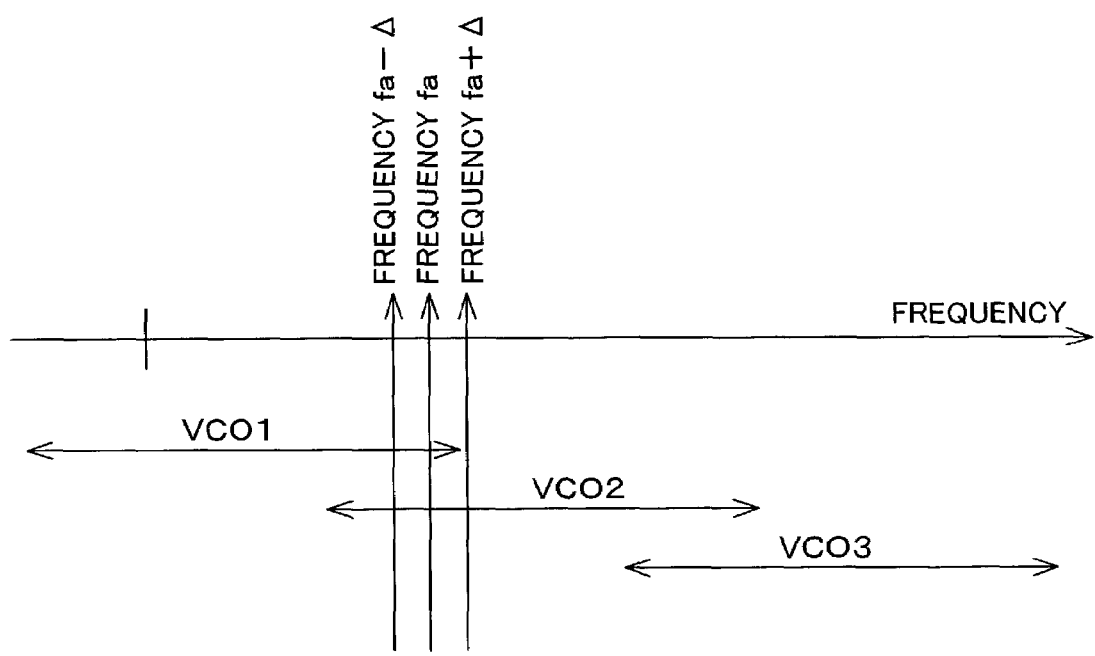
FIG. 11 is a diagram showing a process for confirming coverage of the frequency.

Whether or not there is the coverage can be confirmed as follows. That is, as shown in FIG. 11, whether or not the frequency is locked at a frequency fa+$\Delta$ and a frequency fa−$\Delta$, both of which are obtained by shifting a frequency $\Delta$ that is the coverage, is confirmed. When the frequency is locked at both fa+$\Delta$ and fa−$\Delta$, it is possible to judge that the VCO as well as the coverage is appropriate.

Figure 13:
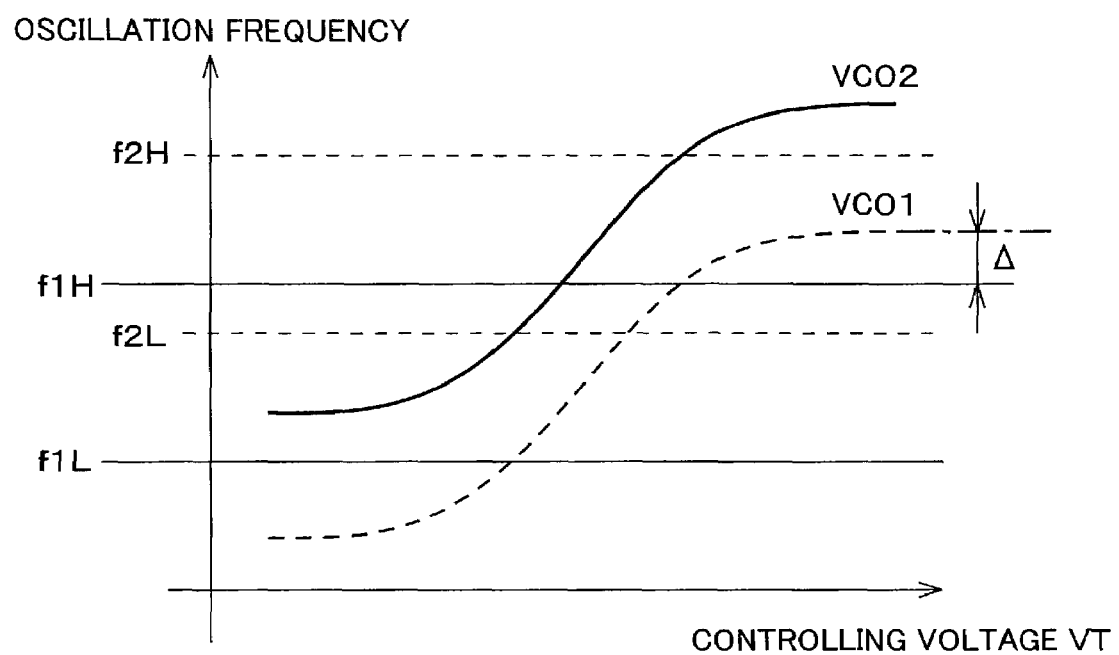
FIG. 13 is a diagram showing how the VCO is selected.

How to determine $\Delta$ is described. FIG. 13 shows tuning characteristics (frequency characteristics) of two VCOs whose oscillation frequencies are adjacent to each other. In order to appropriately operate the VCO by using the PLL, it is necessary to use the VCO within a range in which tuning sensitivity (frequency controlling sensitivity) of the VCO is not largely influenced. In FIG. 13, this range is from f1L to f1H in the VCO1, and this range is from f2L to f2H in the VCO2.

Here, in a case of selecting a frequency that is a little higher than f1H that is an upper limit of a receivable range, $\Delta$ is set so that the PLL does not lock the frequency f1H+$\Delta$ of VCO1. For example, when $\Delta$ is set to be a value shown in FIG. 13, the PLL does not lock the frequency of VCO1 in a case where the frequency that is a little higher than f1H is selected, and the PLL locks the frequency of VCO1 in a case where the frequency that is a little lower than f1H is selected.

Here, as to the frequency of f1H, in a case where f1H is higher than f2L as shown in FIG. 13, that is, in a case where the usable ranges of the tuning characteristics overlap each other, it is possible to obtain the following advantage: even if the frequency is not locked at f1H, an adjacent VCO (VCO2 in this case) locks the frequency without fail, so that there is no problem. Further, in a case where the PLL locks the frequency of VCO1 at f1H, there is no problem in terms of operation.

That is, $\Delta$ is basically set to be between an end of the tuning characteristic and the threshold frequency which can be actually used, as shown in FIG. 13.

Figure 12:
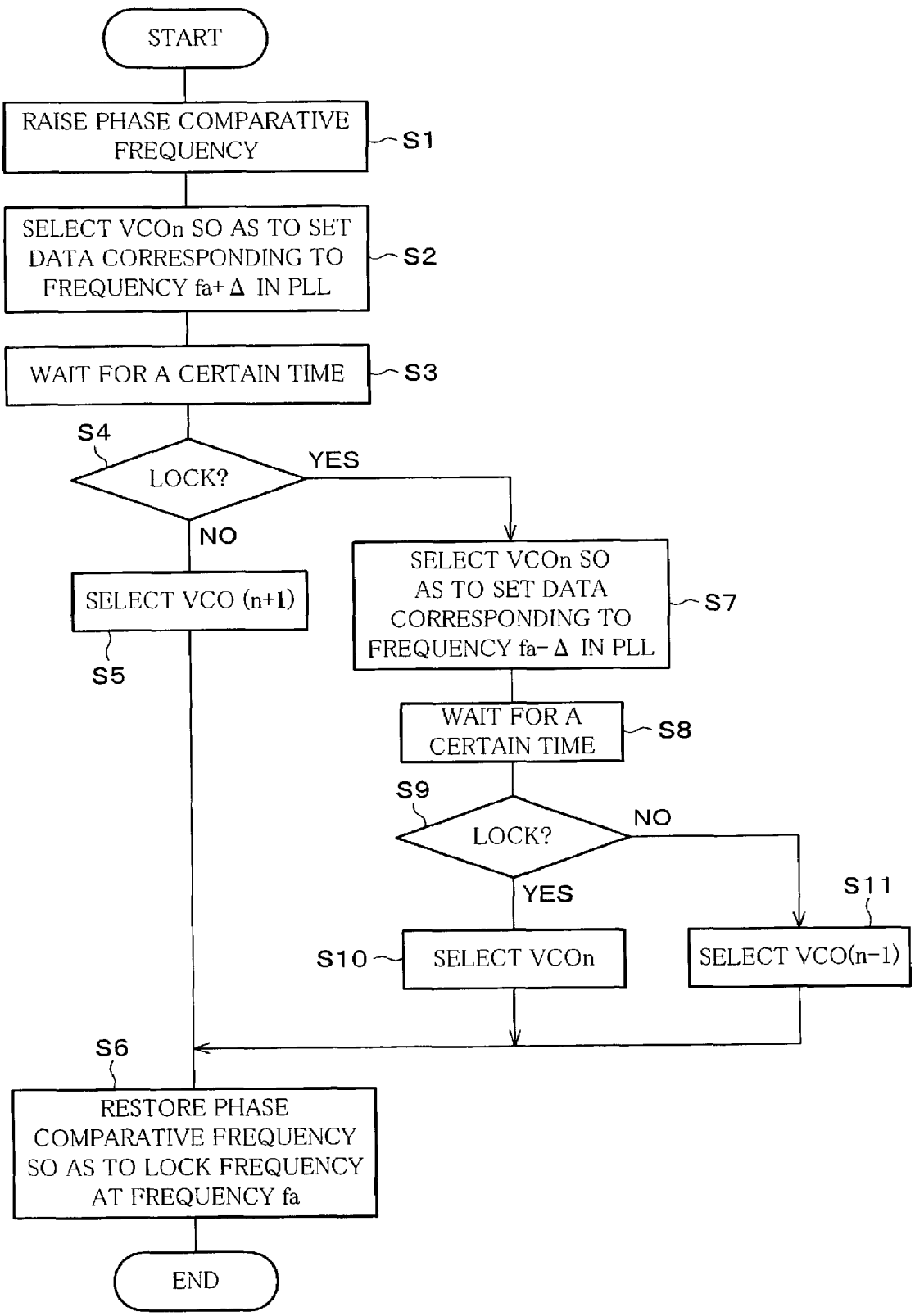
FIG. 12 is a flow chart showing a process in which the VCO is selected.

FIG. 12 shows a flow of the VCO selecting process. Note that, the frequency variable range becomes higher in such order as VCO(n−1), VCOn, VCO(n+1).

First, a phase comparative frequency (comparative frequency) is increased (S1). Then, the VCOn is selected so as to set information corresponding to the frequency fa+$\Delta$ in the PLL (S2), and this is left as it is for a certain time (S3). Whether the frequency is locked or not is checked (S4). In a case where the frequency is not locked, the VCO(n+1) is selected (S5), and the phase comparative frequency is restored so as to lock the frequency fa (S6). In a case where the frequency is locked in S4, the VCOn is selected temporarily, and information corresponding to the frequency fa−$\Delta$ is set in the PLL (S7), and this is left as it is for a certain time (S8). Whether the frequency is locked or not is checked (S9). In a case where the frequency is locked, the VCOn is selected, and the step proceeds to S6. In a case where the frequency is not locked in S9, the VCO(n−1) is selected (S11), and the step proceeds to S6.

As shown by the flow, a locking operation is performed twice so as to judge which VCO is appropriate. That is, it is necessary to lock the frequency with a VCO actually used after determining the VCO.

Generally, a time the PLL takes to lock the frequency becomes shorter as the comparative frequency becomes higher. Thus, the comparative frequency is increased only twice at which locking operations are performed so as to select the VCO, so that it is possible to shorten a time taken to select the frequency. Although the increase in the comparative frequency causes the aforementioned frequency resolution to be rough, this is sufficient to select the VCO.

Figure 16:
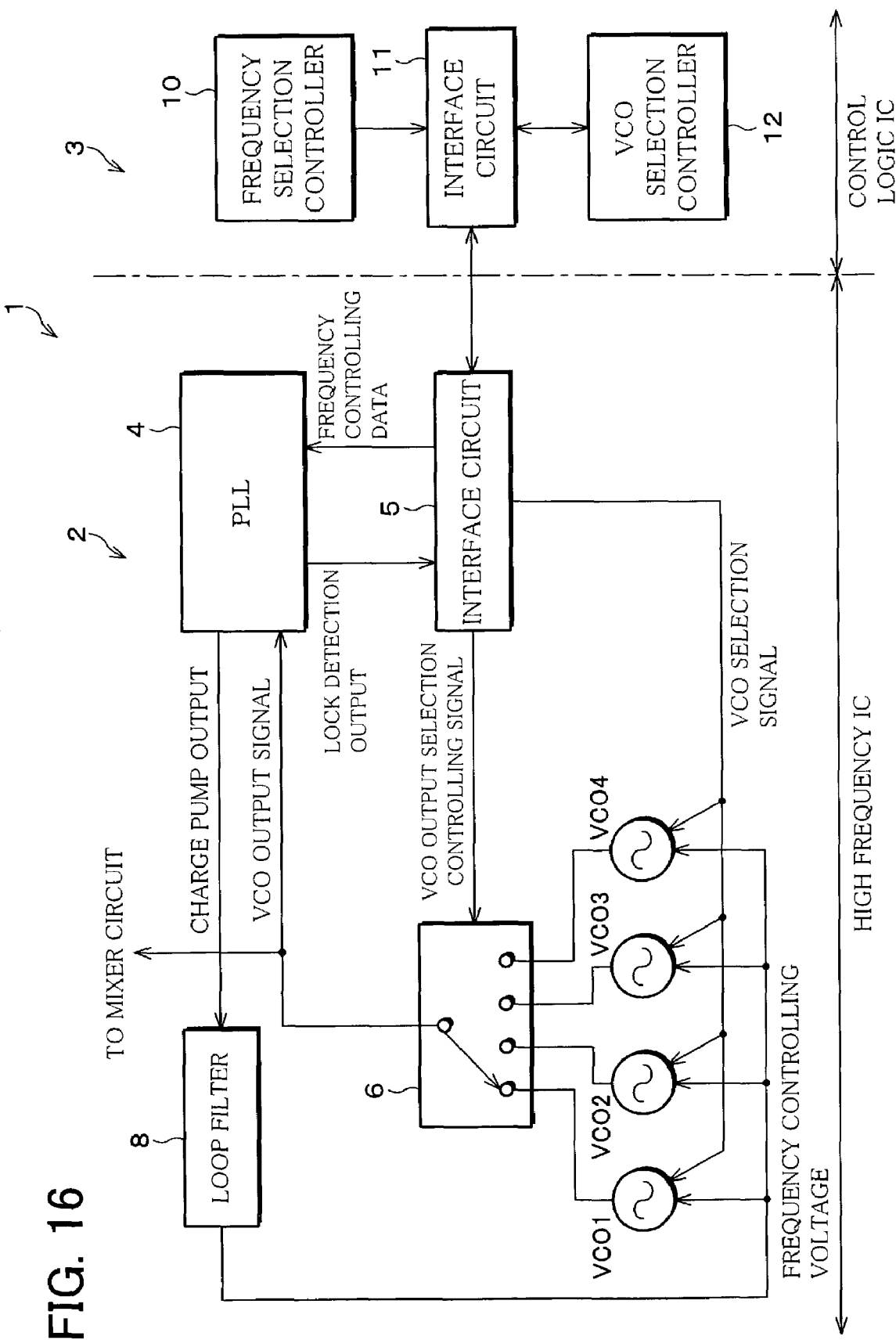
FIG. 16 is a block diagram schematically showing an example of how the PLL synthesizer is arranged.

Note that, in a block diagram of FIG. 2, the flow is controlled by the VCO selection controller 7 (logic circuit) in the high frequency IC. Forming the logic circuit by using the high frequency IC causes the following demerit: a price for an area is generally higher compared with a case where the logic circuit is arranged by using a logic-only IC, and there is a case where an area per one gate is large according to the IC process, so that a price becomes higher. In this case, as shown in FIG. 16, it is also possible to internally provide the VCO selection controller 7 on the side of the control logic IC.

[Embodiment 2]

Next, description is given on another method for confirming the coverage of the frequency by using the lock output of the PLL in a case of judging whether the selected VCO is appropriate or not.

That is, the VCOs have common frequency ranges so that the frequency ranges have the succession, so that a wide band VCO provided in the integrated circuit is realized. In this case, means for compensating the shift of the absolute frequency brought about by the dispersion in the element constant is devised. As the compensating method, the variable range of the MOS varactor that is a variable capacitance element is set as follows: an upper limit or a lower limit of the variable range is determined, or the upper limit and the lower limit of the variable range are determined upon compensating, and the locking condition of the PLL at the desired frequency is detected, so that the selection of the respective VCOs influenced by the dispersion of the absolute frequency is compensated.

Figure 17:
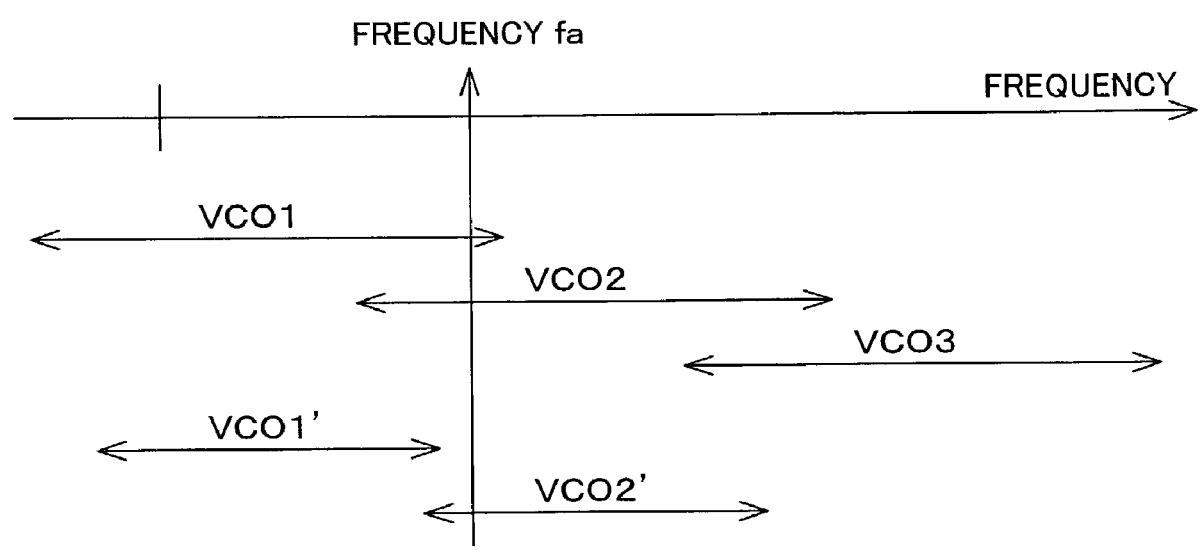
FIG. 17 is a diagram showing a process for confirming coverage of the frequency.

Here, it is assumed that: whether or not the oscillation frequency of the VCO2 in FIG. 17 sufficiently covers the desired frequency fa is confirmed. In this example, the oscillation frequency variable range of the VCO2 is temporarily narrowed (VCO2'), and whether the PLL locks or not under this condition is confirmed. When it is confirmed that the PLL locks the frequency, this means that: the narrower the oscillation frequency variable range becomes, the more sufficiently the frequency variable range is secured. In this case, the confirmation of the locking is performed only one time for the frequency fa.

Figure 18:
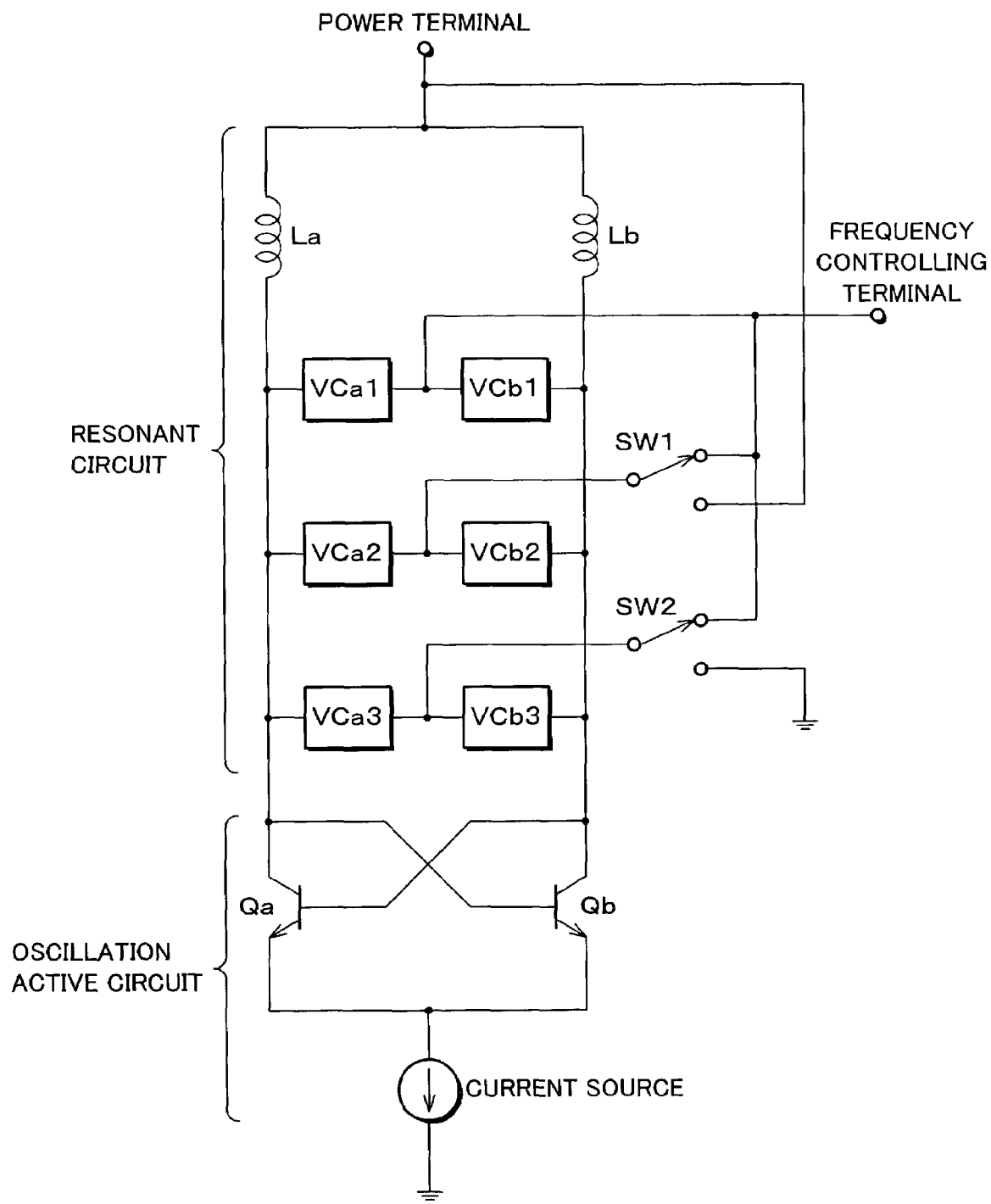
FIG. 18 is a circuit diagram showing an example of how the VCO having a switching function for narrowing the frequency variable range is arranged.

In order to temporarily narrow the frequency variable range of the VCO, the following operation is performed. As described above, FIG. 3 is a circuit diagram of the VCO having the integrated circuit therein. Here, in order to give a switching function for narrowing the frequency variable range of the VCO, as shown in FIG. 18, the variable capacitance elements Vca and VCb are respectively divided into three. A total capacitance of VCa1, VCa2, and VCa3 is equal to VCa. Like this, a total capacitance of VCb1, VCb2, and VCb3 is equal to VCb. Since the variable capacitance element is realized as small variable capacitance elements that are connected to each other in parallel, it is easy to divide them in this manner.

Switches SW1 and SW2 of FIG. 18 are constituted of FET (field effect transistor) for example. In a case where they are provided on the upper side, they are equalized with the circuit of FIG. 3, and the frequency variable range is the same as the case of FIG. 3. Meanwhile, in a case where the switches are positioned on the lower side in the figure, VCa2, VCb2, VCa3, and VCb3 are separated from the frequency control.

A voltage applied to VCa2 and VCb2 is fixed to a voltage of a power terminal. Note that, as long as the voltage corresponds to the upper limit of the frequency, it is not necessary that the voltage is a power source voltage. Thus, the variable width of the frequency that varies downward is restricted. Further, a voltage applied to VCa3 and VCb3 is fixed to a ground potential. Note that, as long as the voltage corresponds to the lower limit of the frequency, it is not necessary that the voltage is the ground potential. Thus, the variable width of the frequency that varies upward is restricted.

Figure 19:
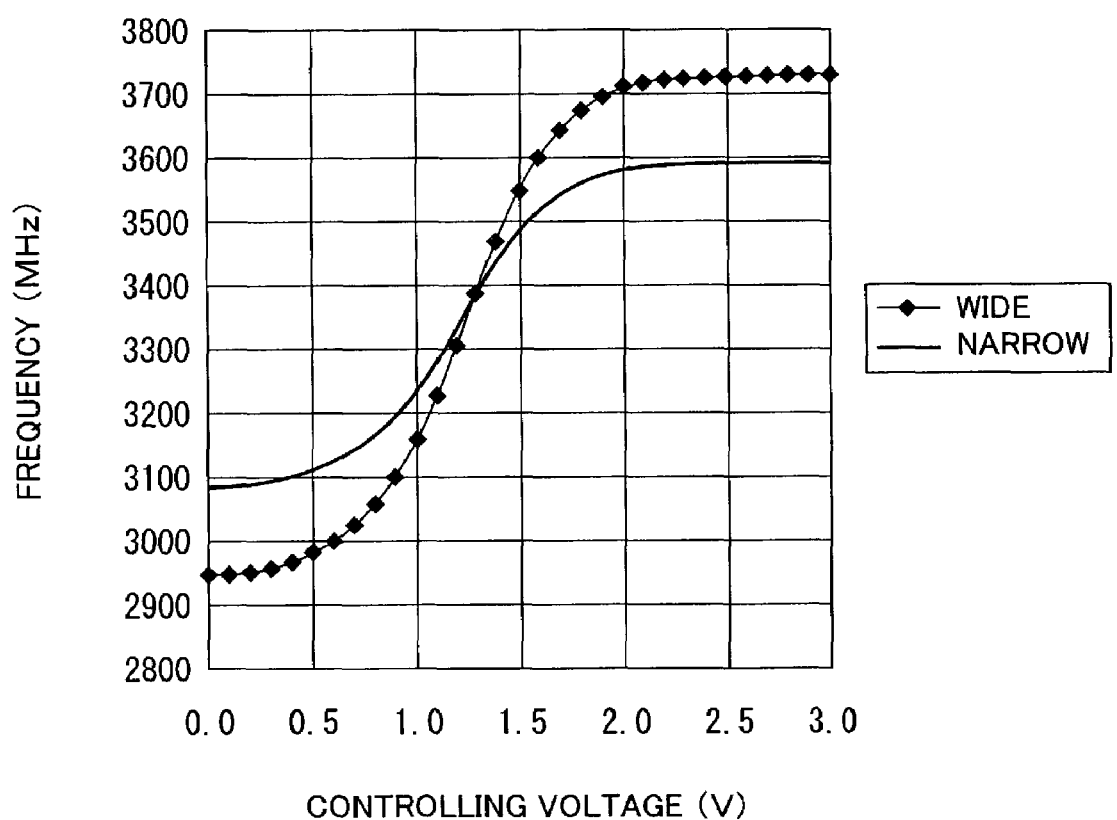
FIG. 19 is a graph showing a relationship between a frequency controlling voltage and the oscillation frequency of the VCO having a switching function for narrowing the frequency variable range.

FIG. 19 shows an example of a frequency of a controlling voltage pair in a case where the frequency variable range is switched.

Figure 20:
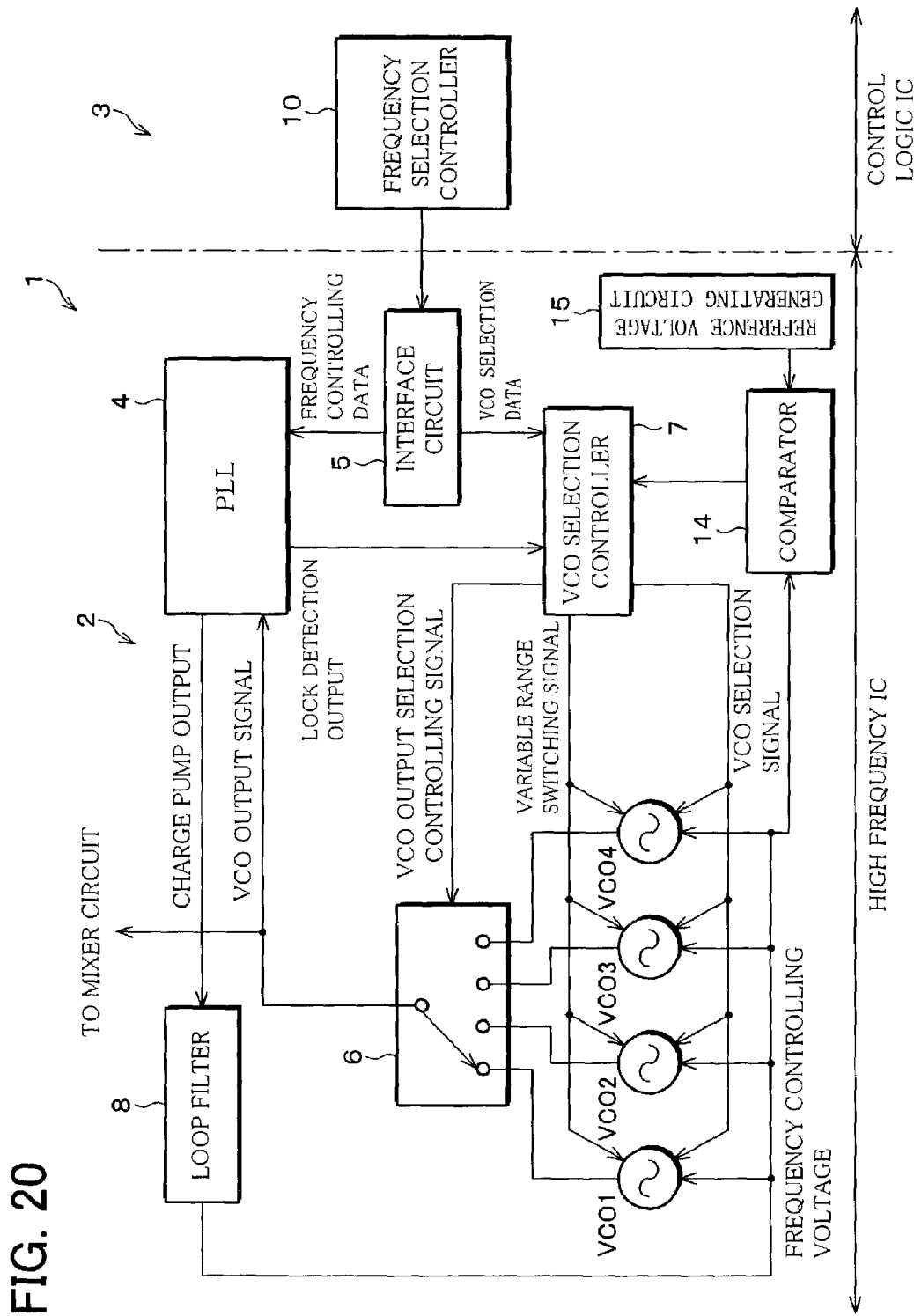
FIG. 20 is a block diagram schematically showing an example of how the PLL synthesizer is arranged.
Figure 21:
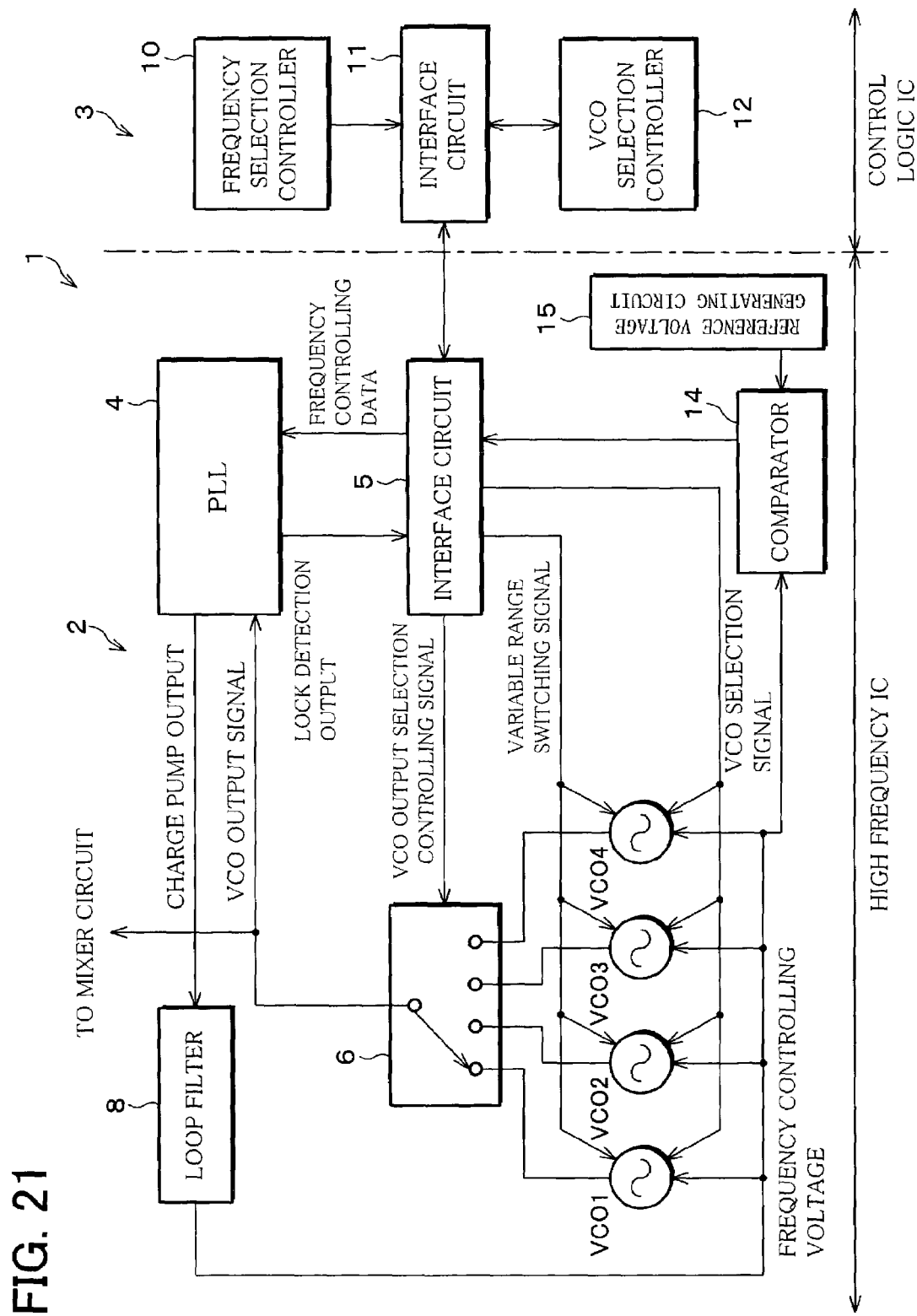
FIG. 21 is a block diagram schematically showing an example of how the PLL synthesizer is arranged.
Figure 23:
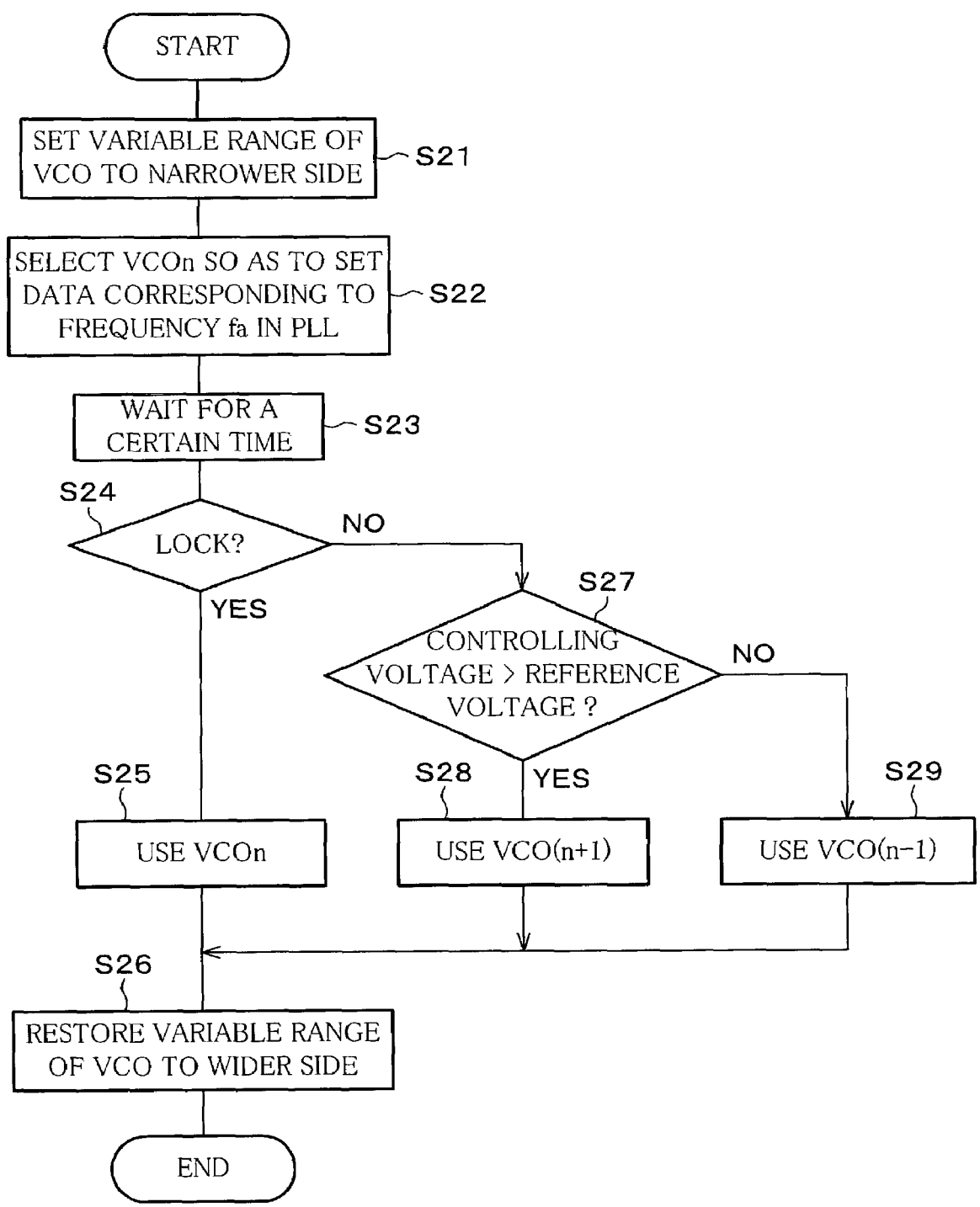
FIG. 23 is a flow chart showing a process in which the VCO is selected.

FIG. 20 and FIG. 21 are block diagrams in this case. FIG. 23 shows a processing flow. The block diagrams are different from FIG. 2 and FIG. 16 in that: the VCO described above is employed, and a variable range switching signal is provided to the VCO, and there are provided (a) a comparator for inputting the frequency controlling voltage of the VCO and (b) a reference voltage generating circuit for generating an input signal applied to the comparator. Like the difference from FIG. 2 and FIG. 16, the diagrams are different from FIG. 20 and FIG. 21 in whether the VCO controller 7 is provided in the high frequency IC2 or is provided in the control logic IC3.

First, the frequency variable range of the VCO is set to the narrower frequency side (S21). The VCOn is selected so as to set information corresponding to the frequency fa in the PLL (S22), and this is left as it is for a certain time (S23). Whether the PLL locks the frequency or not is checked (S24), and in a case where the PLL locks the frequency, the VCOn is selected (S25), and the frequency variable range of the VCO is restored to the wider frequency side (S26). In a case where the PLL does not lock the frequency in S24, the controlling voltage and the reference voltage are compared with each other (S27). In a case where the controlling voltage is larger than the reference voltage, the VCO(n+1) is selected (S28), and the step proceeds to S26. In a case where the controlling voltage is smaller than the reference voltage in S27, the VCO(n−1) is selected (S29), and the step proceeds to S26.

As shown by the flow, the lock of the PLL is judged one time.

A comparator 14 merely judges whether the controlling voltage of the VCO is the largest voltage or the smallest voltage. Thus, the comparator 14 is arranged in a simple manner. That is, step S27 of FIG. 23 shows only the case where the PLL does not lock the frequency (from S24). Thus, when the controlling voltage is larger than a predetermined reference voltage, this means that the controlling voltage is the largest voltage in the VCO (VCOn). Thus, in this case, the VCO(n+1) adjacent to the higher side is used. Likewise, when the controlling voltage is smaller than the reference voltage, this means that the controlling voltage is the smallest voltage in the VCO (VCOn). Thus, in this case, the VCO(n−1) adjacent to the lower side is used.

[Embodiment 3]

Figure 24:
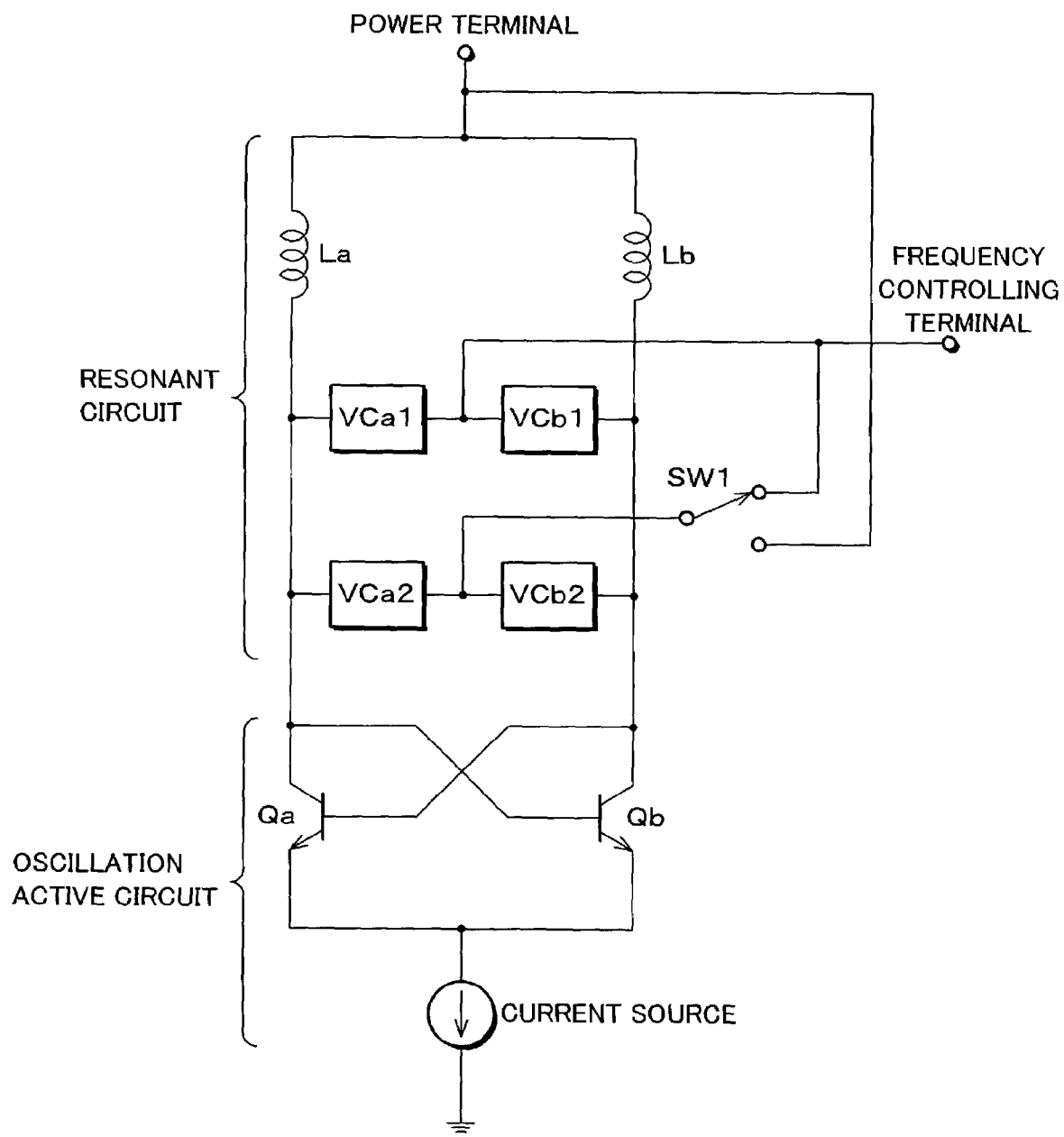
FIG. 24 is a circuit diagram showing an example of how the VCO having the switching function for narrowing the frequency variable range is arranged.
Figure 25:
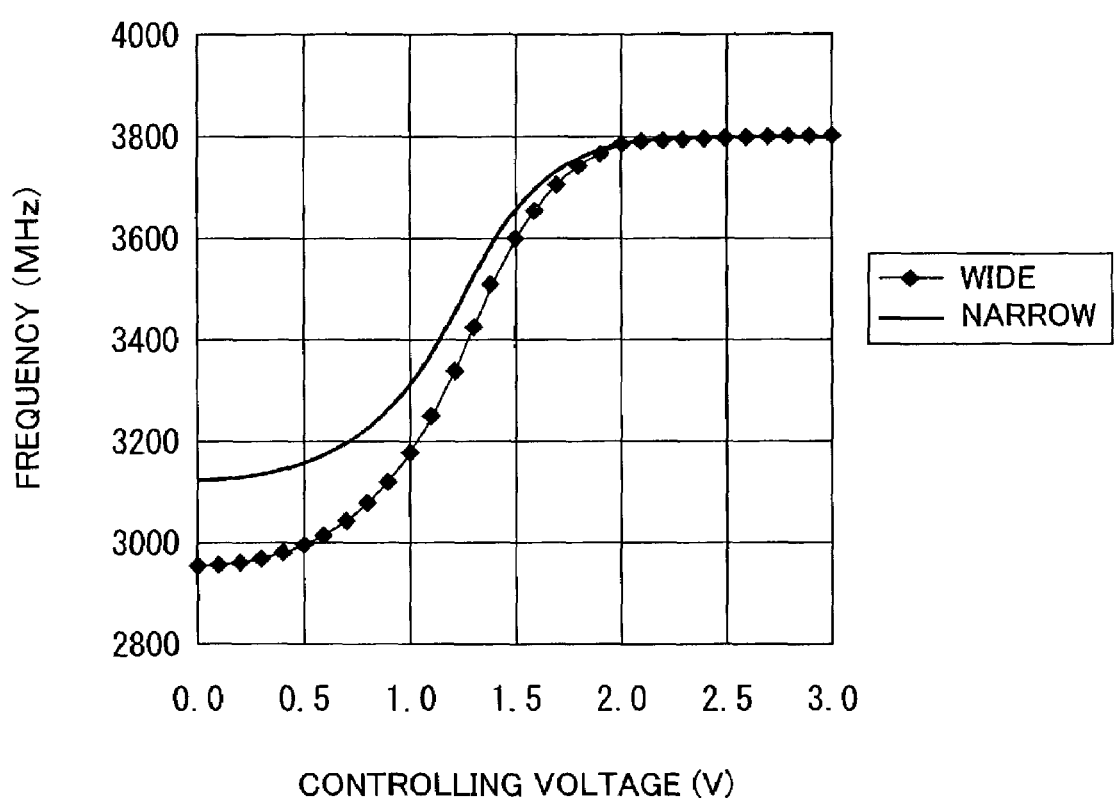
FIG. 25 is a graph showing a relationship between the frequency controlling voltage and the oscillation frequency of the VCO having the switching function for narrowing the frequency variable range.
Figure 26:
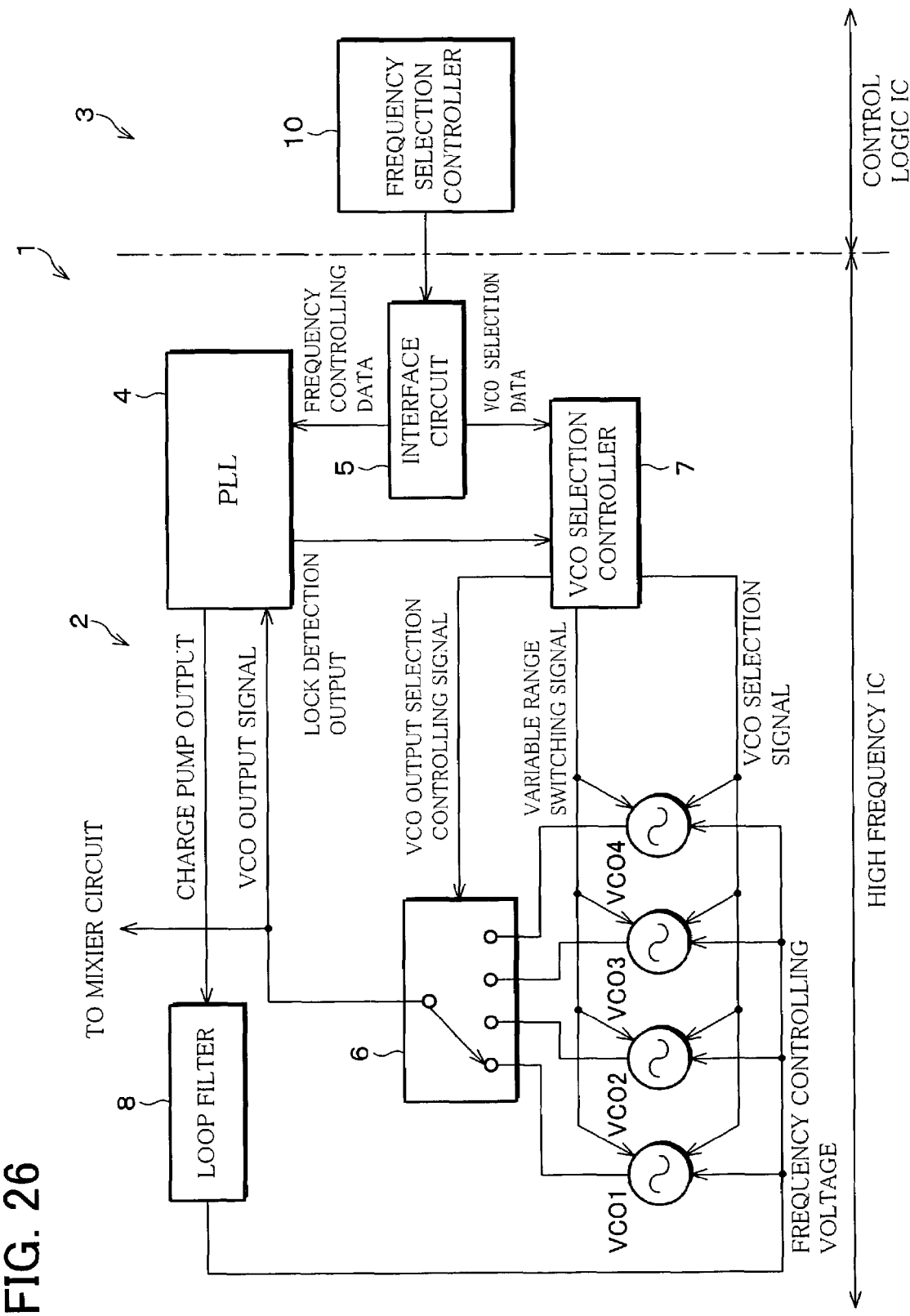
FIG. 26 is a block diagram schematically showing the PLL synthesizer.
Figure 27:
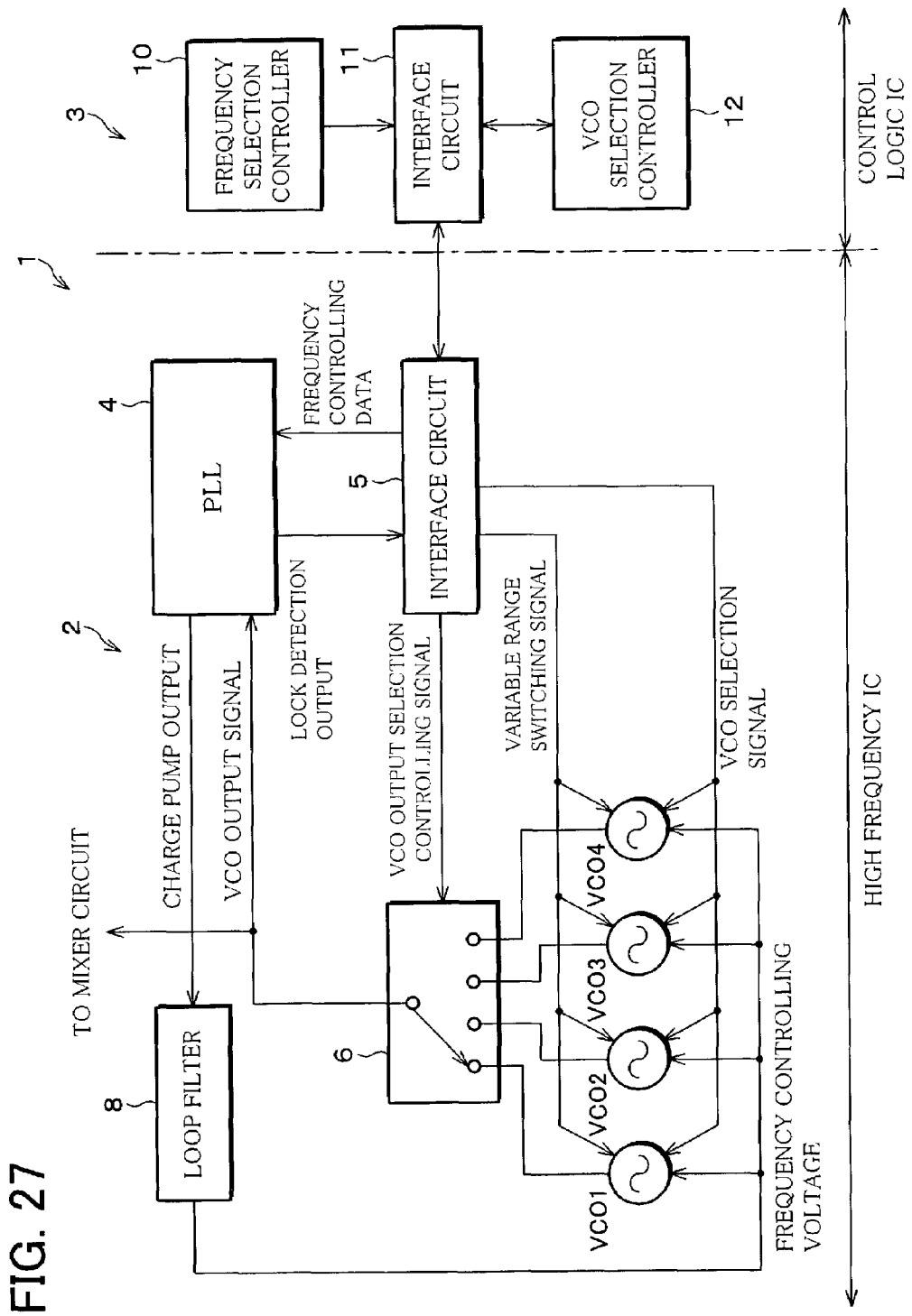
FIG. 27 is a block diagram schematically showing the PLL synthesizer.
Figure 28:
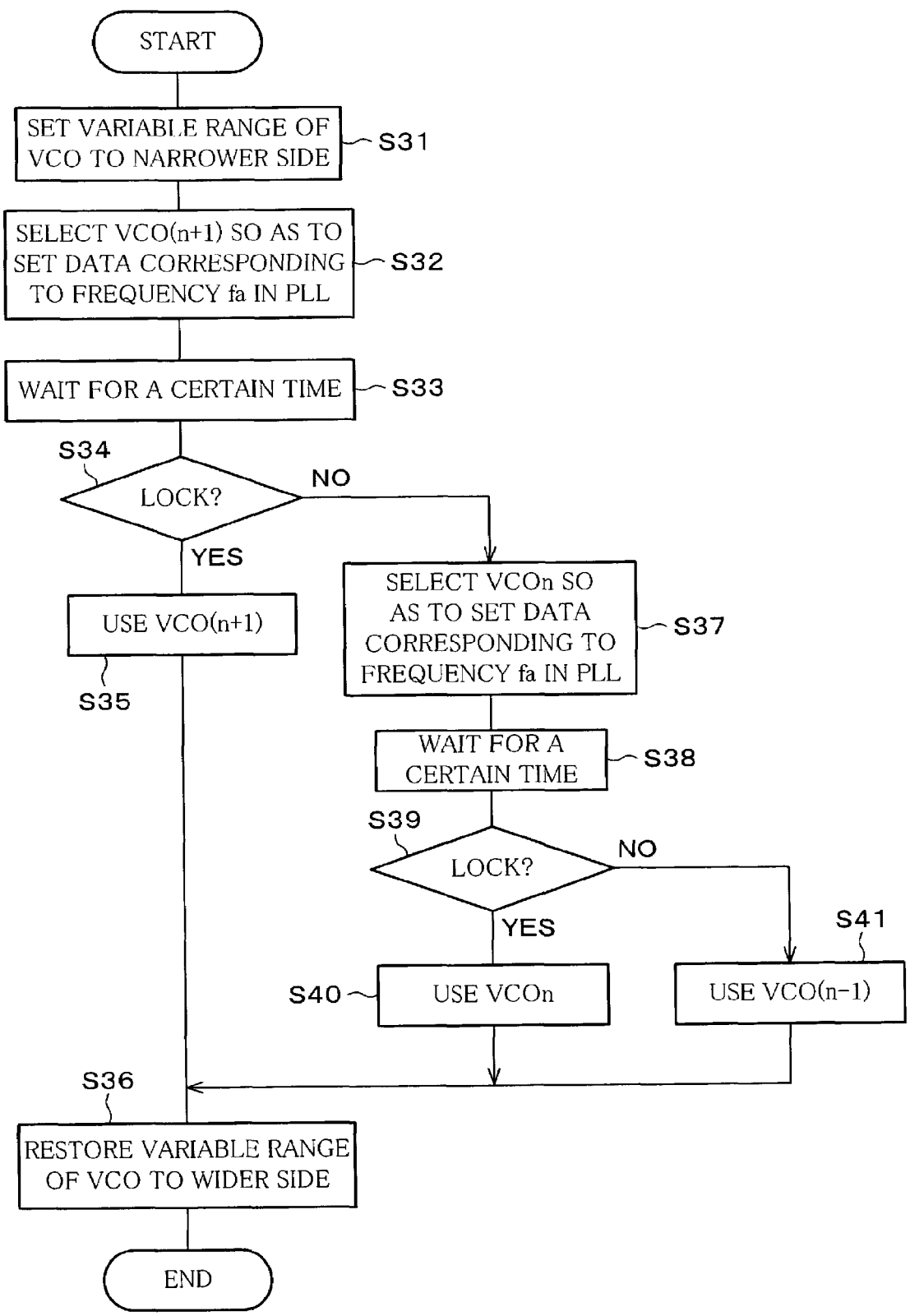
FIG. 28 is a flow chart showing a process in which the VCO is selected.

Next, description is given on an example of using a VCO which has a switching function for not narrowing the frequency variable range of the VCO at an upper side and a lower side of the frequency, but narrowing only one side. FIG. 24 shows a circuit diagram of the VCO. Compared with the VCO of FIG. 18, the number of the divided variable capacitance elements for controlling is decreased, and the switches are not provided. FIG. 25 shows an example of a characteristic of the controlling voltage pair and the frequency of the VCO. Further, FIG. 26 and FIG. 27 show block diagrams. The figures are different from FIG. 20 and FIG. 21 in that there are not provided the comparator and the reference voltage generating circuit. Like FIG. 2 and FIG. 16, the figures are different from FIG. 26 and FIG. 27 in whether the VCO selection controller 7 is provided in the high frequency IC2 or is provided in the control logic IC3. FIG. 28 shows a processing flow.

Although the VCO is simplified, it is necessary to perform the locking twice. Compared with the arrangement of FIG. 18, it takes a certain time to select an appropriate VCO.

First, the frequency variable range of the VCO is set to the narrower frequency side (S31). The VCO(n+1) is selected so as to set information corresponding to the frequency fa in the PLL (S32), and this is left as it is for a certain time (S33). Whether the PLL locks the frequency or not is checked (S34). In a case where the PLL locks the frequency, the VCO(n+1) is selected (S35), and the frequency variable range of the VCO is restored to the wider frequency side (S36). In a case where the PLL does not lock the frequency in S34, the VCOn is selected so as to set information corresponding to the frequency fa in the PLL (S37), and this is left as it is for a certain time (S38). Whether the PLL locks the frequency or not is checked (S39). In a case where the PLL locks the frequency, the VCOn is selected (S40), the step proceeds to S36. In a case where the PLL does not lock the frequency in S38, the VCO(n−1) is selected (S41), and the step proceeds to S36.

The following is more detail description on a compensating algorithm in a case where only the lower limit is set as described above. Note that, the following description is applicable to a case where only the upper limit is set. Further, by setting the upper and lower limits at the same time, it is possible to reduce the number of times of the loop detection. However, in terms of a balance between a processing time required in compensating and a total area including the switching circuit for switching the controlling voltage to the variable capacitance element, the case where only the lower limit is employed is described here.

Figure 29:
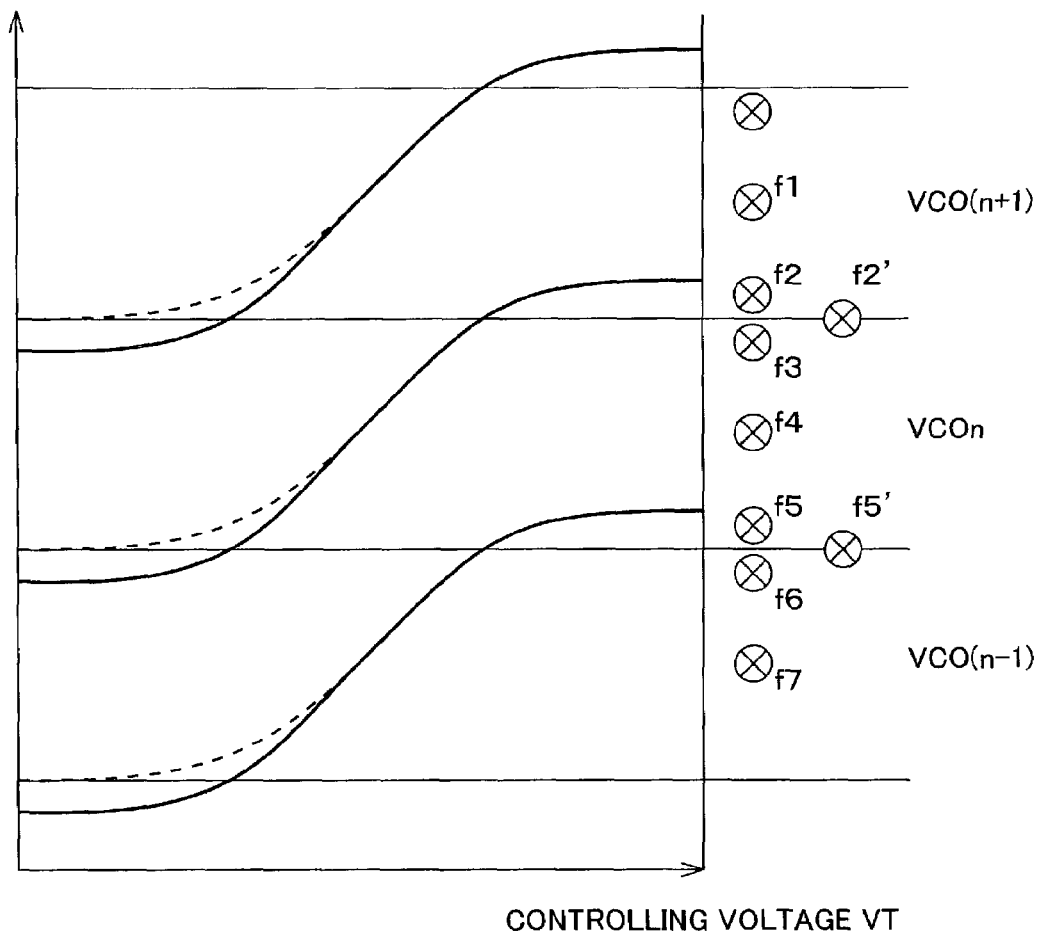
FIG. 29 is a diagram showing how the VCO is selected.

In FIG. 29, a continuous line shows the case where there is not limit, and a broken line shows the case where there is a limit.

In FIG. 30, "○" shows that the set frequency is locked by the selected VCO, and "X" shows that the set frequency is not locked by the selected VCO. As shown in the figure, when the frequency (BAND) is f1, the frequency is locked by the VCO(n+1), and the frequency is not locked by the VCOn and VCO(n−1). Thus, the VCO(n+1) is selected.

When the frequency is f2 or f2', the frequency is locked by either the VCO(n+1) or the VCOn, and the frequency is not locked by the VCO(n−1). In this case, VCO (n+1) is selected. That is, the frequency is locked by the VCO(n+1) regardless of setting the lower limit as described above. This means that the frequency is locked by the VCO(n+1) when the frequency is f2 or f2' also in a case where the limit is cancelled. While, the frequency is locked also by the VCOn, but the frequency f2 or f2' is a value close to an end of the frequency variable range of the VCOn. Thus, under such condition, the VCO(n+1) is selected.

[Embodiment 4]

Figure 31:
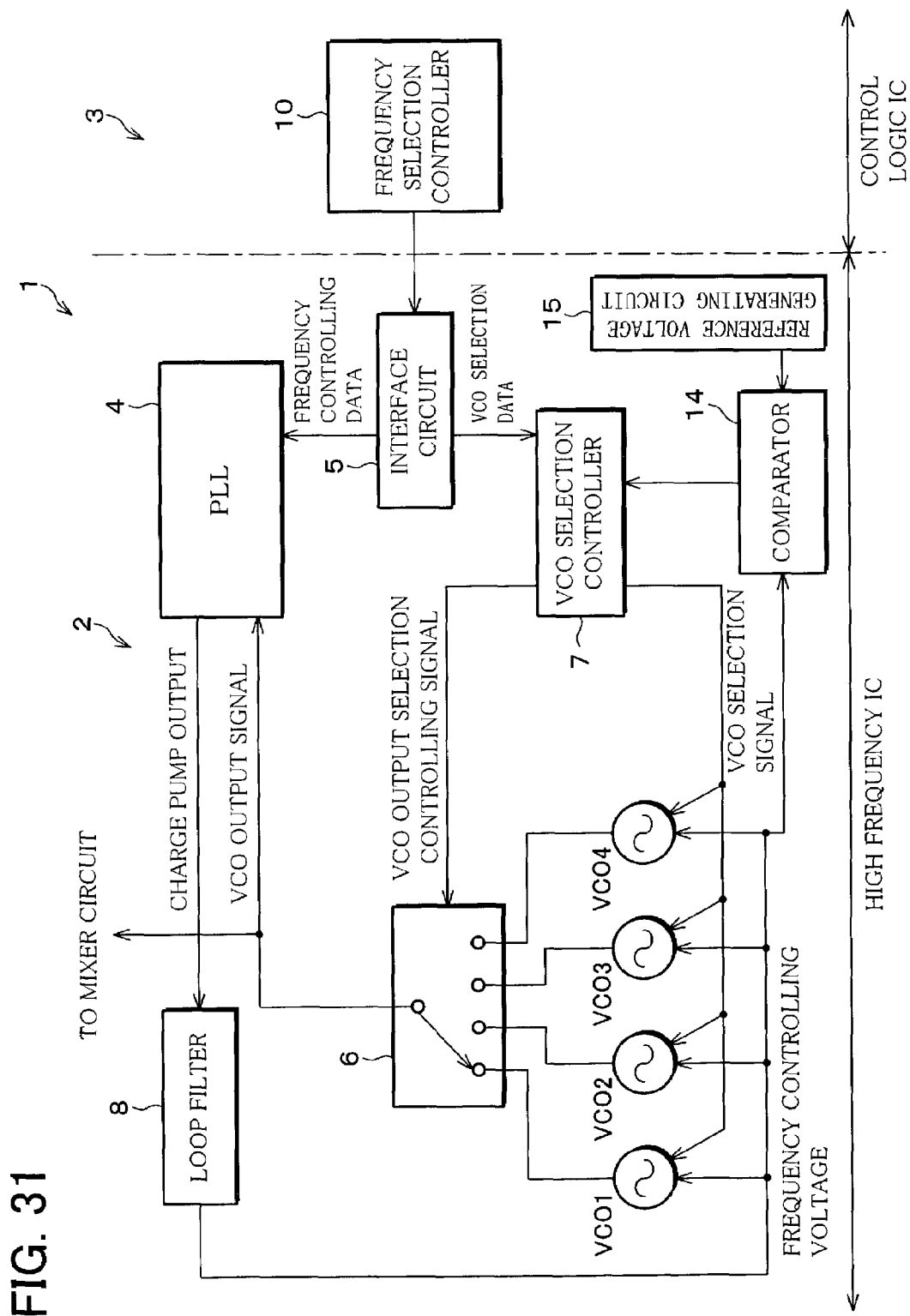
FIG. 31 is a block diagram schematically showing an example of how the PLL synthesizer is arranged.
Figure 32:
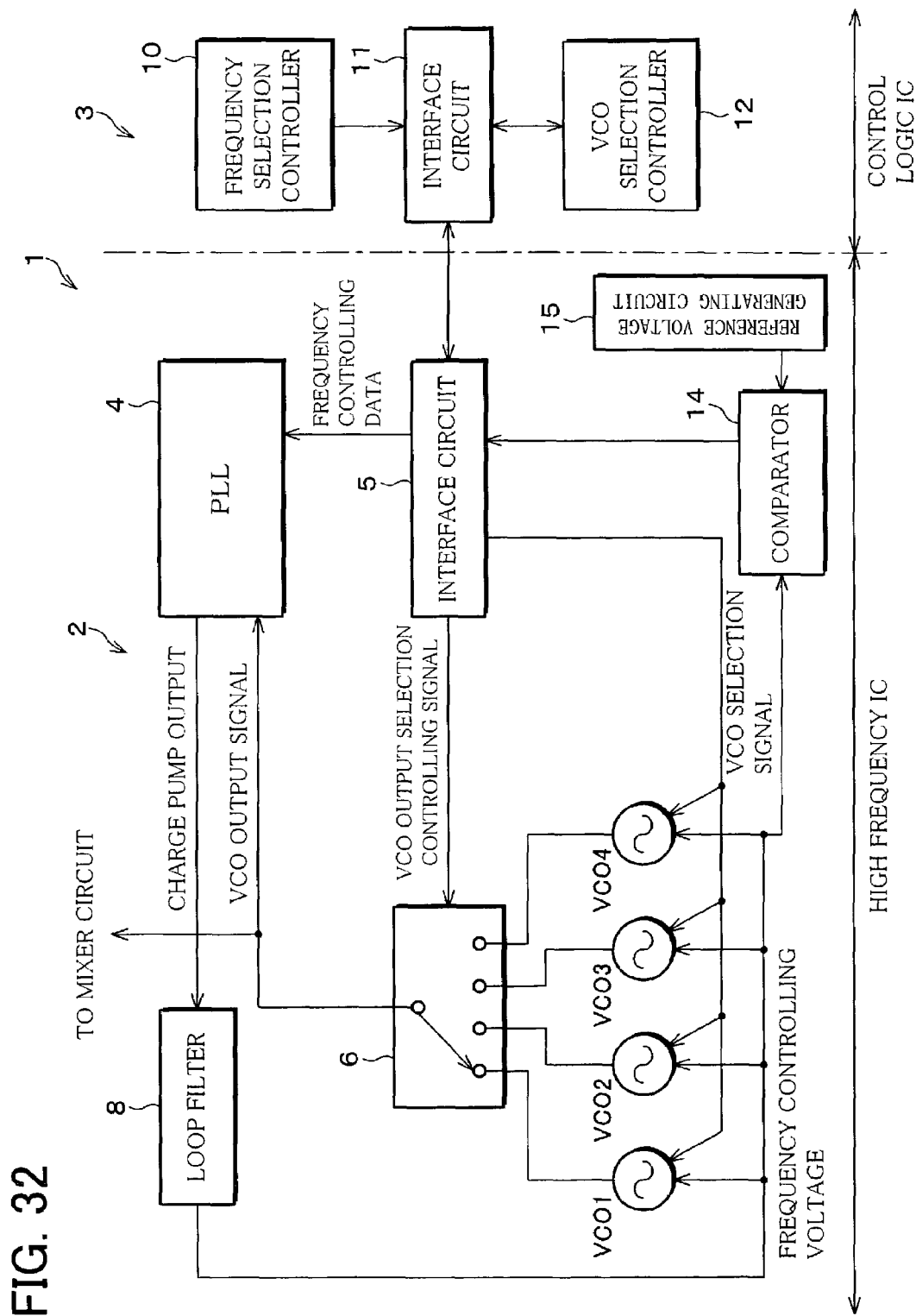
FIG. 32 is a block diagram schematically showing an example of how the PLL synthesizer is arranged.
Figure 33:
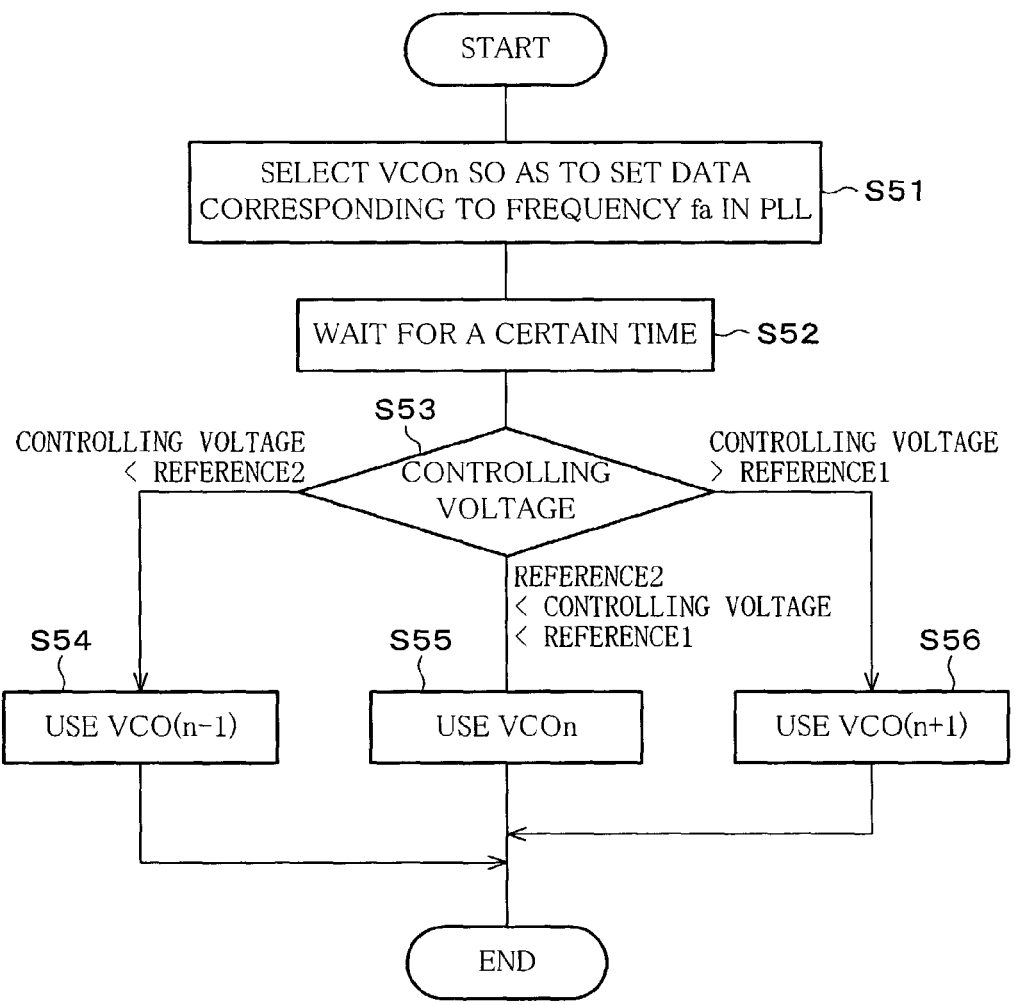
FIG. 33 is a flow chart showing a process in which the VCO is selected.

In the foregoing example, whether the VCO covers a certain frequency or not is confirmed by using the lock output of the PLL. Here, another method is described. FIG. 31 and FIG. 32 show block diagrams. Differences between the foregoing figures and the two diagrams are as in the aforementioned examples. FIG. 33 shows a processing flow.

In order to confirm the coverage, the controlling voltage of the VCO is inputted to the comparator, and whether the controlling voltage is in a certain range or not is judged. The comparator has the functions for (a) confirming whether the controlling voltage is smaller than a lower limit reference voltage (reference 2), (b) confirming whether the controlling voltage is larger than an upper limit reference voltage (reference 1), and (c) judging that a result of the confirmation does not correspond to both the cases, that is, the controlling voltage is between the upper limit and the lower limit.

Figure 22:
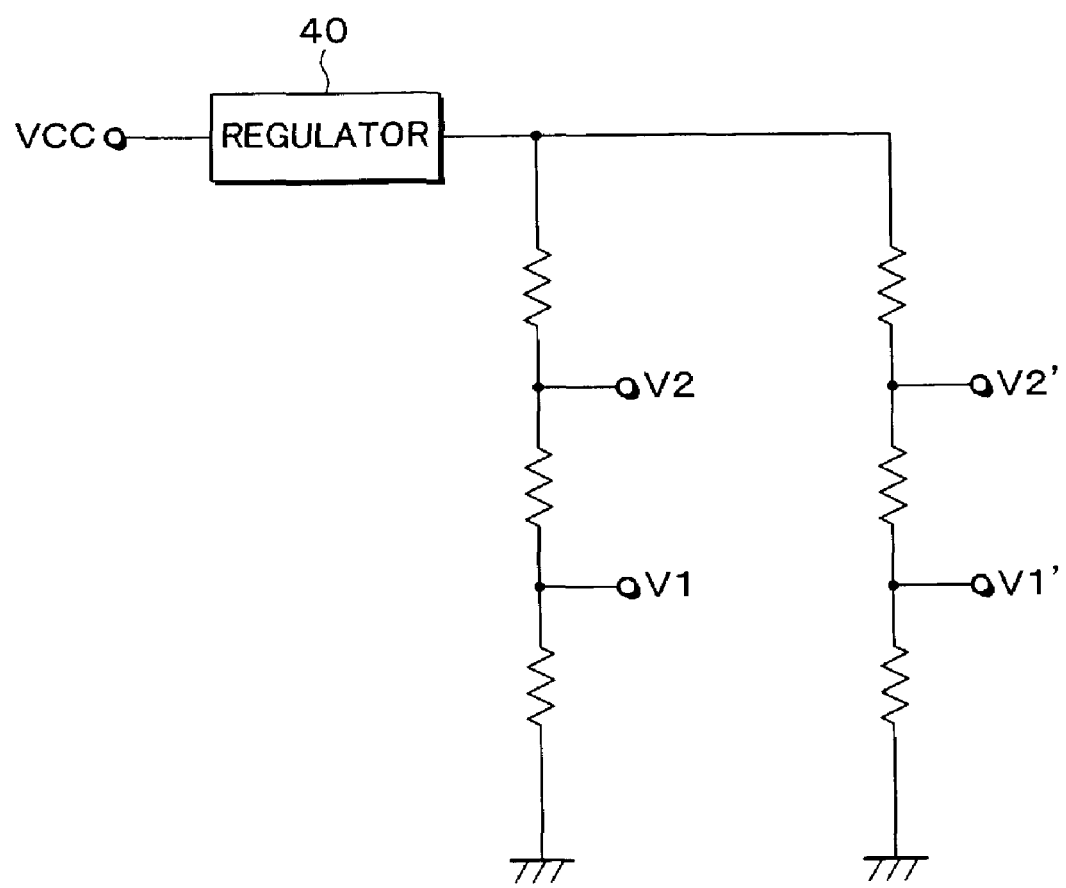
FIG. 22 is a circuit diagram showing an example of how a reference voltage generating circuit is arranged.

Therefore, as the reference voltage inputted to the comparator, a voltage of high accuracy is required. The reference voltage generating circuit, as shown in FIG. 22, can output reference voltages V1 and V2 (further V1' and V2' as required), that are to be inputted to the comparator, from a power source VCC via a regulator, by performing resistance division. In a case of FIG. 5, when the controlling voltage is not less than 0.5V and not more than 2.0V for example, it is judged that the controlling voltage is in a certain range. That is, in this case, V1 (reference 2)=0.5V, V2 (reference 1)=2.0V.

In a case where the frequency controlling voltage is lower than the reference 2, that is, the lower limit reference voltage, the VCO(n−1) is used, and in a case where the frequency controlling voltage is higher than the reference 1, that is, the upper limit reference voltage, the VCO(n+1) is used, and the frequency controlling voltage is between the reference 2 and the reference 1, the VCOn is used.

That is, as shown in FIG. 33, first, the VCOn is selected so as to set information corresponding to the frequency fa in the PLL (S51), and this is left as it is for a certain time (S52). The controlling voltage is compared with the reference voltages (reference 1, reference 2)(S53). In a case where the controlling voltage is smaller than the reference 2, the VCO(n−1) is selected (S54). In a case where the controlling voltage is larger than the reference 2 and smaller than the reference 1, the VCOn is selected (S55). In a case where the controlling voltage is larger than the reference 1, the VCO (n+1) is selected (S56). Note that, in a case where the controlling voltage is equal to the reference 2, either the VCO(n−1) ot the VCOn may be selected. Likewise, in a case where the controlling voltage is equal to the reference 1, either the VCOn or the VCO(n+1) may be selected.

In more detail, the oscillation frequency of the VCO is varied by the frequency controlling voltage. As to a characteristic of the wide frequency in FIG. 25, the oscillation occurs at approximately 3200 MHz when the frequency controlling voltage is 1V, and the oscillation occurs at approximately 3800 MHz when the frequency controlling voltage is 2V. At this time, at a range at which the frequency controlling voltage is not more than 0.5V or not less than 2.0V, even if the voltage varies, there is little variation in the oscillation frequency. That is, at this range, there is little variation in the oscillation frequency with respect to the voltage, that is, voltage sensitivity is little with respect to the frequency, so that the range is such that it takes a certain time for the comparator to lock the frequency, or the PLL does not lock the frequency. That is, the comparator is used to judge whether a range is the unstable range or not, and to compare the frequency controlling voltage and two reference voltages (upper limit and lower limit) that cannot be used as the frequency controlling voltages, and to detect whether the voltage is not more than the lower limit reference voltage or not less than the upper limit reference voltage, and to output a signal by which it is possible to give judgment on the respective voltages.

[Embodiment 5]

In the next example, selection of an appropriate VCO is not performed each time the frequency is selected, but a relationship between the frequency and the VCO is stored in a memory in advance.

Figure 34:
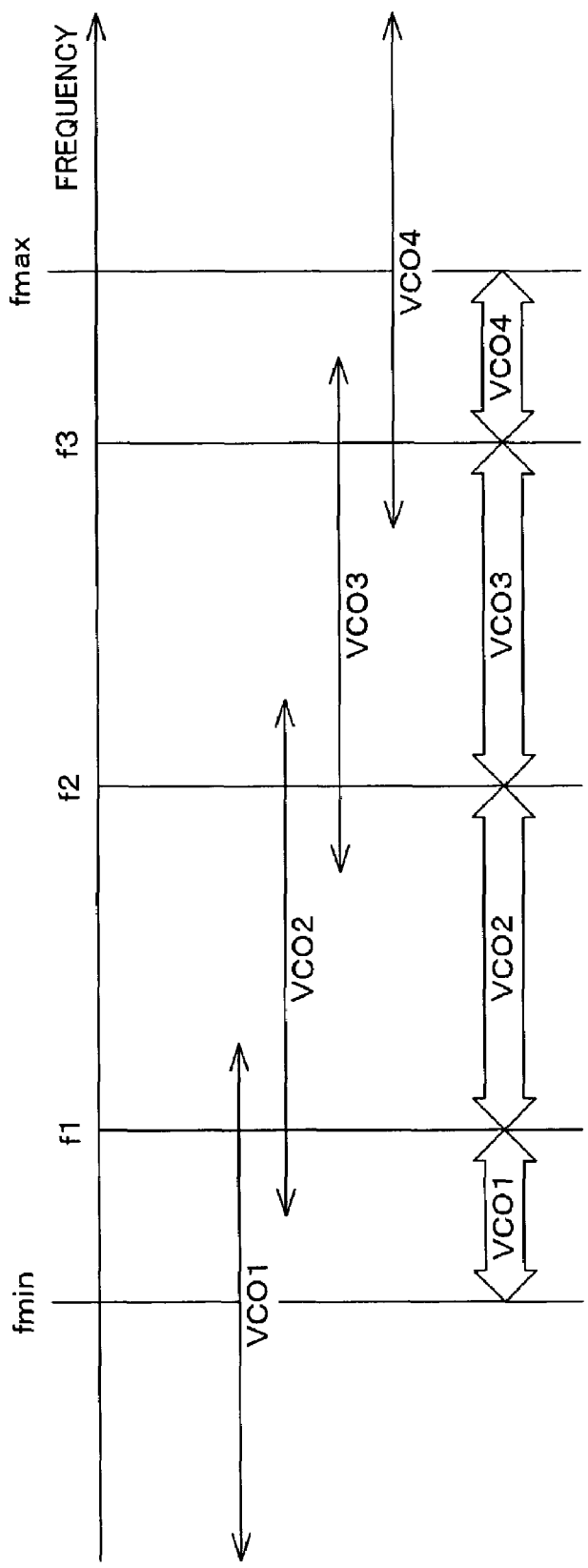
FIG. 34 is a diagram showing the band division and the VCO frequency variable range.
Figure 35:
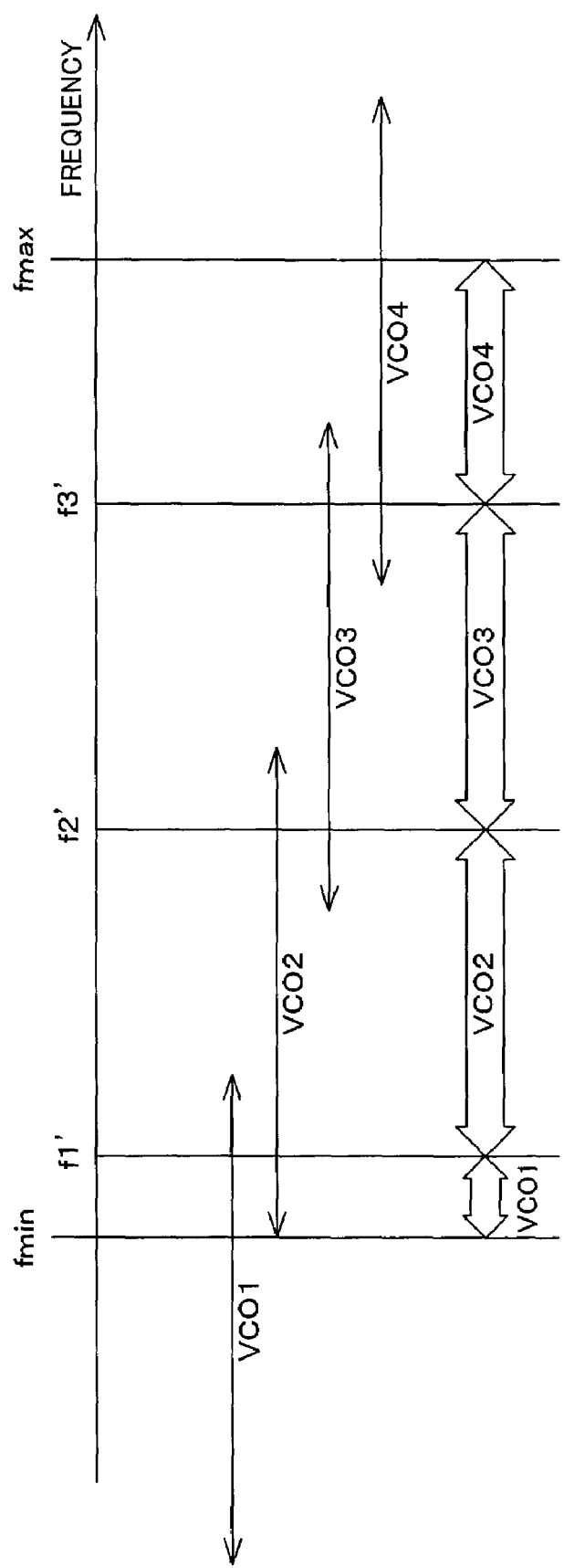
FIG. 35 is a diagram showing the band division and the VCO frequency variable range.
Figure 36:
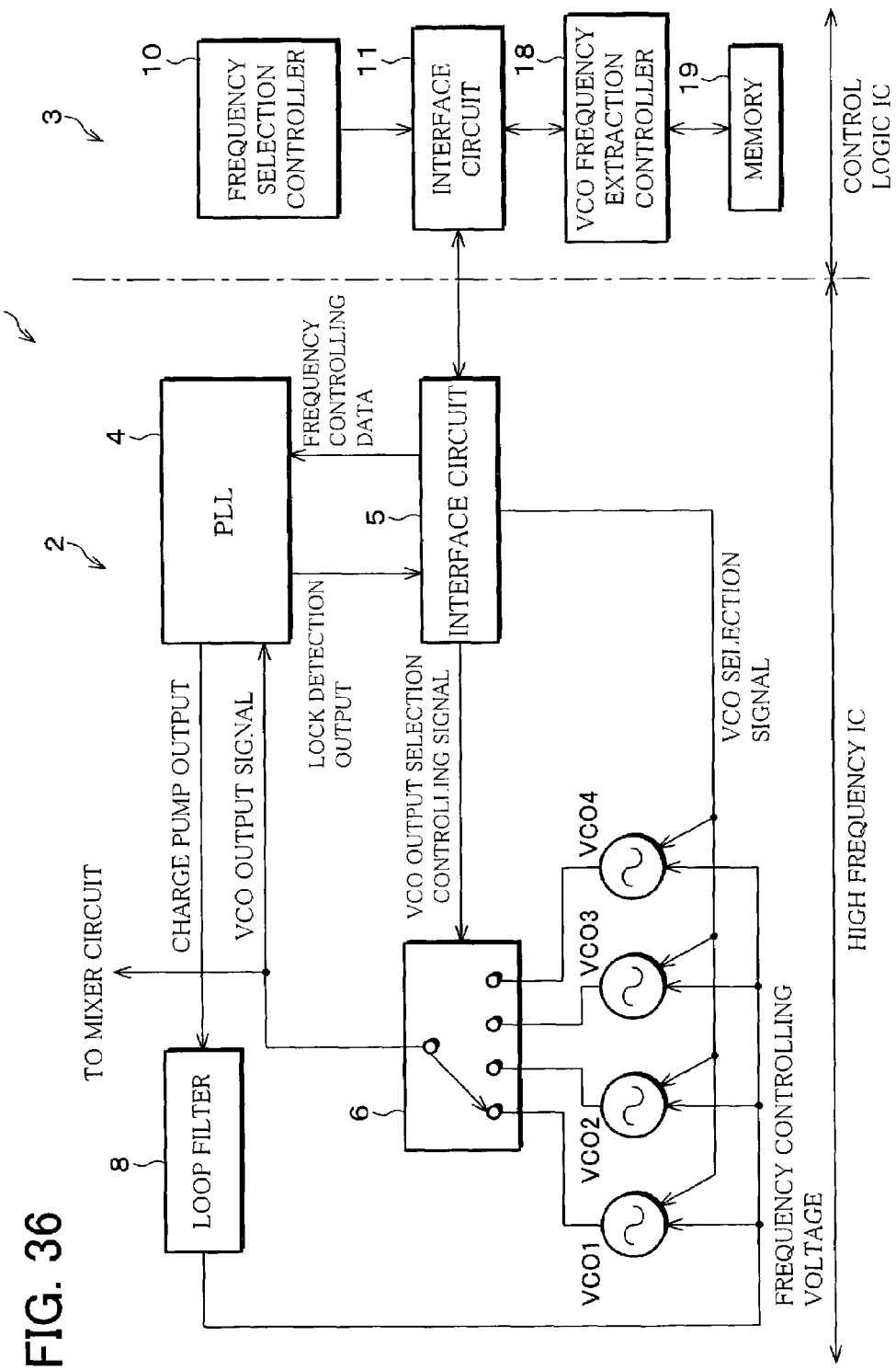
FIG. 36 is a block diagram schematically showing an example of how the PLL synthesizer is arranged.

FIG. 34 and FIG. 35 show examples of how the frequency of the VCO is positioned. FIG. 36 shows a block diagram, and FIG. 37 and FIG. 38 show processing flows.

Figure 37:
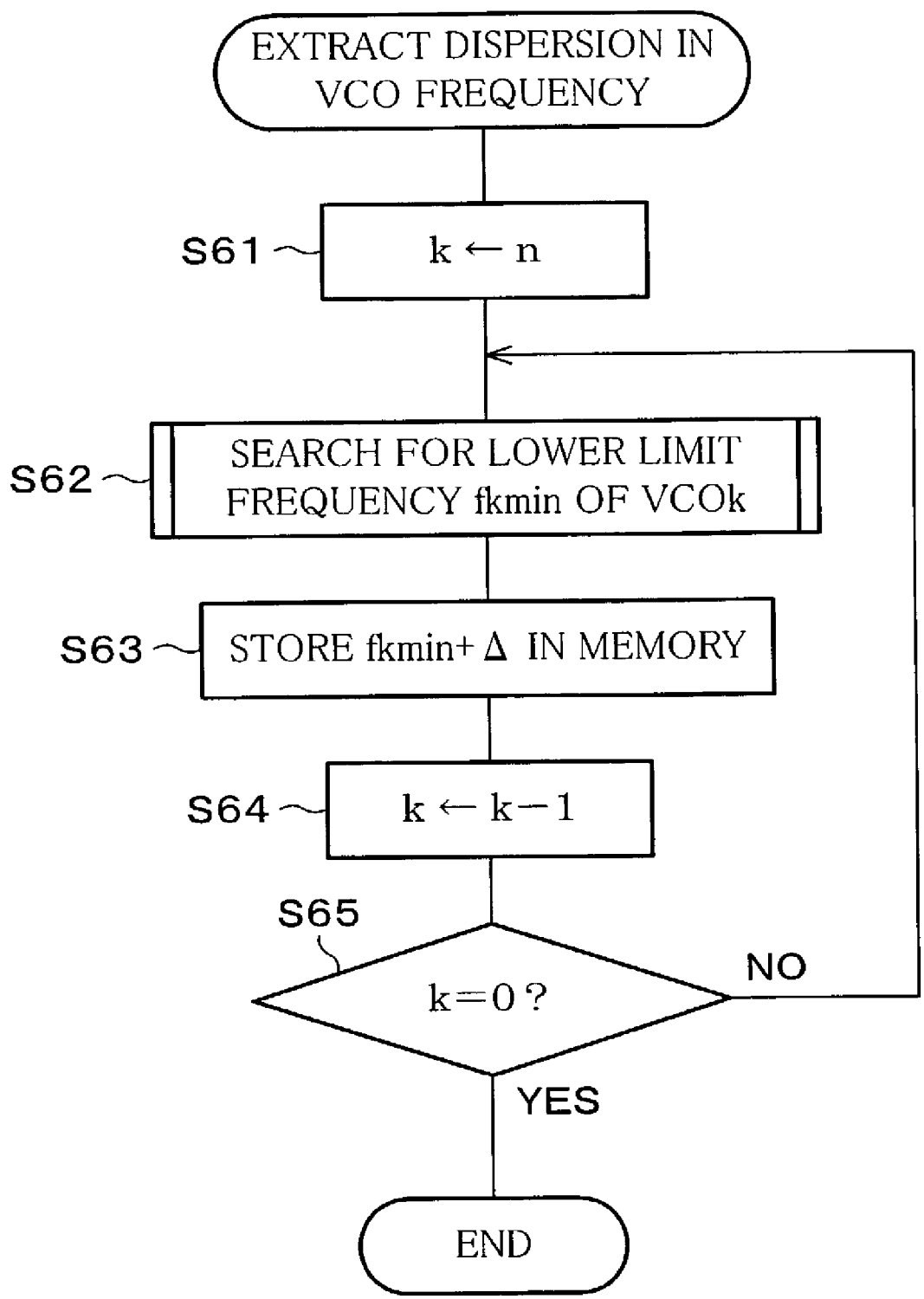
FIG. 37 is a flow chart showing a process in which dispersion in the frequency of the VCO is extracted.

As shown in FIG. 37, in order to extract the dispersion in the frequency of the VCO, first, n is substituted for k (S61). Here, n is the number of VCOs (for example, four VCOs), and k is an integer number not less than 1 and not more than n. The lower limit frequency fkmin of the VCOk is searched for (S62), a value obtained by adding Δ to the found fkmin is stored in the memory (S63). By substituting n−1 for k, the next VCO is focused on (S64), and whether k is 0 or not is checked (S65). When k is 0, extraction of all the VCOs is completed, so that this process is completed. When k is not 0 in S65, VCO that is to be checked remains, so that the step returns to S62.

Figure 38:
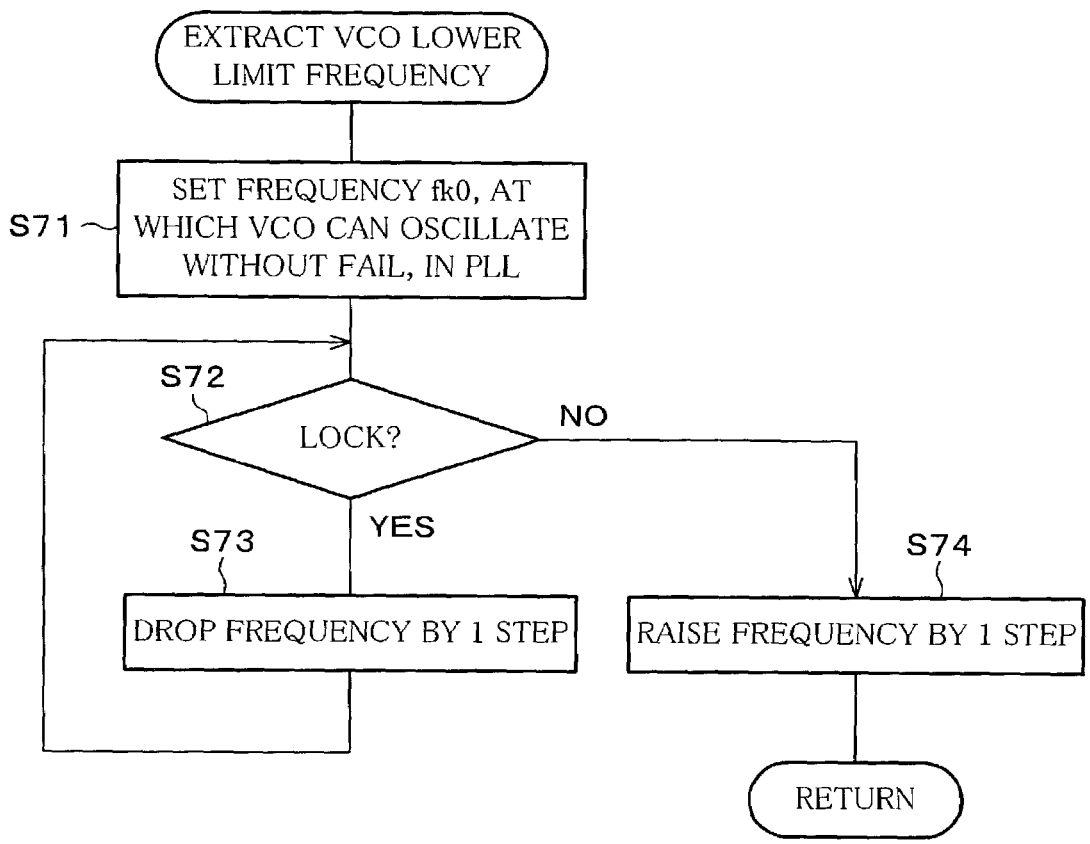
FIG. 38 is a flow chart showing a process in which a lower limit frequency of the VCO is extracted.

The extracting process of the lower limit frequency of the VCO in S62 of FIG. 37 is performed as shown in FIG. 38. That is, a frequency fk0 at which the VCO oscillates without fail is set in the PLL (S71). Whether the PLL locks the frequency or not is checked (S72). In a case where the PLL locks the frequency, the frequency is dropped by 1 step (S73) so as to check whether the PLL locks the frequency or not in S72 again. In a case where the PLL does not lock the frequency in S72, the frequency is raised by 1 step (S74), and the frequency is regarded as the lower limit frequency, so that the process is completed.

It is easier to provide the memory in the control logic IC than to provide it in the high frequency IC.

The VCO1 most appropriately covers a range from fmin to f1. Likewise, the VCO2 most appropriately covers a range from f1 to f2, and the VCO3 most appropriately covers a range from f2 to f3, and the VCO4 most appropriately covers a range from f3 to fmax. The f1, f2, and f3 are calculated in advance. The lower limits of the frequencies of the respective VCOs are calculated with respect to VCO4 to VCO2 in this order. Values obtained by adding a constant value Δ to a lower limit of each VCO are f1, f2, and f3. The value Δ is determined as detailed above. That is, after calculating a lower limit frequency of each VCO, deviation from the set position is calculated in advance. In accordance with a direction and an amount of the deviation, the upper limit frequency is estimated, and an estimated value at which the oscillation frequencies of adjacent VCOs overlap each other is calculated, and a central frequency of a width in which the oscillation frequencies overlap each other is a border of each oscillation frequency area, that is, the central frequencies are f1, f2, and f3.

This operation is performed in a manufacturing step of the receiver, and is stored in a nonvolatile memory, or is stored in a memory when the receiver is turned ON.

When an actual receiving operation is performed, by comparing f1, f2, and f3 with a selected frequency, it is possible to uniquely determine which VCO is to be used. In a case where there are few channels, information of the operation may be stored in a table form indicating a relationship between the channels and the VCOs.

In a process of calculating the lower limit frequency of the VCO, a large number of PLL lock operations are performed. Thus, in this case, it is particularly effective that the comparative frequency of the phase is made high and the lock time is shortened as described above.

[Embodiment 6]

Figure 41:
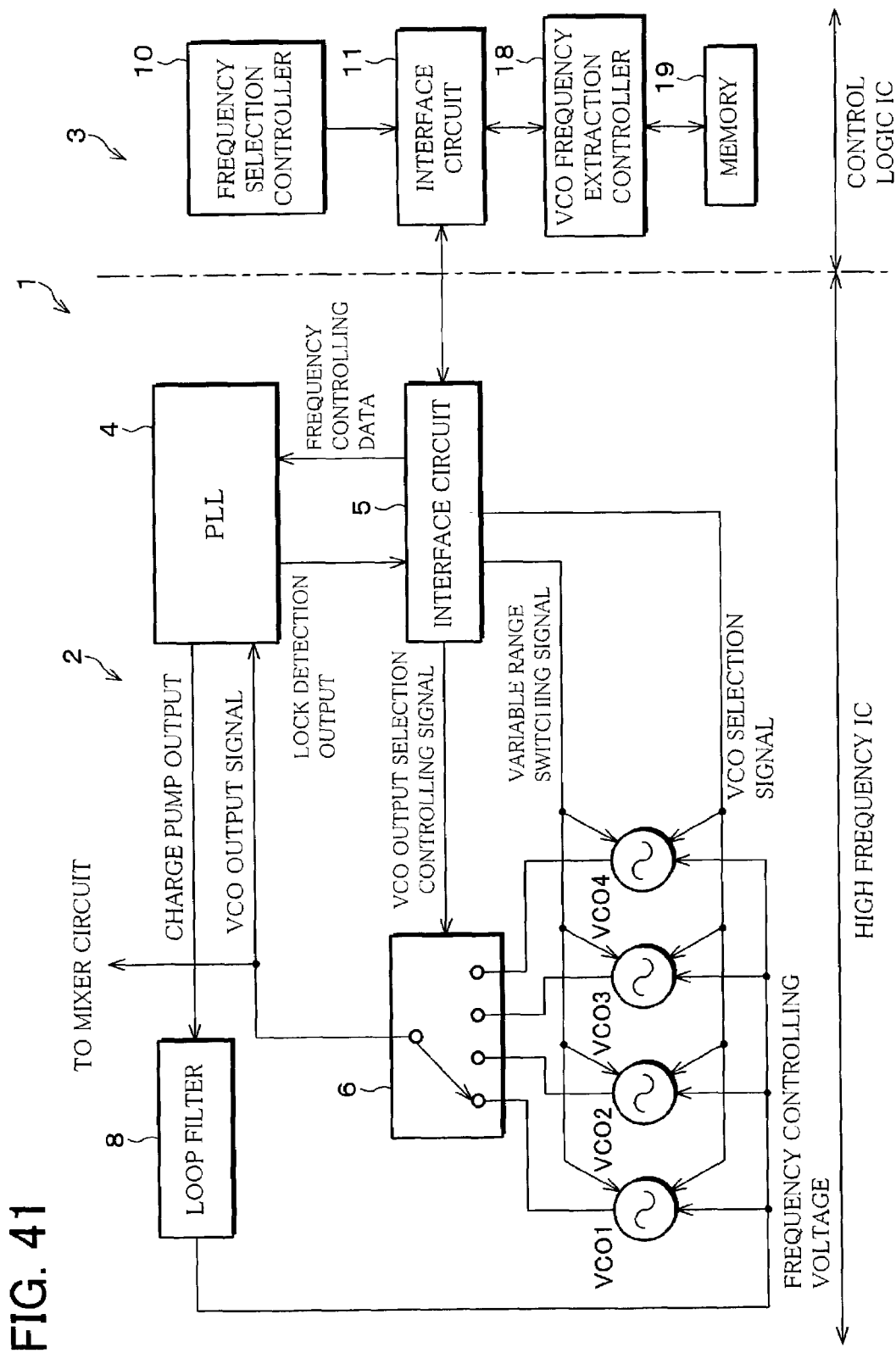
FIG. 41 is a block diagram schematically showing an example of how the PLL synthesizer is arranged.

The next example is the same as the foregoing example in that the relationship between the frequency and the VCO is stored in the memory in advance, but is different from the foregoing example in that, instead of setting Δ, a technique for temporarily narrowing the frequency variable range of the VCO itself is used so as to extract the relationship. Note that, a concrete process is performed in the same manner as in the foregoing description based on FIG. 24 etc., so that description thereof is omitted. FIG. 41 shows a block diagram, and FIG. 42 shows a processing flow.

First, the frequency variable range of the VCO itself is temporarily narrowed so as to begin the flow. As shown in FIG. 42, in order to extract the dispersion in the frequency of the VCO, first, n is substituted for k (S81). Here, n is the number of the VCOs (for example, four VCOs), and k is an integer number not less than 1 and not more than n. The lower limit frequency fkmin of VCOk is searched for (S82), and the found fkmin is stored in the memory (S83). n−1 is substituted for k, so that the next VCO is focused on (S84), and whether k is 0 or not is checked (S85). When k is 0, extraction with respect to all the VCOs is completed, so that the entire operation is completed. When k is not 0 in S85, VCOs that are to be checked remain, so that the step returns to S82. After performing the flow in FIG. 42, the frequency variable range of the VCO itself is returned (is made wider).

Figure 42:
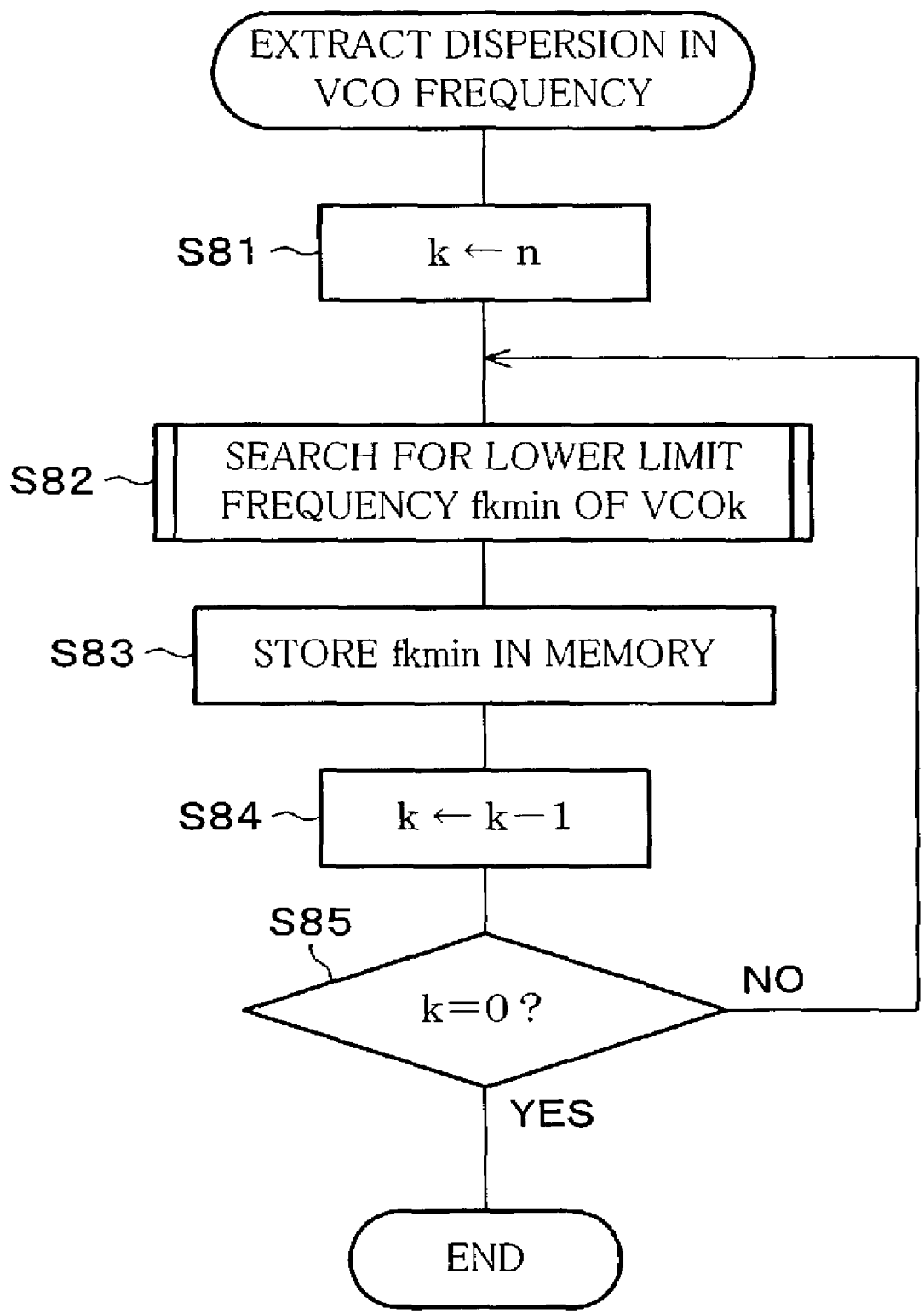
FIG. 42 is a flow chart showing a process in which dispersion in the frequency of the VCO is extracted.
Figure 43:
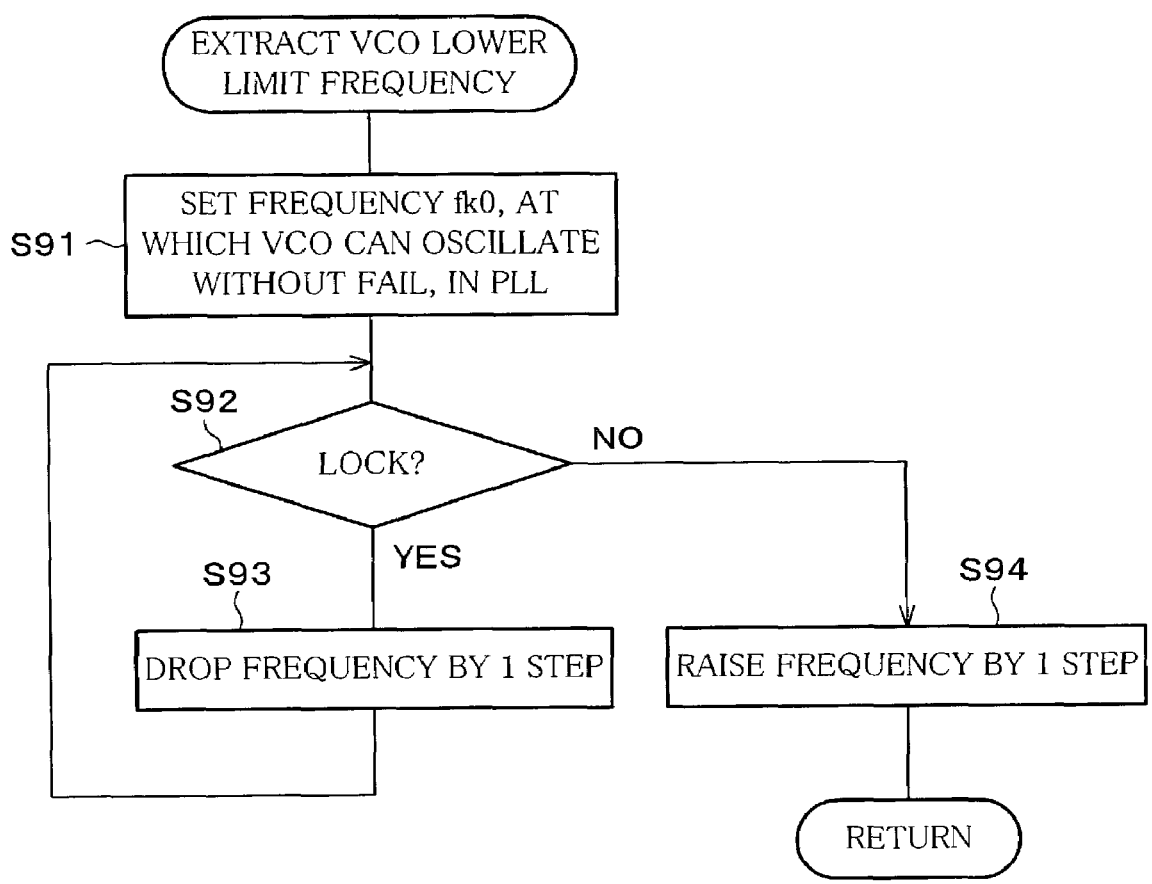
FIG. 43 is a flow chart showing a process in which a lower limit frequency of the VCO is extracted.

The extracting process of the lower limit frequency of the VCO in S82 shown in FIG. 42 is performed as shown in FIG. 43. That is, the frequency fk0, at which the VCO can oscillate without fail, is set in the PLL (S91). Whether the frequency is locked or not is checked (S92). In a case where the frequency is locked, the frequency is dropped by 1 step (S93) so as to check again whether the frequency is locked or not in S92. In a case where the frequency is not locked in S92, the frequency is raised by 1 step (S94), and the frequency is regarded as the lower limit frequency, and the process is completed.

Figure 39:
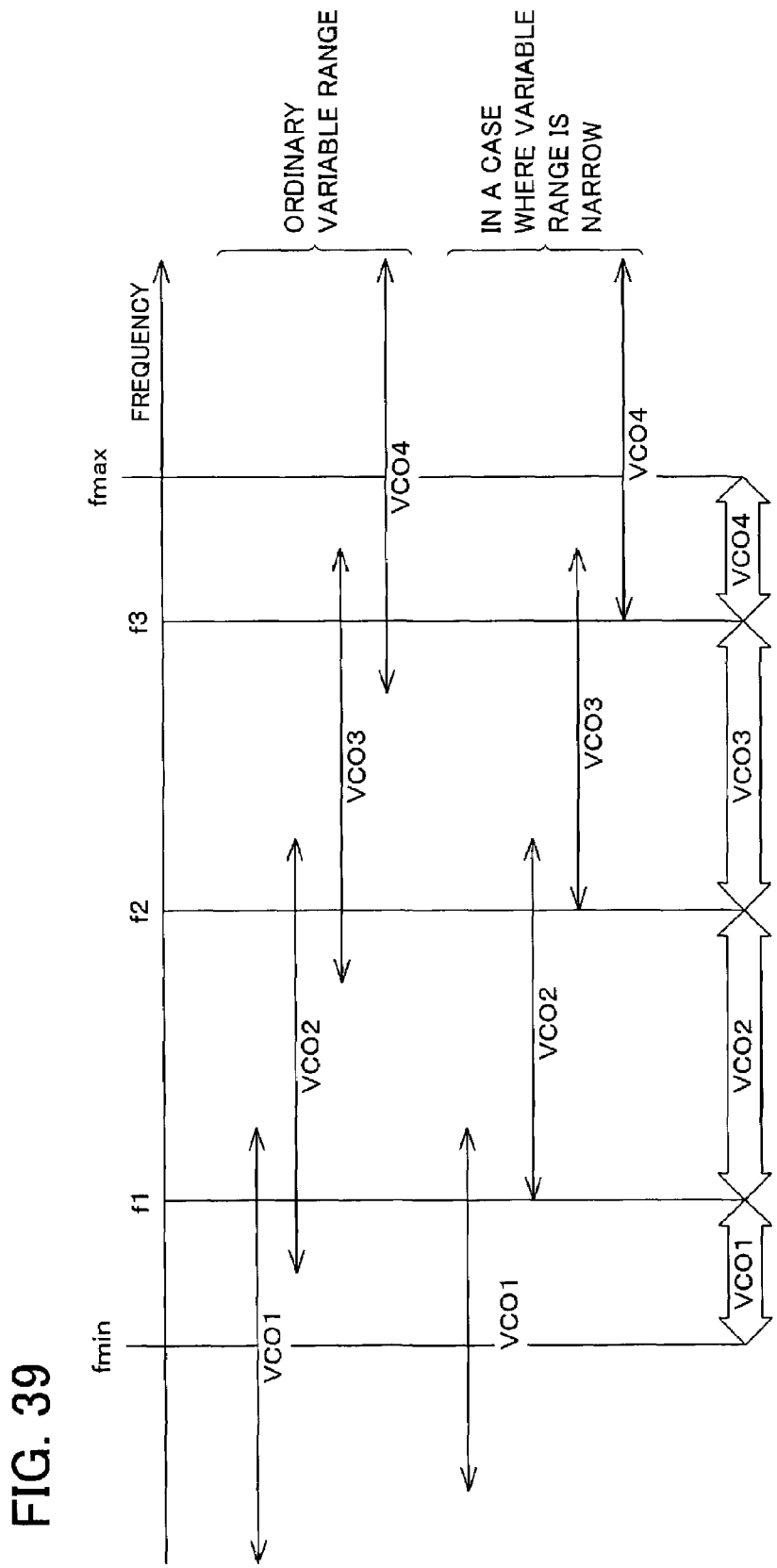
FIG. 39 is a diagram showing the band division and the oscillation frequency variable range.
Figure 40:
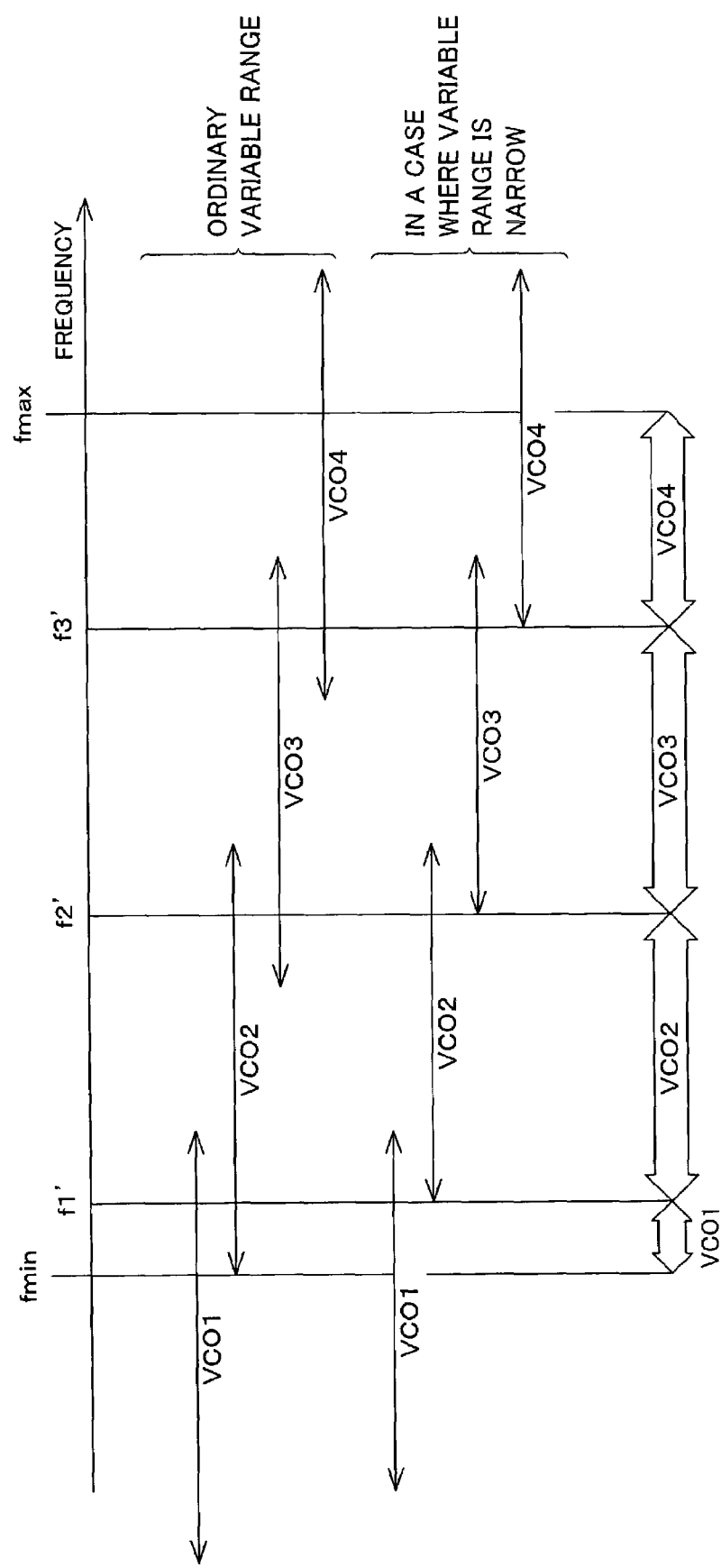
FIG. 40 is a diagram showing the band division and the oscillation frequency variable range.

FIG. 39 and FIG. 40 show examples of how the frequency of the VCO is disposed. FIG. 39 shows a case where the frequency does not shift, and FIG. 40 shows a case where the frequency shifts in a lower direction. Each figure shows a case of an ordinary frequency variable range (upper stage) and a case where the frequency variable range is narrow, that is, the frequency is temporarily switched to the narrower frequency side (lower stage) in parallel. The frequencies corresponding to the lower limits of the frequency variable ranges in a case where the frequency variable ranges are temporarily switched to the frequency lower side are border frequencies f1, f2, and f3. Thus, it is possible to obtain the border frequencies more steadily.

[Embodiment 7]

Figure 46:
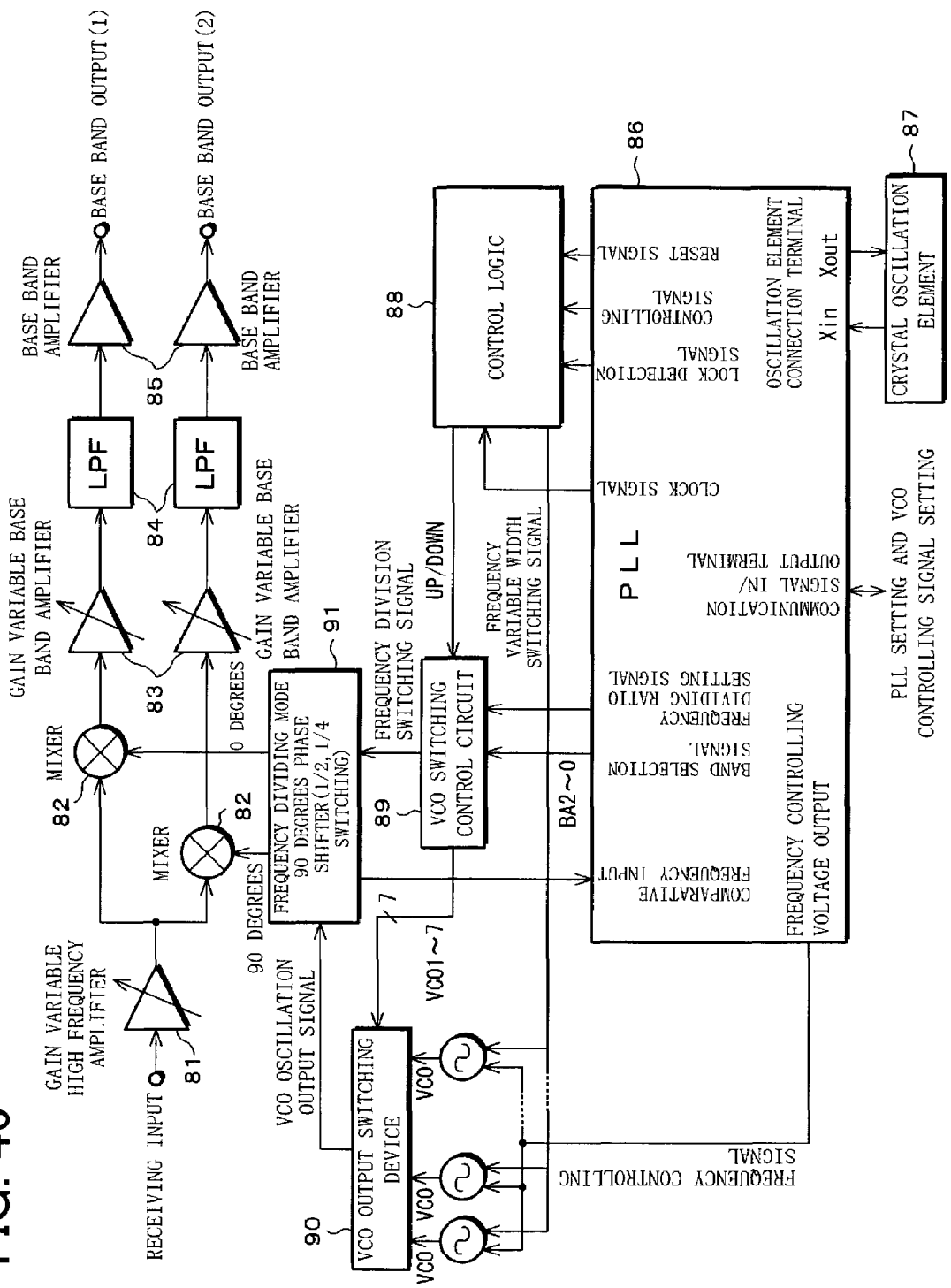
FIG. 46 is a block diagram schematically showing an example of how a receiving device is arranged.

The next example shows a case where the present invention is applied to a high frequency signal processing section of a digital satellite broadcast receiver. FIG. 46 shows a block diagram. FIG. 44 and FIG. 45 show how to select the VCO.

As shown in FIG. 46, a path extends from a receiving input via a gain variable high frequency amplifier 81 and is divided into two paths each of which extends via a mixer 82, a gain variable base band amplifier 83, a low pass filter 84, and a base band amplifier 85, so as to output base band outputs (1) and (2).

Further, there are provided a PLL 86, a crystal oscillation element 87, a control logic 88, a VCO switching control circuit 89, a VCO output switching device 90, and a frequency dividing mode 90 degrees phase shifter 91.

Other than the crystal oscillation element 87, the entire parts shown in FIG. 46 are provided in a single high frequency IC2. The crystal oscillation element 87 is externally provided on the high frequency IC2 and is connected to an oscillation element connecting terminal of the PLL 86, so that it is possible to obtain a highly stabilized reference oscillation frequency. Note that, instead of connecting the crystal oscillation element 87 to the oscillation element connecting terminal of the PLL 86, a reference oscillation signal having the same stability may be inputted. For example, in a case where a reference oscillation signal outputted from a similar crystal oscillation element is required in another control logic IC3, it is also possible to perform the following process: the crystal oscillation element 87 is connected to an oscillator of the control logic IC3, and a reference oscillation signal that can be obtained from the oscillator is taken out so as to be inputted to the oscillation element connecting terminal (Xin) of the PLL 86.

Compared with the aforementioned example where an output of the VCO is added directly to the PLL, the present arrangement is such that an output obtained by performing the frequency division with respect to an output of the VCO is inputted to the PLL 86. In the digital satellite broadcast receiver, two local oscillation signals having a 90 degrees phase difference is required, and the local oscillation signals are generated by using a frequency dividing circuit. Therefore, the VCO oscillates at a frequency twice as large as a local oscillation signal actually required, and a signal of the output that has been subjected to the frequency division is provided to the PLL 86.

Further, it is general that an input frequency variable range of the satellite broadcast receiver ranges from 950 MHz to 2150 MHz, so that the local oscillation signal having the same frequency is required. Thus, a ratio between the highest frequency and the lowest frequency of the local oscillation frequency has to be twice. In a case where the ratio is more than twice, switching is performed so that the frequency dividing ratio of the frequency dividing mode 90 degrees phase shifter is 1/2 or 1/4, and the VCO covers a ratio twice as large as the foregoing ratio.

In more detail, as means for securing the local oscillation frequency that covers the frequency ranging from 950 MHz to 2150 MHz, as shown in FIG. 44, seven VCOs are prepared for example, and the VCOs 1 to 4 are made to oscillate at a frequency twice as large as the local oscillation frequency, and the VCOs 5 to 7 are made to oscillate at a frequency four times as large as the local oscillation frequency.

As to the lower limit frequency variable range ((950 MHz~975 MHz) at the highest stage in FIG. 44) and the upper limit frequency variable range ((2130 MHz~2150

MHz) at the lowest stage in FIG. 44) of a range covered by the VCO, the frequency variable ranges are matched with the input frequency variable range (950 MHz to 2150 MHz) of the satellite broadcast receiver, and as shown in the figure, the frequencies are defined respectively as "from 950 MHz" and "to 2150 MHz". However, as performance of the VCO, taking the dispersion in the process of the VCO into consideration, the lower limit frequency variable range (highest stage in FIG. 44) of the range covered by the VCO is set so as to cover a lower limit frequency lower than the foregoing lower limit frequency variable range (for example, 900 MHz), and the upper limit frequency variable range (lowest stage in FIG. 44) of the range covered by the VCO is set so as to cover an upper limit frequency higher than the foregoing upper limit frequency variable range (for example, 2300 MHz).

Control setting of the PLL and the VCO is performed from outside via a communication signal in/output terminal. In order to output a desired local oscillation frequency, it is necessary to perform information setting with respect to a counter (not shown) provided in the PLL 86 and to set the VCO band and the frequency dividing ratio.

That is, as shown in FIG. 44, there exist ten bands (frequency variable range) from above, and band selection signals BA2, BA1, and BA0 outputted from the PLL 86 are set to be 0 or 1, so that 0 or 1 is sent from a VCO switching control circuit 89 to a VCO output switching device 90. Here, the VCO is selected in accordance with a negative logic ("0"). For example, at a first band, 1, 0, and 1 are sent as the BA2, BA1, and BA0. In accordance with this, 0 is sent to the VCO5 and 1 is sent to the VCOs other than the VCO5, so that the VCO5 is selected. Then, at each of ten bands, which VCO is selected is determined.

However, this is a case where an adjacent VCO is not selected unlike the foregoing description, and is a case of a first stage (UP=0, DOWN=0) in FIG. 45. As a pair of UP and DOWN, any one of (0, 0), (1, 0), and (0, 1) is outputted from the control logic 88. Accordingly, as shown in FIG. 45, an adjacent VCO is suitably selected.

That is, the dispersion of the VCO is compensated for each setting of the local oscillation frequency, and a lower limit or an upper limit of the oscillation frequency of the VCO is narrowed in accordance with a frequency variable width switching signal, and whether the frequency is properly locked or not is confirmed in accordance with a lock detection signal. Then, with respect to a VCO band setting value, selection of the VCO is set to +1 (UP) or −1 (DOWN), so that a proper VCO is selected.

Note that, the present invention can be arranged as follows: in a PLL synthesizer, having a plurality of VCOs integrated in a single integrated circuit, that covers a successively wide frequency range is covered, there are disposed the VCOs each of which can successively oscillate at a frequency range obtained by adding shift brought about by the dispersion to a required frequency range, and a relationship between the frequency and the used VCO is changed according to the dispersion in the frequency of the VCO.

Further, in the foregoing arrangement, the present invention can be arranged as follows: an appropriate VCO is determined each time the PLL selects the frequency.

Further, in the foregoing arrangement, the present invention can be arranged as follows: whether the VCO is appropriate or not is confirmed by confirming a lock detection output of the PLL synthesizer.

Further, in the foregoing arrangement, the present invention can be arranged as follows: information set in a programmable frequency divider of the PLL synthesizer is varied so as to confirm that the PLL locks the frequency, so that whether the VCO is appropriate or not is confirmed.

Further, in the foregoing arrangement, the present invention can be arranged as follows: a VCO which can switch the frequency variable range is used so as to confirm that the PLL locks the frequency when the frequency variable range is narrowed, so that whether the VCO is appropriate or not is confirmed.

Further, in the foregoing arrangement, the present invention can be arranged as follows: there is provided a switching circuit for separating a part of the variable capacitance element from the frequency controlling voltage, so that the variable range of the frequency is narrowed on both the higher frequency side and the lower frequency side.

Further, in the foregoing arrangement, the present invention can be arranged as follows: either the higher frequency side or the lower frequency side is narrowed when the frequency variable range is narrowed.

Further, in the foregoing arrangement, the present invention can be arranged as follows: in a case where the frequency is not locked, a tuning voltage (frequency controlling voltage) is used so as to select a proper VCO.

Further, in the foregoing arrangement, the present invention can be arranged as follows: only in a case where the frequency is locked, a comparative frequency (reference frequency) of the PLL synthesizer is raised.

Further, in the foregoing arrangement, the present invention can be arranged as follows: whether the tuning voltage (frequency controlling voltage) of the VCO is in a certain range or not is confirmed, so that whether the VCO covers a required frequency range or not is confirmed.

Further, in the foregoing arrangement, the present invention can be arranged as follows: a controlling circuit for selecting the VCO is provided in another integrated circuit which is not the integrated circuit constituting the VCO.

Further, in the foregoing arrangement, the present invention can be arranged as follows: information concerning which VCO is assigned to the used frequency is stored in a memory.

Further, in the foregoing arrangement, the present invention can be arranged as follows: a lock detection output signal of the PLL is used so as to confirm the frequency variable range of the VCO.

Further, in the foregoing arrangement, the present invention can be arranged as follows: an allocation of the VCO and the frequency is determined by calculation performed in accordance with the frequency variable range of the VCO.

Further, in the foregoing arrangement, the present invention can be arranged as follows: the frequency variable range of the VCO is temporarily narrowed so as to determine the allocation of the VCO and the frequency.

Further, in the foregoing arrangement, the present invention can be arranged as follows: the comparative frequency of the PLL is raised so as to confirm the frequency variable range of the VCO by using a lock signal of the PLL.

Further, in the foregoing arrangement, the present invention can be arranged as follows: as an operation for storing, in the memory, information concerning which VCO is allocated to the used frequency in the memory, the information is written in a non-volatile memory when a receiver using the present integrated circuit is manufactured in a factory.

Further, in the foregoing arrangement, the present invention can be arranged as follows: as an operation for storing, in the memory, information concerning which VCO is allocated to the used frequency, the information is written in the memory when the receiver using the present integrated circuit is turned ON.

Further, the present invention can be used as a satellite broadcast receiving direct conversion reception integrated circuit having the VCO and the PLL therein.

In addition to the foregoing arrangements, the integrated circuit of the present invention can be arranged as follows: confirmation is performed with respect to whether or not a voltage controlled oscillator is appropriate for a frequency that is to be set in a PLL for selecting the frequency, and in a case where the voltage controlled oscillator is inappropriate, another voltage controlled oscillator is selected and is determined to be required.

To select the frequency means to set the frequency in the PLL. Thus, in addition to the foregoing effects, it is possible to determine the most appropriate VCO at all times.

Further, in addition to the foregoing arrangements, the integrated circuit of the present invention can be arranged as follows: in accordance with whether or not a lock detection output of the PLL indicates that the frequency is locked, judgment is given on whether or not the voltage controlled oscillator is appropriate for the frequency that is to be set in the PLL.

Thus, in addition to the foregoing effects, it is possible to give the judgment in a simple manner because the lock detection output of the PLL is a logic output.

Further, in addition to the foregoing arrangements, the integrated circuit of the present invention can be arranged as follows: in a case of confirming whether the voltage controlled oscillator is appropriate or not by using the lock detection output, information set in a program able frequency divider of the PLL is switched plural times so as to lock the frequency at a certain range.

Thus, in addition to the foregoing effects, it is possible to detect and exclude a VCO whose coverage barely overlaps the objective frequency.

Further, in addition to the foregoing arrangements, the integrated circuit of the present invention can be arranged as follows: a frequency coverage of the voltage controlled oscillator is temporarily narrowed, and whether the frequency is locked by the PLL or not is confirmed, so as to confirm whether or not the voltage controlled oscillator is appropriate for the frequency that is to be set in the PLL.

Thus, in addition to the foregoing effects, it is possible to confirm whether or not the VCO is appropriate for the used frequency in accordance with a locking confirmation performed one time.

Further, in addition to the foregoing arrangements, the integrated circuit of the present invention can be arranged as follows: the frequency coverage is temporarily narrowed by separating a control terminal of a variable capacitance element of the voltage controlled oscillator from a frequency controlling terminal and by connecting the control terminal to a fixed voltage.

Thus, in addition to the foregoing effects, it is possible to narrow the frequency variable range in a simple manner.

Further, in addition to the foregoing arrangements, the integrated circuit of the present invention can be arranged as follows: either an upper limit or a lower limit is narrowed so as to narrow the frequency variable range.

Thus, in addition to the foregoing effects, it is possible to narrow the frequency variable range by using a simpler circuit.

Further, in addition to the foregoing arrangements, the integrated circuit of the present invention can be arranged as follows: in a case where a certain voltage controlled oscillator proves not to lock the frequency, a voltage controlled oscillator that is actually used is determined according to a magnitude relation between a voltage of the frequency controlling terminal of the voltage controlled oscillator that does not lock the frequency and a reference voltage.

Thus, in addition to the foregoing effects, it is possible to shorten a time taken to determine which VCO is to be used, because it is possible to determine an appropriate VCO by a locking judgment performed one time.

Further, in addition to the foregoing arrangements, the integrated circuit of the present invention can be arranged as follows: in a case where whether a voltage controlled oscillator is appropriate or not is confirmed by using the lock detection output, the comparative frequency of the PLL is raised from an ordinary use condition.

Thus, in addition to the foregoing effects, it is possible to shorten a time taken to lock the frequency.

Further, in addition to the foregoing arrangements, the integrated circuit of the present invention can be arranged as follows: whether or not a controlling voltage of the voltage controlled oscillator is in a certain range is judged so as to check whether the voltage controlled oscillator is most appropriate for the frequency that is to be set in the PLL.

Thus, in addition to the foregoing effects, it is possible to readily confirm whether the VCO is most appropriate or not.

Further, in addition to the foregoing arrangements, the integrated circuit of the present invention can be arranged so as to include: a high frequency IC in which the voltage controlled oscillator is provided; and a control logic IC in which a controlling circuit for selecting the voltage controlled oscillator is provided.

Thus, in addition to the foregoing effects, it is possible to reduce an area of the high frequency IC whose price per an area is generally high, so that it is possible to reduce a price of the high frequency IC. Further, it is possible to reduce a total price of the high frequency IC and the control logic IC.

Further, in addition to the foregoing arrangements, the integrated circuit of the present invention can be arranged so as to include a memory for storing information concerning which voltage controlled oscillator covers which frequency variable range in advance.

Thus, in addition to the foregoing effects, it is possible to shorten a time taken to select the frequency.

Further, in addition to the foregoing arrangements, the integrated circuit of the present invention can be arranged as follows: the lock detection output of the PLL is used so as to confirm the frequency variable range of the voltage controlled oscillator.

Thus, in addition to the foregoing effects, it is possible to readily arrange the controlling circuit.

Further, in addition to the foregoing arrangements, the integrated circuit of the present invention can be arranged as follows: an allocation of the frequency and the voltage controlled oscillator is determined by calculation performed in accordance with the frequency variable range of the voltage controlled oscillator.

Thus, in addition to the foregoing effects, it is possible to arrange the controlling circuit by using only a logic circuit.

Further, in addition to the foregoing arrangements, the integrated circuit of the present invention can be arranged as follows: the frequency variable range of the voltage controlled oscillator is temporarily narrowed so as to determine the allocation of the frequency and the voltage controlled oscillator.

Thus, in addition to the foregoing effects, it is possible to allocate the VCOs with high accuracy.

Further, in addition to the foregoing arrangements, the integrated circuit of the present invention can be arranged as follows: the comparative frequency of the PLL is raised when the frequency variable range of the voltage controlled oscillator is confirmed by using a lock signal of the PLL.

Thus, in addition to the foregoing effects, it is possible to confirm the frequency variable range of the VCO in a short time.

Further, in addition to the foregoing arrangements, the integrated circuit of the present invention can be arranged as follows: as an operation for storing, in the memory, information concerning which voltage controlled oscillator is allocated to the used frequency, the information is written in a non-volatile memory which functions as the memory when the receiver using the integrated circuit is manufactured in a factory.

Thus, in addition to the foregoing effects, it is not necessary to confirm the frequency of the VCO when the receiver is under an ordinary use condition.

Further, in addition to the foregoing arrangements, the integrated circuit of the present invention can be arranged as follows: as an operation for storing, in the memory, information concerning which voltage controlled oscillator covers which frequency variable range, the information is written in the memory when the receiver using the integrated circuit is turned ON.

Thus, in addition to the foregoing effects, it is not necessary to confirm the frequency of the VCO when the receiver is under an ordinary use condition.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

What is claimed is:

1. An integrated circuit comprising:
   a plurality of voltage controlled oscillators provided in the integrated circuit in accordance with a same process whereby variable frequency ranges of the voltage controlled oscillators disperse in a same direction wherein,
   both a range covering a frequency regardless of whether dispersion occurs or not and a range covering the frequency only in a case where the dispersion occurs are used as the variable frequency ranges of the voltage controlled oscillators,
   the variable frequency ranges of the plurality of voltage controlled oscillators are set so as to be successive with respect to each other, and
   each variable frequency range includes at least one frequency that is not in another variable frequency range.

2. The integrated circuit as set forth in claim 1, wherein whether or not one of the voltage controlled oscillators is most appropriate for the frequency that is to be set in a PLL for selecting the frequency is confirmed each time the frequency is selected, and in a case where the voltage controlled oscillator is inappropriate, another one of the voltage controlled oscillators is selected and determined to be required.

3. The integrated circuit as set forth in claim 2, wherein whether or not the voltage controlled oscillator is most appropriate for the frequency that is to be set in the PLL is confirmed in accordance with whether or not a lock detection output of the PLL indicates that the frequency is locked.

4. The integrated circuit as set forth in claim 3, wherein in a case of confirming whether the voltage controlled oscillator is appropriate or not by using the lock detection output, information set in a program able frequency divider of the PLL is switched plural times, so as to confirm that the frequency is locked at a certain range.

5. The integrated circuit as set forth in claim 3, wherein a frequency coverage of the voltage controlled oscillator is temporarily narrowed so as to confirm whether or not the voltage controlled oscillator is most appropriate for the frequency that is to be set in the PLL, and whether the PLL locks the frequency or not is confirmed.

6. The integrated circuit as set forth in claim 5, wherein the frequency coverage is temporarily narrowed by separating a control terminal of a variable capacitance element of the voltage controlled oscillator from a frequency controlling terminal and by connecting the control terminal to a fixed voltage.

7. The integrated circuit as set forth in claim 5, wherein either an upper limit or a lower limit is narrowed so as to narrow the variable frequency range.

8. The integrated circuit as set forth in claim 6, wherein in a case where the voltage controlled oscillator proves not to lock the frequency, another one of the voltage controlled oscillators that is to be actually used is determined according to a magnitude relation between a voltage of the frequency controlling terminal of that voltage controlled oscillator that does not lock the frequency and a reference voltage.

9. The integrated circuit as set forth in claim 3, wherein in a case of confirming whether the voltage controlled oscillator is appropriate or not by using the lock detection output, a comparative frequency of the PLL is raised from an ordinary use condition.

10. The integrated circuit as set forth in claim 2, wherein whether a controlling voltage of the voltage controlled oscillator is in a certain range or not is judged so as to check whether or not the voltage controlled oscillator is most appropriate for the frequency that is to be set in the PLL.

11. The integrated circuit as set forth in claim 3, further comprising:
    a high frequency IC in which the voltage controlled oscillators are provided; and
    a control logic IC in which a controlling circuit for selecting the voltage controlled oscillators is provided.

12. The integrated circuit as set forth in claim 1, further comprising:
    a memory for storing information concerning which voltage controlled oscillator covers which variable frequency range in advance.

13. The integrated circuit as set forth in claim 12, wherein a lock detection output of a PLL is used so as to confirm the variable frequency range of the voltage controlled oscillators.

14. The integrated circuit as set forth in claim 13, wherein an allocation of the frequency for the voltage controlled oscillators is determined by a calculation performed in accordance with the variable frequency range of the voltage controlled oscillators.

15. The integrated circuit as set forth in claim 13, wherein the variable frequency range of the voltage controlled oscillators is temporarily narrowed so as to determine an allocation of the frequency for the voltage controlled oscillators.

16. The integrated circuit as set forth in claim 13, wherein a comparative frequency of the PLL is raised so as to confirm the variable frequency range of the voltage controlled oscillators by using the lock signal of the PLL.

17. The integrated circuit as set forth in claim 12, wherein as an operation for storing, in the memory, information concerning which voltage controlled oscillator is allocated to a used frequency, the information is written in a nonvolatile memory which functions as the memory when the receiver using the integrated circuit is manufactured in a factory.

18. The integrated circuit as set forth in claim 12, wherein as an operation for storing, in the memory, information concerning which voltage controlled oscillator covers which variable frequency range, the information is written in the memory when the receiver using the integrated circuit is turned ON.

19. A receiving device comprising:
an integrated circuit, the integrated circuit including a plurality of voltage controlled oscillators provided in accordance with a same process whereby variable frequency ranges of the voltage controlled oscillators disperse in a same direction, wherein
both a range covering a frequency regardless of whether dispersion occurs or not and a range covering the frequency only in a case where the dispersion occurs are used as the variable frequency ranges of the voltage controlled oscillators, the variable frequency ranges of the plurality of voltage controlled oscillators are set so as to be successive with respect to each other, each variable frequency range includes at least one frequency that is not in another variable frecuency range, and each of the voltage controlled oscillators provided in the integrated circuit is used so as to generate a local oscillation signal that is required in converting a frequency of a received signal into a specific intermediate frequency.

* * * * *